(12) United States Patent
Wenzel et al.

(10) Patent No.: US 10,855,081 B2
(45) Date of Patent: Dec. 1, 2020

(54) ENERGY STORAGE CONTROLLER WITH BATTERY LIFE MODEL

(71) Applicant: CON EDISON BATTERY STORAGE, LLC, Valhalla, NY (US)

(72) Inventors: Michael J. Wenzel, Oak Creek, WI (US); Brett M. Lenhardt, Waukesha, WI (US); Kirk H. Drees, Cedarburg, WI (US)

(73) Assignee: Con Edison Battery Storage LLC, Valhalla, NY (US)

( * ) Notice: Subject to any disclaimer, the term of this patent is extended or adjusted under 35 U.S.C. 154(b) by 58 days.

(21) Appl. No.: 16/372,986

(22) Filed: Apr. 2, 2019

(65) Prior Publication Data

US 2019/0296552 A1    Sep. 26, 2019

Related U.S. Application Data

(63) Continuation of application No. 15/247,793, filed on Aug. 25, 2016, now Pat. No. 10,250,039.
(Continued)

(51) Int. Cl.
*H02J 3/32* (2006.01)
*G01R 31/367* (2019.01)
(Continued)

(52) U.S. Cl.
CPC .............. *H02J 3/32* (2013.01); *G01R 31/367* (2019.01); *G01R 31/392* (2019.01); *G01R 31/44* (2013.01);
(Continued)

(58) Field of Classification Search
CPC .. H02J 3/32; H02J 3/383; H02J 7/0068; H02J 2203/20; G01R 31/367; G01R 31/392; G01R 31/44; Y02E 60/76; Y04S 40/22
(Continued)

(56) References Cited

U.S. PATENT DOCUMENTS 4,349,869 A    9/1982 Prett et al.
4,616,308 A    10/1986 Morshedi et al.
(Continued)

FOREIGN PATENT DOCUMENTS

CN    102566435    10/2013
CN    102891495    1/2016
(Continued)

OTHER PUBLICATIONS

European Office Action for related Application No. 16787642.4 dated Jun. 21, 2018. 7 pages.
(Continued)

*Primary Examiner* — Hal Kaplan
(74) *Attorney, Agent, or Firm* — Michael Best & Friedrich LLP

(57) ABSTRACT

An electrical energy storage system includes a battery configured to store and discharge electric power to an energy grid, a power inverter configured to use battery power setpoints to control an amount of the electric power stored or discharged from the battery, the battery power setpoints comprising at least one of frequency regulation power setpoints and ramp rate control power setpoints, and a controller. The controller is configured to use a battery life model to generate the battery power setpoints for the power inverter. The battery life model includes one or more variables that depend on the battery power setpoints.

20 Claims, 11 Drawing Sheets

Related U.S. Application Data

(60) Provisional application No. 62/239,131, filed on Oct. 8, 2015, provisional application No. 62/239,249, filed on Oct. 8, 2015, provisional application No. 62/239,246, filed on Oct. 8, 2015, provisional application No. 62/239,231, filed on Oct. 8, 2015, provisional application No. 62/239,245, filed on Oct. 8, 2015, provisional application No. 62/239,233, filed on Oct. 8, 2015.

(51) Int. Cl.
  *G01R 31/392* (2019.01)
  *H02J 7/00* (2006.01)
  *H02J 3/38* (2006.01)
  *G01R 31/44* (2020.01)

(52) U.S. Cl.
  CPC ............ *H02J 3/383* (2013.01); *H02J 7/0068* (2013.01); *H02J 2203/20* (2020.01); *Y02E 60/76* (2013.01); *Y04S 40/22* (2013.01)

(58) Field of Classification Search
  USPC ........................................................ 307/72
  See application file for complete search history.

(56) References Cited

U.S. PATENT DOCUMENTS

| | | |
|---|---|---|
| 5,301,101 A | 4/1994 | MacArthur et al. |
| 5,347,446 A | 9/1994 | Iino et al. |
| 5,351,184 A | 9/1994 | Lu et al. |
| 5,408,406 A | 4/1995 | Mathur et al. |
| 5,442,544 A | 8/1995 | Jelinek |
| 5,519,605 A | 5/1996 | Cawlfield |
| 5,572,420 A | 11/1996 | Lu |
| 5,867,384 A | 2/1999 | Drees et al. |
| 6,055,483 A | 4/2000 | Lu |
| 6,122,555 A | 9/2000 | Lu |
| 6,278,899 B1 | 8/2001 | Piche et al. |
| 6,347,254 B1 | 2/2002 | Lu |
| 6,459,939 B1 | 10/2002 | Hugo |
| 6,757,591 B2 | 6/2004 | Kramer |
| 6,807,510 B1 | 10/2004 | Backstrom et al. |
| 6,900,556 B2 | 5/2005 | Provanzana et al. |
| 7,050,863 B2 | 5/2006 | Mehta et al. |
| 7,050,866 B2 | 5/2006 | Martin et al. |
| 7,113,890 B2 | 9/2006 | Frerichs et al. |
| 7,152,023 B2 | 12/2006 | Das |
| 7,165,399 B2 | 1/2007 | Stewart |
| 7,188,779 B2 | 3/2007 | Alles |
| 7,197,485 B2 | 3/2007 | Fuller |
| 7,203,554 B2 | 4/2007 | Fuller |
| 7,266,416 B2 | 9/2007 | Gallestey et al. |
| 7,272,454 B2 | 9/2007 | Wojsznis et al. |
| 7,275,374 B2 | 10/2007 | Stewart et al. |
| 7,328,074 B2 | 2/2008 | Das et al. |
| 7,328,577 B2 | 2/2008 | Stewart et al. |
| 7,376,471 B2 | 5/2008 | Das et al. |
| 7,376,472 B2 | 5/2008 | Wojsznis et al. |
| 7,389,773 B2 | 6/2008 | Stewart et al. |
| 7,400,933 B2 | 7/2008 | Rawlings et al. |
| 7,418,372 B2 | 8/2008 | Nishira et al. |
| 7,454,253 B2 | 11/2008 | Fan |
| 7,496,413 B2 | 2/2009 | Fan et al. |
| 7,577,483 B2 | 8/2009 | Fan et al. |
| 7,591,135 B2 | 9/2009 | Stewart |
| 7,610,108 B2 | 10/2009 | Boe et al. |
| 7,650,195 B2 | 1/2010 | Fan et al. |
| 7,664,573 B2 | 2/2010 | Ahmed |
| 7,676,283 B2 | 3/2010 | Liepold et al. |
| 7,826,909 B2 | 11/2010 | Attarwala |
| 7,827,813 B2 | 11/2010 | Seem |
| 7,839,027 B2 | 11/2010 | Shelton et al. |
| 7,844,352 B2 | 11/2010 | Vouzis et al. |
| 7,856,281 B2 | 12/2010 | Thiele et al. |
| 7,878,178 B2 | 2/2011 | Stewart et al. |
| 7,894,943 B2 | 2/2011 | Sloup et al. |
| 7,930,045 B2 | 4/2011 | Cheng |
| 7,945,352 B2 | 5/2011 | Koc |
| 7,949,416 B2 | 5/2011 | Fuller |
| 7,987,005 B2 | 7/2011 | Rund |
| 7,987,145 B2 | 7/2011 | Baramov |
| 7,996,140 B2 | 8/2011 | Stewart et al. |
| 8,005,575 B2 | 8/2011 | Kirchhof |
| 8,032,235 B2 | 10/2011 | Sayyar-Rodsari |
| 8,036,758 B2 | 10/2011 | Lu et al. |
| 8,046,089 B2 | 10/2011 | Renfro et al. |
| 8,060,258 B2 | 11/2011 | Butoyi |
| 8,060,290 B2 | 11/2011 | Stewart et al. |
| 8,073,659 B2 | 12/2011 | Gugaliya et al. |
| 8,078,291 B2 | 12/2011 | Pekar et al. |
| 8,096,140 B2 | 1/2012 | Seem |
| 8,105,029 B2 | 1/2012 | Egedal et al. |
| 8,109,255 B2 | 2/2012 | Stewart et al. |
| 8,121,818 B2 | 2/2012 | Gorinevsky |
| 8,126,575 B2 | 2/2012 | Attarwala |
| 8,145,329 B2 | 3/2012 | Pekar et al. |
| 8,180,493 B1 | 5/2012 | Laskow |
| 8,185,217 B2 | 5/2012 | Thiele |
| 8,200,346 B2 | 6/2012 | Thiele |
| 8,295,989 B2 | 10/2012 | Rettger et al. |
| 8,489,666 B1 | 7/2013 | Nikitin |
| 8,492,926 B2 | 7/2013 | Collins et al. |
| 8,495,888 B2 | 7/2013 | Seem |
| 8,583,520 B1 | 11/2013 | Forbes, Jr. |
| 8,600,561 B1 | 12/2013 | Modi et al. |
| 8,600,571 B2 | 12/2013 | Dillon et al. |
| 8,843,238 B2 | 9/2014 | Wenzel et al. |
| 8,901,411 B2 | 12/2014 | Liu et al. |
| 8,914,158 B2 | 12/2014 | Geinzer et al. |
| 8,922,056 B2 | 12/2014 | Thisted |
| 9,002,532 B2 | 4/2015 | Asmus |
| 9,002,761 B2 | 4/2015 | Montalvo |
| 9,061,599 B2 | 6/2015 | Sisk |
| 9,235,657 B1 | 1/2016 | Wenzel et al. |
| 9,436,179 B1 | 9/2016 | Turney et al. |
| 9,852,481 B1 | 12/2017 | Turney et al. |
| 2004/0095237 A1 | 5/2004 | Chen et al. |
| 2005/0062289 A1 | 3/2005 | Cho et al. |
| 2007/0080675 A1 | 4/2007 | Gray et al. |
| 2007/0087756 A1 | 4/2007 | Hoffberg |
| 2007/0806751 | 4/2007 | Gray et al. |
| 2009/0094173 A1 | 4/2009 | Smith et al. |
| 2009/0254396 A1 | 10/2009 | Metcalfe |
| 2009/0313083 A1 | 12/2009 | Dillon et al. |
| 2009/0319090 A1 | 12/2009 | Dillon et al. |
| 2010/0087933 A1 | 4/2010 | Cheng |
| 2010/0198420 A1 | 8/2010 | Rettger et al. |
| 2010/0198421 A1 | 8/2010 | Fahimi et al. |
| 2010/0235004 A1 | 9/2010 | Thind |
| 2010/0269854 A1 | 10/2010 | Barbieri et al. |
| 2011/0022193 A1 | 1/2011 | Panaitescu |
| 2011/0060424 A1 | 3/2011 | Havlena |
| 2011/0060475 A1 | 3/2011 | Baldwin et al. |
| 2011/0066258 A1 | 3/2011 | Torzhkov et al. |
| 2011/0088000 A1 | 4/2011 | MacKay |
| 2011/0125293 A1 | 5/2011 | Havlena |
| 2011/0138609 A1 | 6/2011 | Cherukupalli |
| 2011/0184565 A1 | 7/2011 | Peterson |
| 2011/0190958 A1 | 8/2011 | Hirst |
| 2011/0221276 A1 | 9/2011 | Geinzer et al. |
| 2011/0257789 A1 | 10/2011 | Stewart et al. |
| 2011/0264289 A1 | 10/2011 | Sawyer et al. |
| 2011/0276269 A1 | 11/2011 | Hummel |
| 2011/0301723 A1 | 12/2011 | Pekar et al. |
| 2012/0010757 A1 | 1/2012 | Francino et al. |
| 2012/0059351 A1 | 3/2012 | Nordh |
| 2012/0060505 A1 | 3/2012 | Fuller et al. |
| 2012/0083930 A1 | 4/2012 | Ilic et al. |
| 2012/0109620 A1 | 5/2012 | Gaikwad et al. |
| 2012/0116546 A1 | 5/2012 | Sayyar-Rodsari |
| 2012/0130555 A1 | 5/2012 | Jelinek |
| 2012/0143385 A1 | 6/2012 | Goldsmith |

(56) References Cited

U.S. PATENT DOCUMENTS

| | | |
|---|---|---|
| 2012/0215362 A1 | 8/2012 | Stagner |
| 2012/0232701 A1 | 9/2012 | Carty et al. |
| 2012/0261990 A1 | 10/2012 | Collins et al. |
| 2012/0323396 A1 | 12/2012 | Shelton et al. |
| 2012/0326511 A1 | 12/2012 | Johnson |
| 2013/0099565 A1 | 4/2013 | Sachs et al. |
| 2013/0138285 A1 | 5/2013 | Bozchalui et al. |
| 2013/0154583 A1 | 6/2013 | Shi et al. |
| 2013/0184884 A1 | 7/2013 | More et al. |
| 2013/0204443 A1 | 8/2013 | Steven et al. |
| 2013/0212410 A1 | 8/2013 | Li et al. |
| 2013/0300194 A1 | 11/2013 | Palmer et al. |
| 2013/0345880 A1 | 12/2013 | Asmus |
| 2014/0037909 A1 | 2/2014 | Hawwa et al. |
| 2014/0039709 A1 | 2/2014 | Steven et al. |
| 2014/0049109 A1 | 2/2014 | Kearns et al. |
| 2014/0052308 A1 | 2/2014 | Hanafusa |
| 2014/0089692 A1 | 3/2014 | Hanafusa |
| 2014/0100810 A1 | 4/2014 | Nielsen |
| 2014/0152009 A1 | 6/2014 | Meisner et al. |
| 2014/0159491 A1 | 6/2014 | Kusunose |
| 2014/0239722 A1 | 8/2014 | Arai et al. |
| 2014/0279361 A1 | 9/2014 | Streeter et al. |
| 2014/0336840 A1 | 11/2014 | Geinzer et al. |
| 2014/0354239 A1 | 12/2014 | Miyazaki et al. |
| 2014/0358316 A1 | 12/2014 | Shichiri |
| 2015/0002105 A1 | 1/2015 | Kelly |
| 2015/0008884 A1 | 1/2015 | Waki et al. |
| 2015/0019034 A1 | 1/2015 | Gonatas |
| 2015/0021991 A1 | 1/2015 | Wood et al. |
| 2015/0045962 A1 | 2/2015 | Wenzel et al. |
| 2015/0046221 A1 | 2/2015 | Narayan et al. |
| 2015/0084339 A1 | 3/2015 | McDaniel et al. |
| 2015/0088315 A1 | 3/2015 | Behrangrad |
| 2015/0094870 A1 | 4/2015 | Fornage et al. |
| 2015/0094968 A1 | 4/2015 | Jia et al. |
| 2015/0127425 A1 | 5/2015 | Greene et al. |
| 2015/0261371 A1 | 9/2015 | Li |
| 2015/0277467 A1 | 10/2015 | Steven et al. |
| 2015/0283912 A1 | 10/2015 | Shimizu et al. |
| 2016/0028234 A1 | 1/2016 | Watanabe et al. |
| 2016/0047862 A1 | 2/2016 | Shimizu et al. |
| 2016/0190810 A1 | 6/2016 | Bhavaraju et al. |
| 2016/0241042 A1 | 8/2016 | Mammoli et al. |
| 2016/0254671 A1 | 9/2016 | Cutright et al. |
| 2016/0261116 A1 | 9/2016 | Barooah |
| 2016/0315475 A1 | 10/2016 | Carlson et al. |
| 2017/0060113 A1 | 3/2017 | Kaucic et al. |
| 2017/0090440 A1 | 3/2017 | Eck et al. |
| 2017/0104344 A1 | 4/2017 | Wenzel et al. |
| 2017/0104345 A1 | 4/2017 | Wenzel et al. |
| 2017/0104346 A1 | 4/2017 | Wenzel et al. |

FOREIGN PATENT DOCUMENTS

| | | |
|---|---|---|
| EP | 2506380 | 10/2012 |
| EP | 2549617 | 1/2013 |
| EP | 2660943 | 11/2013 |
| EP | 2773008 | 9/2014 |
| EP | 2871742 | 5/2015 |
| JP | 2014-233096 | 12/2014 |
| WO | WO02/15365 | 2/2002 |
| WO | WO2010/042550 | 4/2010 |
| WO | WO2010/057250 | 5/2010 |
| WO | WO2010/094012 | 8/2010 |
| WO | WO 2011/080548 | 7/2011 |
| WO | 2012/122234 | 9/2012 |
| WO | 2013/063581 | 5/2013 |
| WO | 2014/016727 | 1/2014 |
| WO | 2015/019541 | 2/2015 |
| WO | 2015/139061 | 9/2015 |

OTHER PUBLICATIONS

Extended European Search Report for EP Application No. 16154938.1, dated Jun. 23, 2016, 8 pages.
Extended European Search Report for EP Application No. 16154940.7, dated Jun. 30, 2016, 7 pages.
Hoke et al., Active Power Control of Photovoltaic Power Systems, 2013 1st IEEE Conference on Technologies for Sustainability (SusTech), Aug. 1-2, 2013, 8 pages.
Lopez-Martinez et al., Vision-Based System for the Safe Operation of a Solar Power Tower Plant, In Advances in Artificial Intelligence—IBERAMIA 2002, 8th Ibero-American Conference on Artificial Intelligence, Nov. 2002, Springer Berlin Heidelberg, 10 pages.
Sasikala et al., Coordinated Control and Strategy of Solar Photovoltaic Generators with MPPT and Battery Storage in Micro Grids, International Journal of Scientific Engineering and Technology Research, vol. 3, No. 46, Dec. 2014, 7 pages.
SMA Solar Technology AG, PV and Storage: Solutions with Potential-Energy on demand with the Sunny Central Storage, Brochure, Nov. 30, 2002, 8 pages.
Search Report and Written Opinion for International Application No. PCT/US2016/056187, dated Dec. 9, 2016, 12 pages.
Search Report and Written Opinion for International Application No. PCT/US2016/056183, dated Dec. 20, 2016, 13 pages.
Search Report and Written Opinion for International Application No. PCT/US2016/056184, dated Dec. 20, 2016, 13 pages.
Search Report and Written Opinion for International Application No. PCT/US2016/056189, dated Dec. 21, 2016, 11 pages.
Search Report and Written Opinion for International Application No. PCT/US2016/056165, dated Jan. 3, 2017, 13 pages.
Search Report and Written Opinion for International Application No. PCT/US2016/056167, dated Jan. 3, 2017, 12 pages.
Search Report and Written Opinion for International Application No. PCT/US2016/056169, dated Jan. 3, 2017, 12 pages.
Search Report and Written Opinion for International Application No. PCT/US2016/056182, dated Jan. 4, 2017, 13 pages.
Search Report and Written Opinion for International Application No. PCT/US2016/056186, dated Jan. 16, 2017, 10 pages.
Search Report and Written Opinion for International Application No. PCT/US2016/056192, dated Jan. 16, 2017, 11 pages.
Search Report and Written Opinion for International Application No. PCT/US2016/056190, dated Jan. 18, 2017, 10 pages.
Search Report and Written Opinion for International Application No. PCT/US2016/056170, dated Jan. 18, 2017, 12 pages.
Search Report and Written Opinion for International Application No. PCT/US2016/056179, dated Jan. 19, 2017, 10 pages.
Search Report for International Application No. PCT/US2016/056178, dated Jan. 25, 2017, 3 pages.
Search Report for International Application No. PCT/US2016/056181, dated Jan. 26, 2017, 10 pages.
U.S. Office Action on U.S. Appl. No. 15/247,875 dated Feb. 8, 2018. 27 pages.
U.S. Office Action on U.S. Appl. No. 15/247,886 dated Feb. 9, 2018. 7 pages.
U.S. Office Action on U.S. Appl. No. 15/247,777 dated Feb. 9, 2018. 25 pages.
U.S. Office Action on U.S. Appl. No. 15/247,881 dated Mar. 8, 2018. 25 pages.
U.S. Office Action on U.S. Appl. No. 15/247,883 dated Mar. 21, 2018. 36 pages.
U.S. Office Action on U.S. Appl. No. 15/247,885 dated Apr. 16, 2018. 33 pages.
U.S. Office Action on U.S. Appl. No. 15/247,784 dated Apr. 19, 2018. 7 pages.
U.S. Office Action on U.S. Appl. No. 15/247,788 dated May 7, 2018. 19 pages.
U.S. Office Action on U.S. Appl. No. 15/247,793 dated May 10, 2018. 9 pages.
U.S. Office Action on U.S. Appl. No. 15/247,880 dated May 11, 2018. 12 pages.
U.S. Office Action on U.S. Appl. No. 15/247,869 dated Aug. 9, 2018. 16 pages.
U.S. Office Action on U.S. Appl. No. 15/247,844 dated Aug. 28, 2018. 19 pages.

(56) References Cited

OTHER PUBLICATIONS

U.S. Office Action on U.S. Appl. No. 15/247,873 dated Sep. 19, 2018. 15 pages.
U.S. Office Action for U.S. Appl. No. 15/247,883 dated Oct. 17, 2018. 15 pages.
U.S. Office Action for U.S. Appl. No. 15/247,885 dated Nov. 28, 2018. 45 pages.
U.S. Office Action for U.S. Appl. No. 15/247,788 dated Dec. 11, 2018. 25 pages.
U.S. Office Action for U.S. Appl. No. 15/247,869 dated Feb. 7, 2019. 06 pages.
U.S. Office Action for U.S. Appl. No. 15/247,788 dated Apr. 5, 2019. 21 pages.

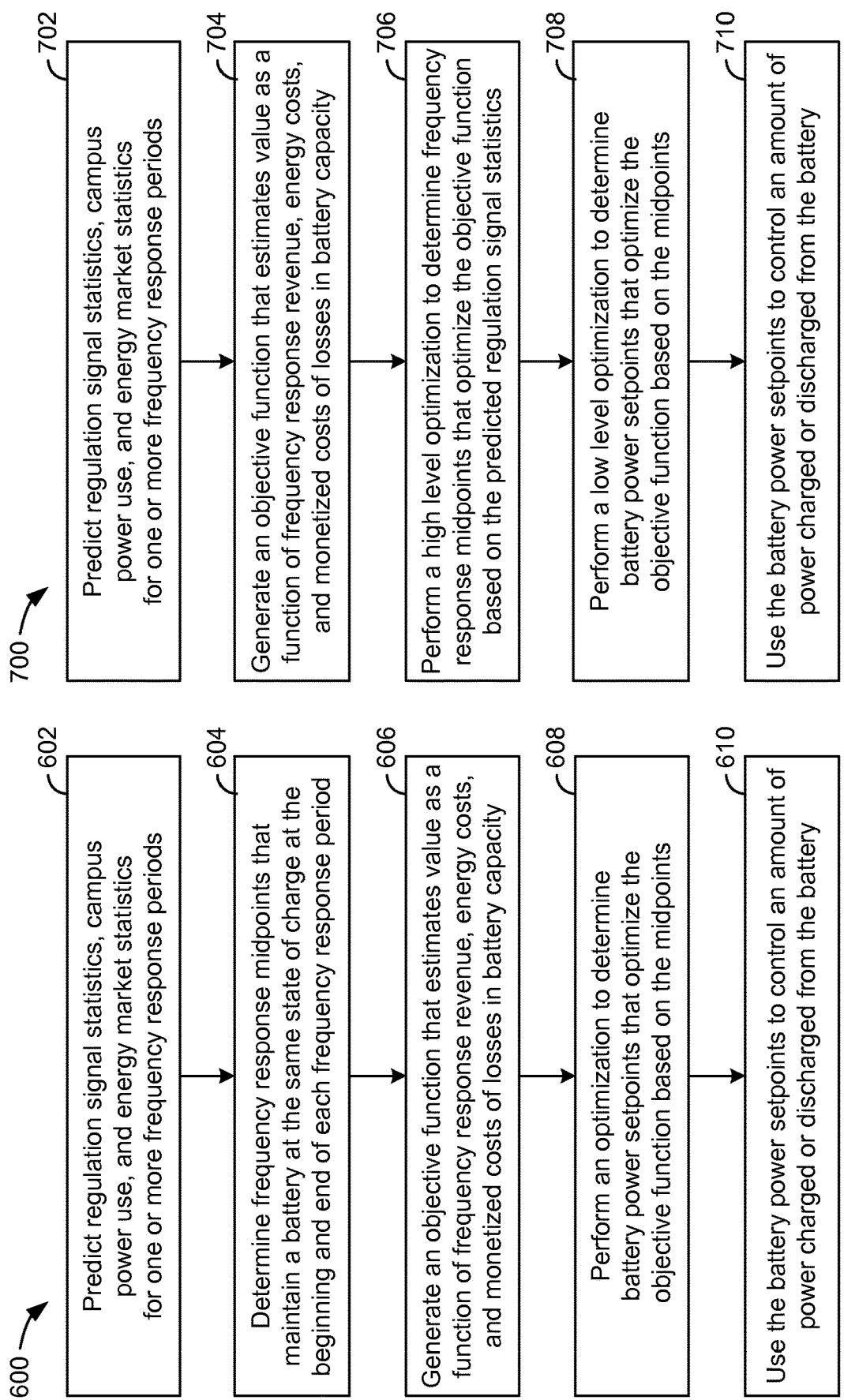

ENERGY STORAGE CONTROLLER WITH BATTERY LIFE MODEL

CROSS-REFERENCE TO RELATED PATENT APPLICATIONS

This application is a continuation of U.S. patent application Ser. No. 15/247,793, filed Aug. 25, 2016, now U.S. Pat. No. 10,250,039, which claims the benefit of and priority to U.S. Provisional Patent Application No. 62/239,131, U.S. Provisional Patent Application No. 62/239,231, U.S. Provisional Patent Application No. 62/239,233, U.S. Provisional Patent Application No. 62/239,245, U.S. Provisional Patent Application No. 62/239,246, and U.S. Provisional Patent Application No. 62/239,249, each of which has a filing date of Oct. 8, 2015. The entire disclosure of each of these patent applications is incorporated by reference herein.

BACKGROUND

The present disclosure relates generally to frequency response systems configured to add or remove electricity from an energy grid, and more particularly to a frequency response controller that determines optimal power setpoints for a battery power inverter in a frequency response system.

Increased concerns about environmental issues such as global warming have prompted an increased interest in alternate clean and renewable sources of energy. Such sources include solar and wind power. One method for harvesting solar energy is using a photovoltaic (PV) field which provides power to an energy grid supplying regional power.

Availability of solar power depends on the time of day (sunrise and sunsets) and weather variables such as cloud cover. The power output of a PV field can be intermittent and may vary abruptly throughout the course of a day. For example, a down-ramp (i.e., a negative change) in PV output power may occur when a cloud passes over a PV field. An up-ramp (i.e., a positive change) in PV output power may occur at sunrise and at any time during the day when a cloudy sky above the PV field clears up. This intermittency in PV power output presents a problem to the stability of the energy grid. In order to address the intermittency of PV output power, ramp rate control is often used to maintain the stability of the grid.

Ramp rate control is the process of offsetting PV ramp rates that fall outside of compliance limits determined by the electric power authority overseeing the grid. Ramp rate control typically requires the use of an energy source that allows for offsetting ramp rates by either supplying additional power to the grid or consuming more power from the grid. Stationary battery technology can been used for such applications. Stationary battery technology can also be used for frequency regulation, which is the process of maintaining the grid frequency at a desired value (e.g. 60 Hz in the United States) by adding or removing energy from the grid as needed. However, it is difficult and challenging to implement both ramp rate control and frequency regulation simultaneously.

Ramp rate control and frequency regulation both impact the rate at which energy is provided to or removed from the energy grid. However, ramp rate control and frequency regulation often have conflicting objectives (i.e., controlling PV ramp rates vs. regulating grid frequency) which the same battery from being used for ramp rate control and frequency regulation simultaneously. Additionally, conventional ramp rate control and frequency regulation techniques can result in premature degradation of battery assets and often fail to maintain the state-of-charge of the battery within an acceptable range. It would be desirable to provide solutions to these and other disadvantages of conventional ramp rate control and frequency regulation techniques.

SUMMARY

One implementation of the present disclosure is an electrical energy storage system. The system includes a battery configured to store and discharge electric power to an energy grid, a power inverter configured to use battery power setpoints to control an amount of the electric power stored or discharged from the battery, the battery power setpoints comprising at least one of frequency regulation power setpoints and ramp rate control power setpoints, and a controller. The controller is configured to use a battery life model to generate the battery power setpoints for the power inverter. The battery life model includes one or more variables that depend on the battery power setpoints.

In some embodiments, the controller is configured to generate the frequency regulation power setpoints based on a frequency of the energy grid, generate the ramp rate control power setpoints based on a power output of a photovoltaic field, and combine the frequency regulation power setpoints and the ramp rate control power setpoints to generate the battery power setpoints.

In some embodiments, the one or more variables that depend on the battery power setpoints include at least one of a temperature of the battery, a state-of-charge of the battery, a depth of discharge of the battery, a power ratio of the battery, and an effort ratio of the battery.

In some embodiments, the controller is configured to determine a relationship between each of the variables in of the battery life model and one or more variables manipulated by the controller.

In some embodiments, the controller is configured to use the battery life model to estimate an amount of battery degradation that will result from the battery power setpoints.

In some embodiments, the controller is configured to use the estimated amount of battery degradation to estimate a cost of the battery degradation that will result from the battery power setpoints.

In some embodiments, the controller is configured to estimate an amount of frequency response revenue that will result from the battery power setpoints and generate the battery power setpoints as a function of both the estimated cost of battery degradation and the estimated amount of frequency response revenue that will result from the battery power setpoints.

In some embodiments, the battery life model is a parametric model. The parametric model may include a regression coefficient for each of the one or more variables in the battery life model. The controller may be configured to perform a curve fitting process to determine values for the regression coefficients.

Another implementation of the present disclosure is a method for operating an electrical energy storage system. The method includes storing electric power in a battery and discharging the stored electric power to an energy grid. The method may further include using battery power setpoints to control an amount of the electric power stored or discharged from the battery. The battery power setpoints may include at least one of frequency regulation power setpoints and ramp rate control power setpoints. The method may further include using a battery life model to generate the battery power setpoints. The battery life model may include one or more variables that depend on the battery power setpoints.

In some embodiments, the method my further include generating the frequency regulation power setpoints based on a frequency of the energy grid, generating the ramp rate control power setpoints based on a power output of a photovoltaic field, and combining the frequency regulation power setpoints and the ramp rate control power setpoints to generate the battery power setpoints.

In some embodiments, the one or more variables that depend on the battery power setpoints include at least one of a temperature of the battery, a state-of-charge of the battery, a depth of discharge of the battery, a power ratio of the battery, and an effort ratio of the battery.

In some embodiments, the method may further include determining a relationship between each of the variables in of the battery life model and one or more variables manipulated by a controller.

In some embodiments, the method further includes using the battery life model to estimate an amount of battery degradation that will result from the battery power setpoints.

In some embodiments, the method further includes using the estimated amount of battery degradation to estimate a cost of the battery degradation that will result from the battery power setpoints.

In some embodiments, the method further includes estimating an amount of frequency response revenue that will result from the battery power setpoints and generating the battery power setpoints as a function of both the estimated cost of battery degradation and the estimated amount of frequency response revenue that will result from the battery power setpoints.

In some embodiments, the battery life model is a parametric model. The parametric model includes a regression coefficient for each of the one or more variables in the battery life model. In some embodiments, the method further includes performing a curve fitting process to determine values for the regression coefficients.

Another implementation of the present disclosure is a controller for an electrical energy storage system. The controller includes a processing circuit. The processing circuit is configured to use a battery life model to generate battery power setpoints. The battery life model comprising one or more variables that depend on the battery power setpoints. The processing circuit is further configured to use the battery power setpoints to control an amount of electric power stored or discharged from a battery. The battery power setpoints comprising at least one of frequency regulation power setpoints and ramp rate control power setpoints.

In some embodiments, the processing circuit is further configured to generate the frequency regulation power setpoints based on a frequency of the energy grid, generate the ramp rate control power setpoints based on a power output of a photovoltaic field, and combine the frequency regulation power setpoints and the ramp rate control power setpoints to generate the battery power setpoints.

In some embodiments, the one or more variables that depend on the battery power setpoints include at least one of a temperature of the battery, a state-of-charge of the battery, a depth of discharge of the battery, a power ratio of the battery, and an effort ratio of the battery.

In some embodiments, the processing circuit is further configured to use the battery life model to estimate an amount of battery degradation that will result from the battery power setpoints. In some embodiments, the processing circuit is further configured to use the estimated amount of battery degradation to estimate a cost of the battery degradation that will result from the battery power setpoints.

Those skilled in the art will appreciate that the summary is illustrative only and is not intended to be in any way limiting. Other aspects, inventive features, and advantages of the devices and/or processes described herein, as defined solely by the claims, will become apparent in the detailed description set forth herein and taken in conjunction with the accompanying drawings.

BRIEF DESCRIPTION OF THE DRAWINGS

FIG. 6 is a flowchart of a process for determining frequency response midpoints and battery power setpoints that maintain the battery at the same state-of-charge at the beginning and end of each frequency response period, according to an exemplary embodiment.

FIG. 7 is a flowchart of a process for determining optimal frequency response midpoints and battery power setpoints in the presence of demand charges, according to an exemplary embodiment.

DETAILED DESCRIPTION

Figure 1:
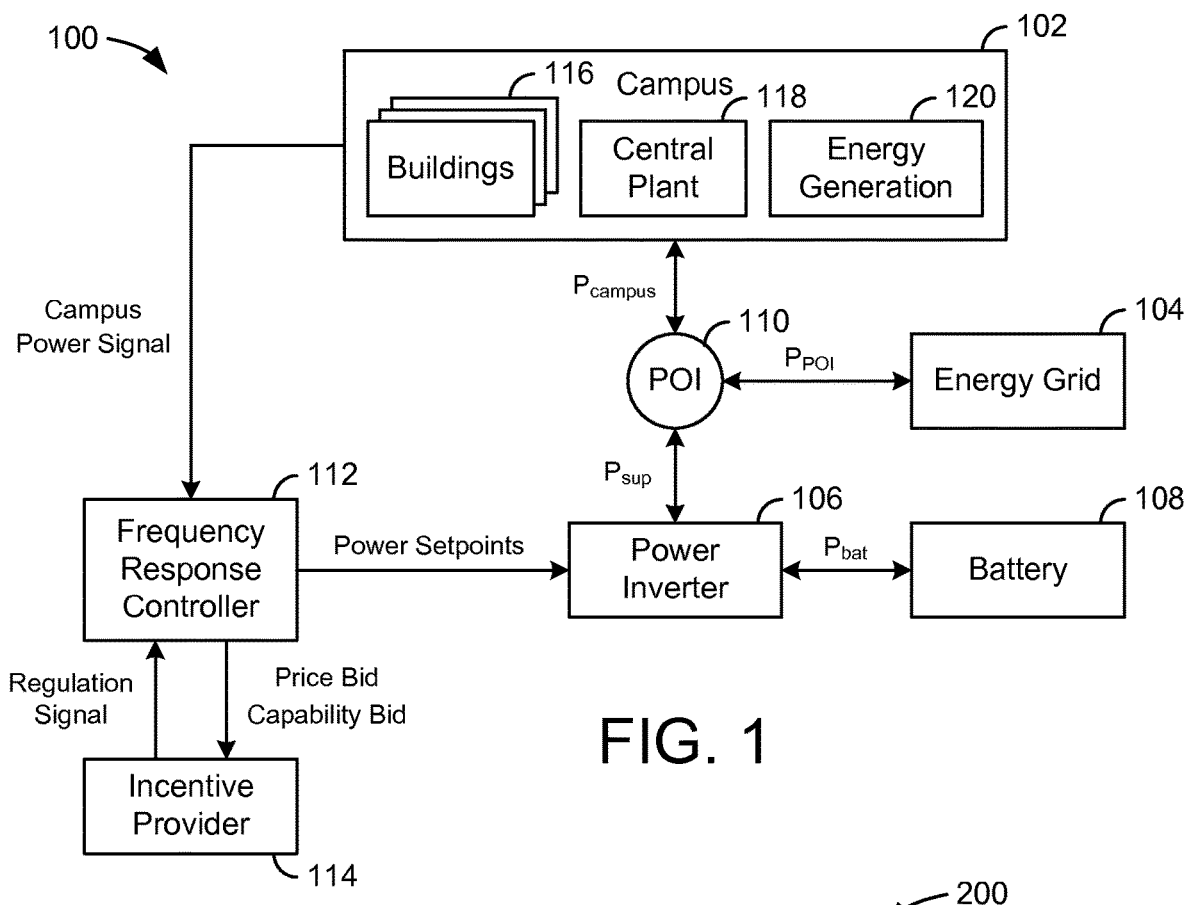
FIG. 1 is a block diagram of a frequency response optimization system, according to an exemplary embodiment.

Referring generally to the FIGURES, systems and methods for controlling and using electrical energy storage are shown, according to various exemplary embodiments. Electrical energy storage (e.g., a battery) can be used for several applications, two of which are ramp rate control and frequency regulation. Ramp rate control is the process of offsetting ramp rates (i.e., increases or decreases in the power output of an energy system such as a photovoltaic energy system) that fall outside of compliance limits determined by the electric power authority overseeing the energy grid. Ramp rate control typically requires the use of an energy source that allows for offsetting ramp rates by either supplying additional power to the grid or consuming more power from the grid. In some instances, a facility is penalized for failing to comply with ramp rate requirements.

Frequency regulation (also referred to as frequency response) is the process of maintaining the grid frequency at a desired value (e.g. 60 Hz in the United States) by adding or removing energy from the grid as needed. During a fluctuation of the grid frequency, a frequency regulation system may offset the fluctuation by either drawing more energy from the energy grid (e.g., if the grid frequency is too high) or by providing energy to the energy grid (e.g., if the grid frequency is too low). A facility participating in a frequency regulation program may receive a regulation signal from a utility or other entity responsible for regulating the frequency of the energy grid. In response to the regulation signal, the facility adds or removes energy from the energy grid. The facility may be provided with monetary incentives or awards in exchange for participating in the frequency regulation program.

Storing electrical energy in a battery may allow a facility to perform frequency regulation and/or ramp rate control. However, repeatedly charging and discharging the battery may cause battery degradation and reduce battery life. In some instances, the costs of battery degradation (e.g., decreased ability to store and discharge energy, reduced potential for participating in frequency regulation programs, etc.) outweigh the monetary incentives or cost savings that would be gained from using the battery to perform frequency regulation and/or ramp rate control. However, it is difficult and challenging to predict the costs of battery degradation. Additionally, even if the costs of battery degradation are known, it can be difficult to determine appropriate control actions to preserve battery life.

Advantageously, the systems and methods described herein use a battery life model to predict the battery degradation that will result from various control actions (e.g., charging or discharging the battery). The battery life model may estimate battery capacity loss as a function of variables that can be controlled (e.g., by a battery controller) while performing ramp rate control and/or frequency regulation. Losses in battery capacity can be converted into revenue losses and compared with the potential revenue gains resulting from battery usage (e.g., frequency response revenue). This allows the controller to make an informed decision regarding battery usage by considering the tradeoff between revenue generation potential and battery degradation.

The following sections of this disclosure describe the battery life model in greater detail as well as several exemplary systems in which the battery life model may be used. For example, the battery life model can be used in a frequency response optimization system to determine optimal battery power setpoints while participating in a frequency response program. The frequency response implementation is described with reference to FIGS. 1-7. The battery life model can also be used to determine optimal battery power setpoints and photovoltaic power setpoints in a photovoltaic (PV) energy system that simultaneously performs both frequency regulation and ramp rate control. The PV energy system implementation is described with reference to FIGS. 8A-8B.

Frequency Response Optimization

Referring to FIG. 1, a frequency response optimization system 100 is shown, according to an exemplary embodiment. System 100 is shown to include a campus 102 and an energy grid 104. Campus 102 may include one or more buildings 116 that receive power from energy grid 104. Buildings 116 may include equipment or devices that consume electricity during operation. For example, buildings 116 may include HVAC equipment, lighting equipment, security equipment, communications equipment, vending machines, computers, electronics, elevators, or other types of building equipment. In some embodiments, buildings 116 are served by a building management system (BMS). A BMS is, in general, a system of devices configured to control, monitor, and manage equipment in or around a building or building area. A BMS can include, for example, a HVAC system, a security system, a lighting system, a fire alerting system, and/or any other system that is capable of managing building functions or devices. An exemplary building management system which may be used to monitor and control buildings 116 is described in U.S. patent application Ser. No. 14/717,593, titled "Building Management System for Forecasting Time Series Values of Building Variables" and filed May 20, 2015, the entire disclosure of which is incorporated by reference herein.

In some embodiments, campus 102 includes a central plant 118. Central plant 118 may include one or more subplants that consume resources from utilities (e.g., water, natural gas, electricity, etc.) to satisfy the loads of buildings 116. For example, central plant 118 may include a heater subplant, a heat recovery chiller subplant, a chiller subplant, a cooling tower subplant, a hot thermal energy storage (TES) subplant, and a cold thermal energy storage (TES) subplant, a steam subplant, and/or any other type of subplant configured to serve buildings 116. The subplants may be configured to convert input resources (e.g., electricity, water, natural gas, etc.) into output resources (e.g., cold water, hot water, chilled air, heated air, etc.) that are provided to buildings 116. An exemplary central plant which may be used to satisfy the loads of buildings 116 is described U.S. patent application Ser. No. 14/634,609, titled "High Level Central Plant Optimization" and filed Feb. 27, 2015, the entire disclosure of which is incorporated by reference herein.

In some embodiments, campus 102 includes energy generation 120. Energy generation 120 may be configured to generate energy that can be used by buildings 116, used by central plant 118, and/or provided to energy grid 104. In some embodiments, energy generation 120 generates electricity. For example, energy generation 120 may include an electric power plant, a photovoltaic energy field, or other types of systems or devices that generate electricity. The electricity generated by energy generation 120 can be used internally by campus 102 (e.g., by buildings 116 and/or campus 118) to decrease the amount of electric power that campus 102 receives from outside sources such as energy grid 104 or battery 108. If the amount of electricity generated by energy generation 120 exceeds the electric power demand of campus 102, the excess electric power can be provided to energy grid 104 or stored in battery 108. The power output of campus 102 is shown in FIG. 1 as $P_{campus}$. $P_{campus}$ may be positive if campus 102 is outputting electric power or negative if campus 102 is receiving electric power.

Still referring to FIG. 1, system 100 is shown to include a power inverter 106 and a battery 108. Power inverter 106 may be configured to convert electric power between direct current (DC) and alternating current (AC). For example, battery 108 may be configured to store and output DC power, whereas energy grid 104 and campus 102 may be configured to consume and generate AC power. Power inverter 106 may be used to convert DC power from battery 108 into a sinusoidal AC output synchronized to the grid frequency of energy grid 104. Power inverter 106 may also be used to convert AC power from campus 102 or energy grid 104 into DC power that can be stored in battery 108. The power output of battery 108 is shown as $P_{bat}$. $P_{bat}$ may be positive if battery 108 is providing power to power inverter 106 or negative if battery 108 is receiving power from power inverter 106.

In some instances, power inverter 106 receives a DC power output from battery 108 and converts the DC power output to an AC power output that can be fed into energy grid 104. Power inverter 106 may synchronize the frequency of the AC power output with that of energy grid 104 (e.g., 50 Hz or 60 Hz) using a local oscillator and may limit the voltage of the AC power output to no higher than the grid voltage. In some embodiments, power inverter 106 is a resonant inverter that includes or uses LC circuits to remove the harmonics from a simple square wave in order to achieve a sine wave matching the frequency of energy grid 104. In various embodiments, power inverter 106 may operate using high-frequency transformers, low-frequency transformers, or without transformers. Low-frequency transformers may convert the DC output from battery 108 directly to the AC output provided to energy grid 104. High-frequency transformers may employ a multi-step process that involves converting the DC output to high-frequency AC, then back to DC, and then finally to the AC output provided to energy grid 104.

System 100 is shown to include a point of interconnection (POI) 110. POI 110 is the point at which campus 102, energy grid 104, and power inverter 106 are electrically connected. The power supplied to POI 110 from power inverter 106 is shown as $P_{sup}$. $P_{sup}$ may be defined as $P_{bat}+P_{loss}$, where $P_{batt}$ is the battery power and $P_{loss}$ is the power loss in the battery system (e.g., losses in power inverter 106 and/or battery 108). $P_{sup}$ may be positive is power inverter 106 is providing power to POI 110 or negative if power inverter 106 is receiving power from POI 110. $P_{campus}$ and $P_{sup}$ combine at POI 110 to form $P_{POI}$. $P_{POI}$ may be defined as the power provided to energy grid 104 from POI 110. $P_{POI}$ may be positive if POI 110 is providing power to energy grid 104 or negative if POI 110 is receiving power from energy grid 104.

Still referring to FIG. 1, system 100 is shown to include a frequency response controller 112. Controller 112 may be configured to generate and provide power setpoints to power inverter 106. Power inverter 106 may use the power setpoints to control the amount of power $P_{sup}$ provided to POI 110 or drawn from POI 110. For example, power inverter 106 may be configured to draw power from POI 110 and store the power in battery 108 in response to receiving a negative power setpoint from controller 112. Conversely, power inverter 106 may be configured to draw power from battery 108 and provide the power to POI 110 in response to receiving a positive power setpoint from controller 112. The magnitude of the power setpoint may define the amount of power $P_{sup}$ provided to or from power inverter 106. Controller 112 may be configured to generate and provide power setpoints that optimize the value of operating system 100 over a time horizon.

In some embodiments, frequency response controller 112 uses power inverter 106 and battery 108 to perform frequency regulation for energy grid 104. Frequency regulation is the process of maintaining the stability of the grid frequency (e.g., 60 Hz in the United States). The grid frequency may remain stable and balanced as long as the total electric supply and demand of energy grid 104 are balanced. Any deviation from that balance may result in a deviation of the grid frequency from its desirable value. For example, an increase in demand may cause the grid frequency to decrease, whereas an increase in supply may cause the grid frequency to increase. Frequency response controller 112 may be configured to offset a fluctuation in the grid frequency by causing power inverter 106 to supply energy from battery 108 to energy grid 104 (e.g., to offset a decrease in grid frequency) or store energy from energy grid 104 in battery 108 (e.g., to offset an increase in grid frequency).

In some embodiments, frequency response controller 112 uses power inverter 106 and battery 108 to perform load shifting for campus 102. For example, controller 112 may cause power inverter 106 to store energy in battery 108 when energy prices are low and retrieve energy from battery 108 when energy prices are high in order to reduce the cost of electricity required to power campus 102. Load shifting may also allow system 100 reduce the demand charge incurred. Demand charge is an additional charge imposed by some utility providers based on the maximum power consumption during an applicable demand charge period. For example, a demand charge rate may be specified in terms of dollars per unit of power (e.g., $/kW) and may be multiplied by the peak power usage (e.g., kW) during a demand charge period to calculate the demand charge. Load shifting may allow system 100 to smooth momentary spikes in the electric demand of campus 102 by drawing energy from battery 108 in order to reduce peak power draw from energy grid 104, thereby decreasing the demand charge incurred.

Still referring to FIG. 1, system 100 is shown to include an incentive provider 114. Incentive provider 114 may be a utility (e.g., an electric utility), a regional transmission organization (RTO), an independent system operator (ISO), or any other entity that provides incentives for performing frequency regulation. For example, incentive provider 114 may provide system 100 with monetary incentives for participating in a frequency response program. In order to participate in the frequency response program, system 100 may maintain a reserve capacity of stored energy (e.g., in battery 108) that can be provided to energy grid 104. System 100 may also maintain the capacity to draw energy from energy grid 104 and store the energy in battery 108. Reserving both of these capacities may be accomplished by managing the state-of-charge of battery 108.

Frequency response controller 112 may provide incentive provider 114 with a price bid and a capability bid. The price bid may include a price per unit power (e.g., $/MW) for reserving or storing power that allows system 100 to participate in a frequency response program offered by incentive provider 114. The price per unit power bid by frequency response controller 112 is referred to herein as the "capability price." The price bid may also include a price for actual performance, referred to herein as the "performance price." The capability bid may define an amount of power (e.g., MW) that system 100 will reserve or store in battery 108 to perform frequency response, referred to herein as the "capability bid."

Incentive provider 114 may provide frequency response controller 112 with a capability clearing price $CP_{cap}$, a performance clearing price $CP_{perf}$, and a regulation award $Reg_{award}$, which correspond to the capability price, the performance price, and the capability bid, respectively. In some embodiments, $CP_{cap}$, $CP_{perf}$, and $Reg_{award}$ are the same as the corresponding bids placed by controller 112. In other embodiments, $CP_{cap}$, $CP_{perf}$, and $Reg_{award}$ may not be the same as the bids placed by controller 112. For example, $CP_{cap}$, $CP_{perf}$, and $Reg_{award}$ may be generated by incentive provider 114 based on bids received from multiple participants in the frequency response program. Controller 112 may use $CP_{cap}$, $CP_{perf}$, and $Reg_{award}$ to perform frequency regulation, described in greater detail below.

Frequency response controller 112 is shown receiving a regulation signal from incentive provider 114. The regulation signal may specify a portion of the regulation award $Reg_{award}$ that frequency response controller 112 is to add or remove from energy grid 104. In some embodiments, the regulation signal is a normalized signal (e.g., between −1 and 1) specifying a proportion of $Reg_{award}$. Positive values of the regulation signal may indicate an amount of power to add to energy grid 104, whereas negative values of the regulation signal may indicate an amount of power to remove from energy grid 104.

Frequency response controller 112 may respond to the regulation signal by generating an optimal power setpoint for power inverter 106. The optimal power setpoint may take into account both the potential revenue from participating in the frequency response program and the costs of participation. Costs of participation may include, for example, a monetized cost of battery degradation as well as the energy and demand charges that will be incurred. The optimization may be performed using sequential quadratic programming, dynamic programming, or any other optimization technique.

In some embodiments, controller 112 uses a battery life model to quantify and monetize battery degradation as a function of the power setpoints provided to power inverter 106. Advantageously, the battery life model allows controller 112 to perform an optimization that weighs the revenue generation potential of participating in the frequency response program against the cost of battery degradation and other costs of participation (e.g., less battery power available for campus 102, increased electricity costs, etc.). An exemplary regulation signal and power response are described in greater detail with reference to FIG. 2.

Figure 2:
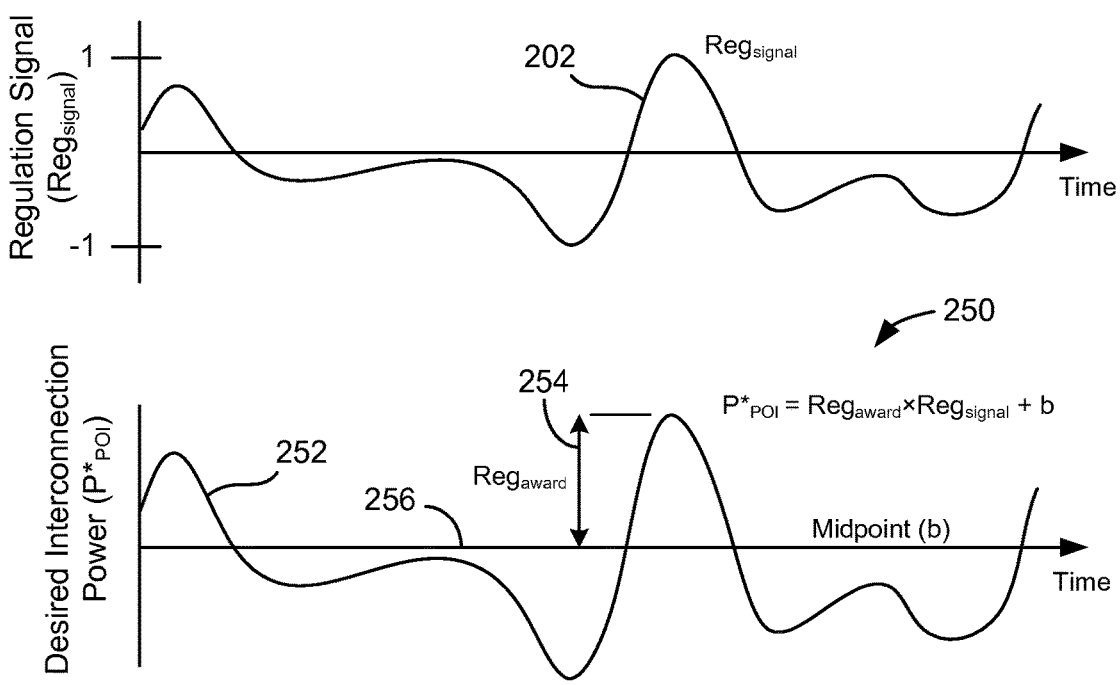
FIG. 2 is a graph of a regulation signal which may be provided to the system of FIG. 1 and a frequency response signal which may be generated by the system of FIG. 1, according to an exemplary embodiment.

Referring now to FIG. 2, a pair of frequency response graphs 200 and 250 are shown, according to an exemplary embodiment. Graph 200 illustrates a regulation signal $Reg_{signal}$ 202 as a function of time. $Reg_{signal}$ 202 is shown as a normalized signal ranging from −1 to 1 (i.e., −1 ≤ $Reg_{signal}$ ≤ 1). $Reg_{signal}$ 202 may be generated by incentive provider 114 and provided to frequency response controller 112. $Reg_{signal}$ 202 may define a proportion of the regulation award $Reg_{award}$ 254 that controller 112 is to add or remove from energy grid 104, relative to a baseline value referred to as the midpoint b 256. For example, if the value of $Reg_{award}$ 254 is 10 MW, a regulation signal value of 0.5 (i.e., $Reg_{signal}$=0.5) may indicate that system 100 is requested to add 5 MW of power at POI 110 relative to midpoint b (e.g., $P^*_{POI}$=10 MW×0.5+b), whereas a regulation signal value of −0.3 may indicate that system 100 is requested to remove 3 MW of power from POI 110 relative to midpoint b (e.g., $P^*_{POI}$=10 MW×−0.3+b).

Graph 250 illustrates the desired interconnection power $P^*_{POI}$ 252 as a function of time. $P^*_{POI}$ 252 may be calculated by frequency response controller 112 based on $Reg_{signal}$ 202, $Reg_{award}$ 254, and a midpoint b 256. For example, controller 112 may calculate $P^*_{POI}$ 252 using the following equation:

$$P^*_{POI}=Reg_{award} \times Reg_{signal}+b$$

where $P^*_{POI}$ represents the desired power at POI 110 (e.g., $P^*_{POI}=P_{sup}+P_{campus}$) and b is the midpoint. Midpoint b may be defined (e.g., set or optimized) by controller 112 and may represent the midpoint of regulation around which the load is modified in response to $Reg_{signal}$ 202. Optimal adjustment of midpoint b may allow controller 112 to actively participate in the frequency response market while also taking into account the energy and demand charge that will be incurred.

In order to participate in the frequency response market, controller 112 may perform several tasks. Controller 112 may generate a price bid (e.g., $/MW) that includes the capability price and the performance price. In some embodiments, controller 112 sends the price bid to incentive provider 114 at approximately 15:30 each day and the price bid remains in effect for the entirety of the next day. Prior to beginning a frequency response period, controller 112 may generate the capability bid (e.g., MW) and send the capability bid to incentive provider 114. In some embodiments, controller 112 generates and sends the capability bid to incentive provider 114 approximately 1.5 hours before a frequency response period begins. In an exemplary embodiment, each frequency response period has a duration of one hour; however, it is contemplated that frequency response periods may have any duration.

At the start of each frequency response period, controller 112 may generate the midpoint b around which controller 112 plans to perform frequency regulation. In some embodiments, controller 112 generates a midpoint b that will maintain battery 108 at a constant state-of-charge (SOC) (i.e. a midpoint that will result in battery 108 having the same SOC at the beginning and end of the frequency response period). In other embodiments, controller 112 generates midpoint b using an optimization procedure that allows the SOC of battery 108 to have different values at the beginning and end of the frequency response period. For example, controller 112 may use the SOC of battery 108 as a constrained variable that depends on midpoint b in order to optimize a value function that takes into account frequency response revenue, energy costs, and the cost of battery degradation. Exemplary processes for calculating and/or optimizing midpoint b under both the constant SOC scenario and the variable SOC scenario are described in greater detail with reference to FIGS. 3-4.

During each frequency response period, controller 112 may periodically generate a power setpoint for power inverter 106. For example, controller 112 may generate a power setpoint for each time step in the frequency response period. In some embodiments, controller 112 generates the power setpoints using the equation:

$$P^*_{POI}=Reg_{award} \times Reg_{signal}+b$$

where $P^*_{POI}=P_{sup}+P_{campus}$. Positive values of $P^*_{POI}$ indicate energy flow from POI 110 to energy grid 104. Positive values of $P_{sup}$ and $P_{campus}$ indicate energy flow to POI 110 from power inverter 106 and campus 102, respectively. In other embodiments, controller 112 generates the power setpoints using the equation:

$$P^*_{POI}=Reg_{award} \times Res_{FR}+b$$

where $Res_{FR}$ is an optimal frequency response generated by optimizing a value function (described in greater detail below). Controller 112 may subtract $P_{campus}$ from $P^*_{POI}$ to generate the power setpoint for power inverter 106 (i.e., $P_{sup}=P^*_{POI}-P_{campus}$). The power setpoint for power inverter 106 indicates the amount of power that power inverter 106 is to add to POI 110 (if the power setpoint is positive) or remove from POI 110 (if the power setpoint is negative).

Frequency Response Controller

Figure 3:
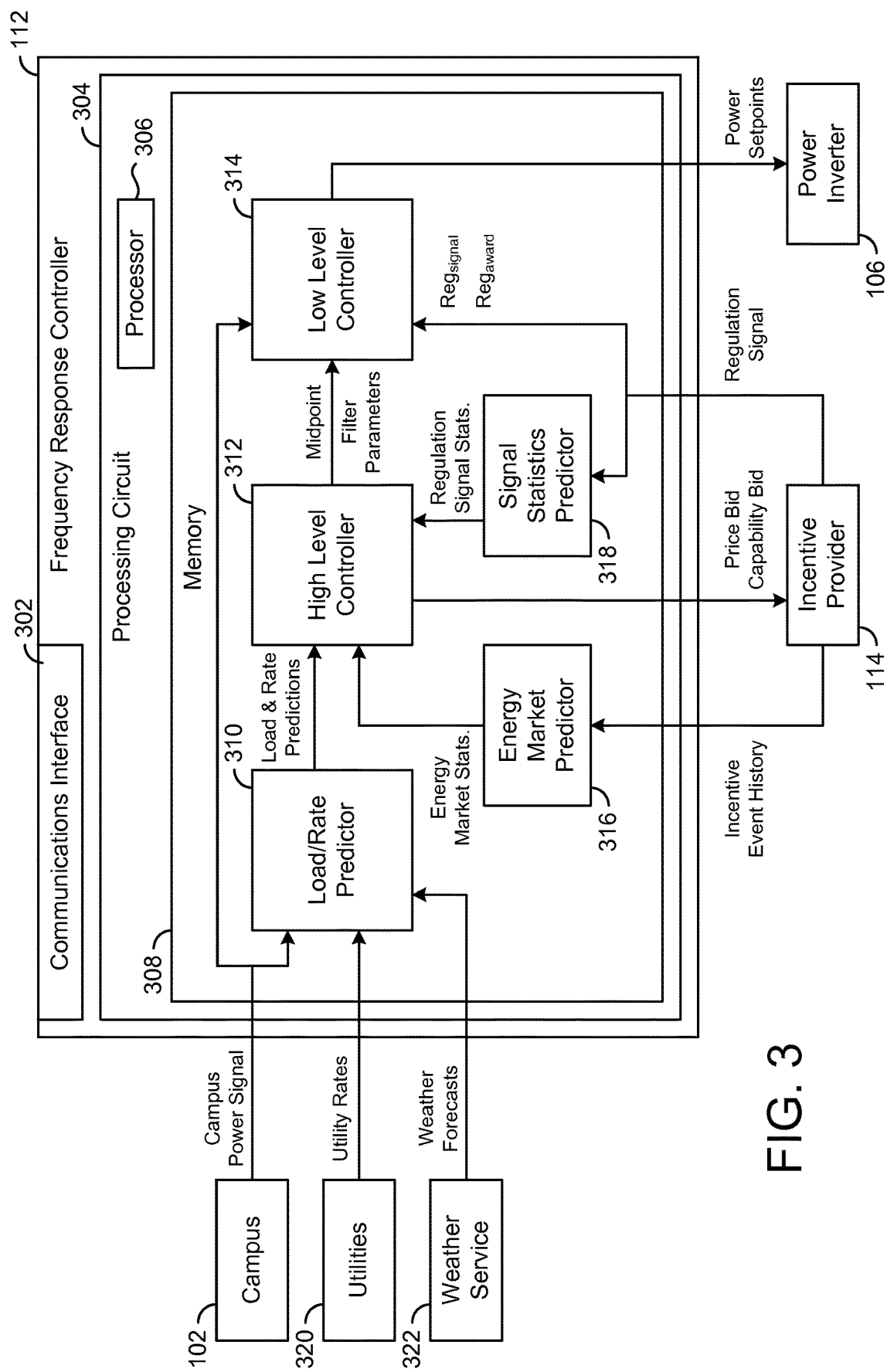
FIG. 3 is a block diagram illustrating the frequency response controller of FIG. 1 in greater detail, according to an exemplary embodiment.

Referring now to FIG. 3, a block diagram illustrating frequency response controller 112 in greater detail is shown, according to an exemplary embodiment. Frequency response controller 112 may be configured to perform an optimization process to generate values for the bid price, the capability bid, and the midpoint b. In some embodiments, frequency response controller 112 generates values for the bids and the midpoint b periodically using a predictive optimization scheme (e.g., once every half hour, once per frequency response period, etc.). Controller 112 may also calculate and update power setpoints for power inverter 106 periodically during each frequency response period (e.g., once every two seconds).

In some embodiments, the interval at which controller 112 generates power setpoints for power inverter 106 is significantly shorter than the interval at which controller 112 generates the bids and the midpoint b. For example, controller 112 may generate values for the bids and the midpoint b every half hour, whereas controller 112 may generate a power setpoint for power inverter 106 every two seconds. The difference in these time scales allows controller 112 to use a cascaded optimization process to generate optimal bids, midpoints b, and power setpoints.

In the cascaded optimization process, a high level controller 312 determines optimal values for the bid price, the capability bid, and the midpoint b by performing a high level optimization. High level controller 312 may select midpoint b to maintain a constant state-of-charge in battery 108 (i.e., the same state-of-charge at the beginning and end of each frequency response period) or to vary the state-of-charge in order to optimize the overall value of operating system 100 (e.g., frequency response revenue minus energy costs and battery degradation costs). High level controller 312 may also determine filter parameters for a signal filter (e.g., a low pass filter) used by a low level controller 314.

Low level controller 314 uses the midpoint b and the filter parameters from high level controller 312 to perform a low level optimization in order to generate the power setpoints for power inverter 106. Advantageously, low level controller 314 may determine how closely to track the desired power $P^*_{POI}$ at the point of interconnection 110. For example, the low level optimization performed by low level controller 314 may consider not only frequency response revenue but also the costs of the power setpoints in terms of energy costs and battery degradation. In some instances, low level controller 314 may determine that it is deleterious to battery 108 to follow the regulation exactly and may sacrifice a portion of the frequency response revenue in order to preserve the life of battery 108. The cascaded optimization process is described in greater detail below.

Still referring to FIG. 3, frequency response controller 112 is shown to include a communications interface 302 and a processing circuit 304. Communications interface 302 may include wired or wireless interfaces (e.g., jacks, antennas, transmitters, receivers, transceivers, wire terminals, etc.) for conducting data communications with various systems, devices, or networks. For example, communications interface 302 may include an Ethernet card and port for sending and receiving data via an Ethernet-based communications network and/or a WiFi transceiver for communicating via a wireless communications network. Communications interface 302 may be configured to communicate via local area networks or wide area networks (e.g., the Internet, a building WAN, etc.) and may use a variety of communications protocols (e.g., BACnet, IP, LON, etc.).

Communications interface 302 may be a network interface configured to facilitate electronic data communications between frequency response controller 112 and various external systems or devices (e.g., campus 102, energy grid 104, power inverter 106, incentive provider 114, utilities 320, weather service 322, etc.). For example, frequency response controller 112 may receive inputs from incentive provider 114 indicating an incentive event history (e.g., past clearing prices, mileage ratios, participation requirements, etc.) and a regulation signal. Controller 112 may receive a campus power signal from campus 102, utility rates from utilities 320, and weather forecasts from weather service 322 via communications interface 302. Controller 112 may provide a price bid and a capability bid to incentive provider 114 and may provide power setpoints to power inverter 106 via communications interface 302.

Still referring to FIG. 3, processing circuit 304 is shown to include a processor 306 and memory 308. Processor 306 may be a general purpose or specific purpose processor, an application specific integrated circuit (ASIC), one or more field programmable gate arrays (FPGAs), a group of processing components, or other suitable processing components. Processor 306 may be configured to execute computer code or instructions stored in memory 308 or received from other computer readable media (e.g., CDROM, network storage, a remote server, etc.).

Memory 308 may include one or more devices (e.g., memory units, memory devices, storage devices, etc.) for storing data and/or computer code for completing and/or facilitating the various processes described in the present disclosure. Memory 308 may include random access memory (RAM), read-only memory (ROM), hard drive storage, temporary storage, non-volatile memory, flash memory, optical memory, or any other suitable memory for storing software objects and/or computer instructions. Memory 308 may include database components, object code components, script components, or any other type of information structure for supporting the various activities and information structures described in the present disclosure. Memory 308 may be communicably connected to processor 306 via processing circuit 304 and may include computer code for executing (e.g., by processor 306) one or more processes described herein.

Still referring to FIG. 3, frequency response controller 112 is shown to include a load/rate predictor 310. Load/rate predictor 310 may be configured to predict the electric load of campus 102 (i.e., $\hat{P}_{campus}$) for each time step k (e.g., k=1 . . . n) within an optimization window. Load/rate predictor 310 is shown receiving weather forecasts from a weather service 322. In some embodiments, load/rate predictor 310 predicts $\hat{P}_{campus}$ as a function of the weather forecasts. In some embodiments, load/rate predictor 310 uses feedback from campus 102 to predict $\hat{P}_{campus}$. Feedback from campus 102 may include various types of sensory inputs (e.g., temperature, flow, humidity, enthalpy, etc.) or other data relating to buildings 116, central plant 118, and/or energy generation 120 (e.g., inputs from a HVAC system, a lighting control system, a security system, a water system, a PV energy system, etc.). Load/rate predictor 310 may predict one or more different types of loads for campus 102. For example, load/rate predictor 310 may predict a hot water load, a cold water load, and/or an electric load for each time step k within the optimization window.

In some embodiments, load/rate predictor 310 receives a measured electric load and/or previous measured load data from campus 102. For example, load/rate predictor 310 is shown receiving a campus power signal from campus 102. The campus power signal may indicate the measured electric load of campus 102. Load/rate predictor 310 may predict one or more statistics of the campus power signal including, for example, a mean campus power $\mu_{campus}$ and a standard deviation of the campus power $\sigma_{campus}$. Load/rate predictor 310 may predict $\hat{P}_{campus}$ as a function of a given weather forecast ($\hat{\phi}_w$), a day type (day), the time of day (t), and previous measured load data ($Y_{k-1}$). Such a relationship is expressed in the following equation:

$$\hat{P}_{campus} = f(\hat{\phi}_w, \text{day}, t | Y_{k-1})$$

In some embodiments, load/rate predictor 310 uses a deterministic plus stochastic model trained from historical load data to predict $\hat{P}_{campus}$. Load/rate predictor 310 may use any of a variety of prediction methods to predict $\hat{P}_{campus}$ (e.g., linear regression for the deterministic portion and an AR model for the stochastic portion). In some embodiments, load/rate predictor 310 makes load/rate predictions using the techniques described in U.S. patent application Ser. No. 14/717,593, titled "Building Management System for Forecasting Time Series Values of Building Variables" and filed May 20, 2015.

Load/rate predictor 310 is shown receiving utility rates from utilities 320. Utility rates may indicate a cost or price per unit of a resource (e.g., electricity, natural gas, water, etc.) provided by utilities 320 at each time step k in the optimization window. In some embodiments, the utility rates are time-variable rates. For example, the price of electricity may be higher at certain times of day or days of the week (e.g., during high demand periods) and lower at other times of day or days of the week (e.g., during low demand periods). The utility rates may define various time periods and a cost per unit of a resource during each time period. Utility rates may be actual rates received from utilities 320 or predicted utility rates estimated by load/rate predictor 310.

In some embodiments, the utility rates include demand charges for one or more resources provided by utilities 320. A demand charge may define a separate cost imposed by utilities 320 based on the maximum usage of a particular resource (e.g., maximum energy consumption) during a demand charge period. The utility rates may define various demand charge periods and one or more demand charges associated with each demand charge period. In some instances, demand charge periods may overlap partially or completely with each other and/or with the prediction window. Advantageously, frequency response controller 112 may be configured to account for demand charges in the high level optimization process performed by high level controller 312. Utilities 320 may be defined by time-variable (e.g., hourly) prices, a maximum service level (e.g., a maximum rate of consumption allowed by the physical infrastructure or by contract) and, in the case of electricity, a demand charge or a charge for the peak rate of consumption within a certain period. Load/rate predictor 310 may store the predicted campus power $\hat{P}_{campus}$ and the utility rates in memory 308 and/or provide the predicted campus power $\hat{P}_{campus}$ and the utility rates to high level controller 312.

Still referring to FIG. 3, frequency response controller 112 is shown to include an energy market predictor 316 and a signal statistics predictor 318. Energy market predictor 316 may be configured to predict energy market statistics relating to the frequency response program. For example, energy market predictor 316 may predict the values of one or more variables that can be used to estimate frequency response revenue. In some embodiments, the frequency response revenue is defined by the following equation:

$$\text{Rev} = \text{PS}(CP_{cap} + \text{MR} + CP_{perf})\text{Reg}_{award}$$

where Rev is the frequency response revenue, $CP_{cap}$ is the capability clearing price, MR is the mileage ratio, and $CP_{perf}$ is the performance clearing price. PS is a performance score based on how closely the frequency response provided by controller 112 tracks the regulation signal. Energy market predictor 316 may be configured to predict the capability clearing price $CP_{cap}$, the performance clearing price $CP_{perf}$, the mileage ratio MR, and/or other energy market statistics that can be used to estimate frequency response revenue. Energy market predictor 316 may store the energy market statistics in memory 308 and/or provide the energy market statistics to high level controller 312.

Signal statistics predictor 318 may be configured to predict one or more statistics of the regulation signal provided by incentive provider 114. For example, signal statistics predictor 318 may be configured to predict the mean $\mu_{FR}$, standard deviation $\sigma_{FR}$, and/or other statistics of the regulation signal. The regulation signal statistics may be based on previous values of the regulation signal (e.g., a historical mean, a historical standard deviation, etc.) or predicted values of the regulation signal (e.g., a predicted mean, a predicted standard deviation, etc.).

In some embodiments, signal statistics predictor 318 uses a deterministic plus stochastic model trained from historical regulation signal data to predict future values of the regulation signal. For example, signal statistics predictor 318 may use linear regression to predict a deterministic portion of the regulation signal and an AR model to predict a stochastic portion of the regulation signal. In some embodiments, signal statistics predictor 318 predicts the regulation signal using the techniques described in U.S. patent application Ser. No. 14/717,593, titled "Building Management System for Forecasting Time Series Values of Building Variables" and filed May 20, 2015. Signal statistics predictor 318 may use the predicted values of the regulation signal to calculate the regulation signal statistics. Signal statistics predictor 318 may store the regulation signal statistics in memory 308 and/or provide the regulation signal statistics to high level controller 312.

Still referring to FIG. 3, frequency response controller 112 is shown to include a high level controller 312. High level controller 312 may be configured to generate values for the midpoint b and the capability bid $\text{Reg}_{award}$. In some embodiments, high level controller 312 determines a midpoint b that will cause battery 108 to have the same state-of-charge (SOC) at the beginning and end of each frequency response period. In other embodiments, high level controller 312 performs an optimization process to generate midpoint b and $\text{Reg}_{award}$. For example, high level controller 312 may generate midpoint b using an optimization procedure that allows the SOC of battery 108 to vary and/or have different values at the beginning and end of the frequency response period. High level controller 312 may use the SOC of battery 108 as a constrained variable that depends on midpoint b in order to optimize a value function that takes into account frequency response revenue, energy costs, and the cost of battery degradation. Both of these embodiments are described in greater detail with reference to FIG. 4.

High level controller 312 may determine midpoint b by equating the desired power $P^*_{POI}$ at POI 110 with the actual power at POI 110 as shown in the following equation:

$$(Reg_{signal})(Reg_{award})+b=P_{bat}+P_{loss}+P_{campus}$$

where the left side of the equation $(Reg_{signal})(Reg_{award})+b$ is the desired power $P^*_{POI}$ at POI 110 and the right side of the equation is the actual power at POI 110. Integrating over the frequency response period results in the following equation:

$$\int_{period} ((Reg_{signal})(Reg_{award})+b)dt = \int_{period} (P_{bat}+P_{loss}+P_{campus})dt$$

For embodiments in which the SOC of battery 108 is maintained at the same value at the beginning and end of the frequency response period, the integral of the battery power $P_{bat}$ over the frequency response period is zero (i.e., $\int P_{bat} dt=0$). Accordingly, the previous equation can be rewritten as follows:

$$b = \int_{period} P_{loss}dt + \int_{period} P_{campus}dt - Reg_{award}\int_{period} Reg_{signal}dt$$

where the term $\int P_{bat}dt$ has been omitted because $\int P_{bat}dt=0$. This is ideal behavior if the only goal is to maximize frequency response revenue. Keeping the SOC of battery 108 at a constant value (and near 50%) will allow system 100 to participate in the frequency market during all hours of the day.

High level controller 312 may use the estimated values of the campus power signal received from campus 102 to predict the value of $\int P_{campus}dt$ over the frequency response period. Similarly, high level controller 312 may use the estimated values of the regulation signal from incentive provider 114 to predict the value of $\int Reg_{signal}dt$ over the frequency response period. High level controller 312 may estimate the value of $\int P_{loss}dt$ using a Thevinin equivalent circuit model of battery 108 (described in greater detail with reference to FIG. 4). This allows high level controller 312 to estimate the integral $\int P_{loss}dt$ as a function of other variables such as $Reg_{award}$, $Reg_{signal}$, $P_{campus}$, and midpoint b.

After substituting known and estimated values, the preceding equation can be rewritten as follows:

$$\frac{1}{4P_{max}}[E\{P_{campus}^2\} + Reg_{award}^2 E\{Reg_{signal}^2\} - 2Reg_{award}E\{Reg_{signal}\}E\{P_{campus}\}]\Delta t +$$

$$[Reg_{award}E\{Reg_{signal}\} - E\{P_{campus}\}]\Delta t +$$

$$\frac{b}{2P_{max}}[Reg_{award}E\{Reg_{signal}\} - E\{P_{campus}\}]\Delta t + b\Delta t + \frac{b^2}{4P_{max}}\Delta t = 0$$

where the notation $E\{\ \}$ indicates that the variable within the brackets $\{\ \}$ is ergodic and can be approximated by the estimated mean of the variable. For example, the term $E\{Reg_{signal}\}$ can be approximated by the estimated mean of the regulation signal $\mu_{FR}$ and the term $E\{P_{campus}\}$ can be approximated by the estimated mean of the campus power signal $\mu_{campus}$. High level controller 312 may solve the equation for midpoint b to determine the midpoint b that maintains battery 108 at a constant state-of-charge.

For embodiments in which the SOC of battery 108 is treated as a variable, the SOC of battery 108 may be allowed to have different values at the beginning and end of the frequency response period. Accordingly, the integral of the battery power $P_{bat}$ over the frequency response period can be expressed as $-\Delta SOC \cdot C_{des}$ as shown in the following equation:

$$\int_{period} P_{bat}dt = -\Delta SOC \cdot C_{des}$$

where $\Delta SOC$ is the change in the SOC of battery 108 over the frequency response period and $C_{des}$ is the design capacity of battery 108. The SOC of battery 108 may be a normalized variable (i.e., $0 \leq SOC \leq 1$) such that the term $SOC \cdot C_{des}$ represents the amount of energy stored in battery 108 for a given state-of-charge. The SOC is shown as a negative value because drawing energy from battery 108 (i.e., a positive $P_{bat}$) decreases the SOC of battery 108. The equation for midpoint b becomes:

$$b = \int_{period} P_{loss}\,dt + \int_{period} P_{campus}\,dt + \int_{period} P_{bat}\,dt - Reg_{award}\int_{period} Reg_{signal}\,dt$$

After substituting known and estimated values, the preceding equation can be rewritten as follows:

$$\frac{1}{4P_{max}}[E\{P_{campus}^2\} + Reg_{award}^2 +$$

$$E\{Reg_{signal}^2\} - 2Reg_{award}E\{Reg_{signal}\}E\{P_{campus}\}]\Delta t +$$

$$[Reg_{award}E\{Reg_{signal}\} + E\{P_{campus}\}]\Delta t + \Delta SOC \cdot C_{des} +$$

$$\frac{b}{2P_{max}}[Reg_{award}E\{Reg_{signal}\} - E\{P_{campus}\}]\Delta t + b\Delta t + \frac{b^2}{4P_{max}}\Delta t = 0$$

High level controller 312 may solve the equation for midpoint b in terms of $\Delta SOC$.

High level controller 312 may perform an optimization to find optimal midpoints b for each frequency response period within an optimization window (e.g., each hour for the next day) given the electrical costs over the optimization window. Optimal midpoints b may be the midpoints that maximize an objective function that includes both frequency response revenue and costs of electricity and battery degradation. For example, an objective function J can be written as:

$$J = \sum_{k=1}^{h} Rev(Reg_{award,k}) + \sum_{k=1}^{h} c_k b_k + \min_{period}(P_{campus,k}+b_k) - \sum_{k=1}^{h} \lambda_{bat,k}$$

where $Rev(Reg_{award,k})$ is the frequency response revenue at time step k, $c_k b_k$ is the cost of electricity purchased at time step k, the min( ) term is the demand charge based on the maximum rate of electricity consumption during the applicable demand charge period, and $\lambda_{bat,k}$ is the monetized cost of battery degradation at time step k. The electricity cost is expressed as a positive value because drawing power from energy grid 104 is represented as a negative number and therefore will result in negative value (i.e., a cost) in the objective function. The demand charge is expressed as a minimum for the same reason (i.e., the most negative power value represents maximum power draw from energy grid 104).

High level controller 312 may estimate the frequency response revenue $\text{Rev}(\text{Reg}_{award,k})$ as a function of the midpoints b. In some embodiments, high level controller 312 estimates frequency response revenue using the following equation:

$$\text{Rev}(\text{Reg}_{award}) = \text{Reg}_{award}(\text{CP}_{cap} + \text{MR} + \text{CP}_{perf})$$

where $\text{CP}_{cap}$, MR, and $\text{CP}_{perf}$ are the energy market statistics received from energy market predictor 316 and $\text{Reg}_{award}$ is a function of the midpoint b. For example, high level controller 312 may place a bid that is as large as possible for a given midpoint, as shown in the following equation:

$$\text{Reg}_{award} = P_{limit} - |b|$$

where $P_{limit}$ is the power rating of power inverter 106. Advantageously, selecting $\text{Reg}_{award}$ as a function of midpoint b allows high level controller 312 to predict the frequency response revenue that will result from a given midpoint b.

High level controller 312 may estimate the cost of battery degradation $\lambda_{bat}$ as a function of the midpoints b. For example, high level controller 312 may use a battery life model to predict a loss in battery capacity that will result from a set of midpoints b, power outputs, and/or other variables that can be manipulated by controller 112. In some embodiments, the battery life model expresses the loss in battery capacity $C_{loss,add}$ as a sum of multiple piecewise linear functions, as shown in the following equation:

$$C_{loss,add} = f_1(T_{cell}) + f_2(\text{SOC}) + f_3(\text{DOD}) + f_4(\text{PR}) + f_5(\text{ER}) - C_{loss,nom}$$

where $T_{cell}$ is the cell temperature, SOC is the state-of-charge, DOD is the depth of discharge, PR is the average power ratio $$\left(\text{e.g., } PR = avg\left(\frac{P}{P_{des}}\right)\right),$$

and ER is the average effort ratio $$\left(\text{e.g., } ER = avg\left(\frac{\Delta P}{P_{des}}\right)\right)$$

of battery 108. Each of these terms is described in greater detail with reference to FIG. 4. Advantageously, several of the terms in the battery life model depend on the midpoints b and power setpoints selected by controller 112. This allows high level controller 312 to predict a loss in battery capacity that will result from a given set of control outputs. High level controller 312 may monetize the loss in battery capacity and include the monetized cost of battery degradation $\lambda_{bat}$ in the objective function J.

In some embodiments, high level controller 312 generates a set of filter parameters for low level controller 314. The filter parameters may be used by low level controller 314 as part of a low-pass filter that removes high frequency components from the regulation signal. In some embodiments, high level controller 312 generates a set of filter parameters that transform the regulation signal into an optimal frequency response signal $\text{Res}_{FR}$. For example, high level controller 312 may perform a second optimization process to determine an optimal frequency response $\text{Res}_{FR}$ based on the optimized values for $\text{Reg}_{award}$ and midpoint b.

In some embodiments, high level controller 312 determines the optimal frequency response $\text{Res}_{FR}$ by optimizing value function J with the frequency response revenue $\text{Rev}(\text{Reg}_{award})$ defined as follows:

$$\text{Rev}(\text{Reg}_{award}) = \text{PS} \cdot \text{Reg}_{award}(\text{CP}_{cap} + \text{MR} \cdot \text{CP}_{perf})$$

and with the frequency response $\text{Res}_{FR}$ substituted for the regulation signal in the battery life model. The performance score PS may be based on several factors that indicate how well the optimal frequency response $\text{Res}_{FR}$ tracks the regulation signal. Closely tracking the regulation signal may result in higher performance scores, thereby increasing the frequency response revenue. However, closely tracking the regulation signal may also increase the cost of battery degradation $\lambda_{bat}$. The optimized frequency response $\text{Res}_{FR}$ represents an optimal tradeoff between decreased frequency response revenue and increased battery life. High level controller 312 may use the optimized frequency response $\text{Res}_{FR}$ to generate a set of filter parameters for low level controller 314. These and other features of high level controller 312 are described in greater detail with reference to FIG. 4.

Still referring to FIG. 3, frequency response controller 112 is shown to include a low level controller 314. Low level controller 314 is shown receiving the midpoints b and the filter parameters from high level controller 312. Low level controller 314 may also receive the campus power signal from campus 102 and the regulation signal from incentive provider 114.

Low level controller 314 may use the regulation signal to predict future values of the regulation signal and may filter the predicted regulation signal using the filter parameters provided by high level controller 312.

Low level controller 314 may use the filtered regulation signal to determine optimal power setpoints for power inverter 106. For example, low level controller 314 may use the filtered regulation signal to calculate the desired interconnection power $P^*_{POI}$ using the following equation:

$$P^*_{POI} = \text{Reg}_{award} \cdot \text{Reg}_{filter} + b$$

where $\text{Reg}_{filter}$ is the filtered regulation signal. Low level controller 314 may subtract the campus power $P_{campus}$ from the desired interconnection power $P^*_{POI}$ to calculate the optimal power setpoints $P_{SP}$ for power inverter 106, as shown in the following equation:

$$P_{SP} = P_{POI} - P_{campus}$$

In some embodiments, low level controller 314 performs an optimization to determine how closely to track $P^*_{POI}$. For example, low level controller 314 may determine an optimal frequency response $\text{Res}_{FR}$ by optimizing value function J with the frequency response revenue $\text{Rev}(\text{Reg}_{award})$ defined as follows:

$$\text{Rev}(\text{Reg}_{award}) = \text{PS} \cdot \text{Reg}_{award}(\text{CP}_{cap} + \text{MR} \cdot \text{CP}_{perf})$$

and with the frequency response $\text{Res}_{FR}$ substituted for the regulation signal in the battery life model. Low level controller 314 may use the optimal frequency response $\text{Res}_{FR}$ in place of the filtered frequency response $\text{Reg}_{filter}$ to calculate the desired interconnection power $P^*_{POI}$ and power setpoints $P_{SP}$ as previously described. These and other features of low level controller 314 are described in greater detail with reference to FIG. 5.

High Level Controller

Figure 4:
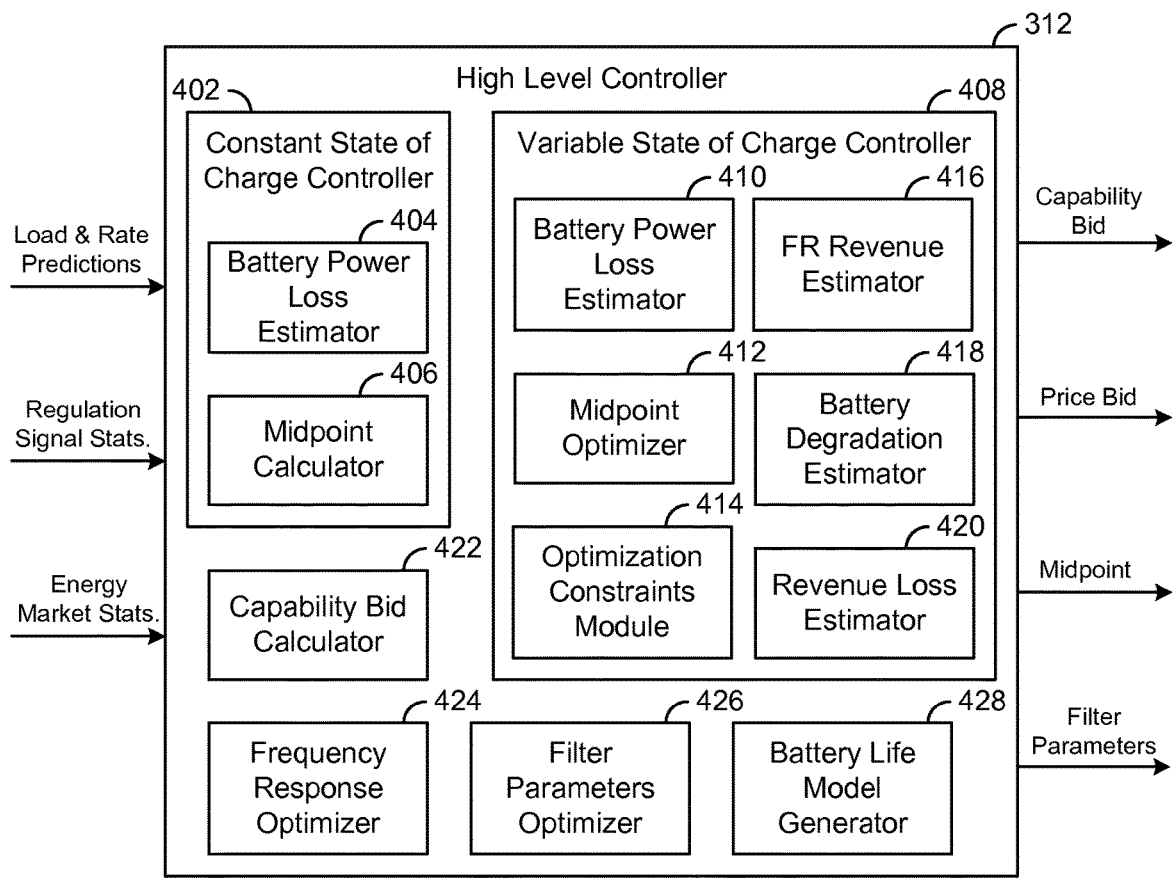
FIG. 4 is a block diagram illustrating the high level controller of FIG. 3 in greater detail, according to an exemplary embodiment.

Referring now to FIG. 4, a block diagram illustrating high level controller 312 in greater detail is shown, according to an exemplary embodiment. High level controller 312 is shown to include a constant state-of-charge (SOC) controller 402 and a variable SOC controller 408. Constant SOC controller 402 may be configured to generate a midpoint b that results in battery 108 having the same SOC at the beginning and the end of each frequency response period. In other words, constant SOC controller 408 may determine a midpoint b that maintains battery 108 at a predetermined SOC at the beginning of each frequency response period. Variable SOC controller 408 may generate midpoint b using an optimization procedure that allows the SOC of battery 108 to have different values at the beginning and end of the frequency response period. In other words, variable SOC controller 408 may determine a midpoint b that results in a net change in the SOC of battery 108 over the duration of the frequency response period.

Constant State-of-Charge Controller

Constant SOC controller 402 may determine midpoint b by equating the desired power $P^*_{POI}$ at POI 110 with the actual power at POI 110 as shown in the following equation:

$$(Reg_{signal})(Reg_{award})+b=P_{bat}+P_{loss}+P_{campus}$$

where the left side of the equation $(Reg_{signal})(Reg_{award})+b$ is the desired power $P^*_{POI}$ at POI 110 and the right side of the equation is the actual power at POI 110. Integrating over the frequency response period results in the following equation:

$$\int_{period} ((Reg_{signal})(Reg_{award}) + b)\, dt = \int_{period} (P_{bat} + P_{loss} + P_{campus})\, dt$$

Since the SOC of battery 108 is maintained at the same value at the beginning and end of the frequency response period, the integral of the battery power $P_{bat}$ over the frequency response period is zero (i.e., $\int P_{bat}dt=0$). Accordingly, the previous equation can be rewritten as follows:

$$b = \int_{period} P_{loss}\, dt + \int_{period} P_{campus}\, dt - Reg_{award} \int_{period} Reg_{signal}\, dt$$

where the term $\int P_{bat}dt$ has been omitted because $\int P_{bat}dt=0$. This is ideal behavior if the only goal is to maximize frequency response revenue. Keeping the SOC of battery 108 at a constant value (and near 50%) will allow system 100 to participate in the frequency market during all hours of the day.

Constant SOC controller 402 may use the estimated values of the campus power signal received from campus 102 to predict the value of $\int P_{campus}dt$ over the frequency response period. Similarly, constant SOC controller 402 may use the estimated values of the regulation signal from incentive provider 114 to predict the value of $\int Reg_{signal}dt$ over the frequency response period. $Reg_{award}$ can be expressed as a function of midpoint b as previously described (e.g., $Reg_{award}=P_{limit}-|b|$). Therefore, the only remaining term in the equation for midpoint b is the expected battery power loss $\int P_{loss}$.

Constant SOC controller 402 is shown to include a battery power loss estimator 404. Battery power loss estimator 404 may estimate the value of $\int P_{loss}dt$ using a Thevinin equivalent circuit model of battery 108. For example, battery power loss estimator 404 may model battery 108 as a voltage source in series with a resistor. The voltage source has an open circuit voltage of $V_{OC}$ and the resistor has a resistance of $R_{TH}$. An electric current I flows from the voltage source through the resistor.

To find the battery power loss in terms of the supplied power $P_{sup}$, battery power loss estimator 404 may identify the supplied power $P_{sup}$ as a function of the current I, the open circuit voltage $V_{OC}$, and the resistance $R_{TH}$ as shown in the following equation:

$$P_{sup}=V_{oc}I-I^2 R_{TH}$$

which can be rewritten as:

$$\frac{I^2}{I_{SC}} - I + \frac{P'}{4} = 0$$

with the following substitutions:

$$I_{SC} = \frac{V_{OC}}{R_{TH}}, \quad P' = \frac{P}{P_{max}}, \quad P_{max} = \frac{V_{OC}^2}{4R_{TH}}$$

where P is the supplied power and $P_{max}$ is the maximum possible power transfer.

Battery power loss estimator 404 may solve for the current I as follows:

$$I = \frac{I_{SC}}{2}\left(1 - \sqrt{1 - P'}\right)$$

which can be converted into an expression for power loss $P_{loss}$ in terms of the supplied power P and the maximum possible power transfer $P_{max}$ as shown in the following equation:

$$P_{loss}=P_{max}(1-\sqrt{1-P'})^2$$

Battery power loss estimator 404 may simplify the previous equation by approximating the expression $(1-\sqrt{1-P'})$ as a linear function about $P'=0$. This results in the following approximation for $P_{loss}$:

$$P_{loss} \approx P_{max}\left(\frac{P'}{2}\right)^2$$

which is a good approximation for powers up to one-fifth of the maximum power.

Battery power loss estimator 404 may calculate the expected value of $\int P_{loss}dt$ over the frequency response period as follows:

$$\int_{period} P_{loss} \, dt = \int_{period} -P_{max} \left( \frac{Reg_{award} Reg_{signal} + b - P_{campus}}{2P_{max}} \right)^2 dt$$

$$= \frac{1}{4P_{max}} \left[ 2Reg_{award} \int_{period} P_{campus} Reg_{signal} \, dt - \int_{period} P_{campus}^2 \, dt - Reg_{award}^2 \int_{period} Reg_{signal}^2 \, dt \right] +$$

$$\frac{b}{2P_{max}} \left[ \int_{period} P_{campus}^2 \, dt - Reg_{award} \int_{period} Reg_{signal} \, dt \right] -$$

$$\frac{b^2}{4P_{max}} \Delta t$$

$$= \frac{1}{4P_{max}} [E\{P_{campus}^2\} + Reg_{award}^2 E\{Reg_{signal}^2\} - 2Reg_{award} E\{Reg_{signal}\} E\{P_{campus}\}] \Delta t -$$

$$\frac{b}{2P_{max}} [Reg_{award} E\{Reg_{signal}\} - E\{P_{campus}\}] \Delta t -$$

$$\frac{b^2}{4P_{max}} \Delta t$$

where the notation E{ } indicates that the variable within the brackets { } is ergodic and can be approximated by the estimated mean of the variable. This formulation allows battery power loss estimator 404 to estimate $\int P_{loss} dt$ as a function of other variables such as $Reg_{award}$, $Reg_{signal}$, $P_{campus}$, midpoint b, and $P_{max}$.

Constant SOC controller 402 is shown to include a midpoint calculator 406. Midpoint calculator 406 may be configured to calculate midpoint b by substituting the previous expression for $\int P_{loss} dt$ into the equation for midpoint b. After substituting known and estimated values, the equation for midpoint b can be rewritten as follows:

$$\frac{1}{4P_{max}} [E\{P_{campus}^2\} + Reg_{award}^2 E\{Reg_{signal}^2\} - 2Reg_{award} E\{Reg_{signal}\} E\{P_{campus}\}] \Delta t +$$

$$[Reg_{award} E\{Reg_{signal}\} - E\{P_{campus}\}] \Delta t +$$

$$\frac{b}{2P_{max}} [Reg_{award} E\{Reg_{signal}\} - E\{P_{campus}\}] \Delta t + b\Delta t + \frac{b^2}{4P_{max}} \Delta t = 0$$

Midpoint calculator 406 may solve the equation for midpoint b to determine the midpoint b that maintains battery 108 at a constant state-of-charge.

Variable State-of-Charge Controller

Variable SOC controller 408 may determine optimal midpoints b by allowing the SOC of battery 108 to have different values at the beginning and end of a frequency response period. For embodiments in which the SOC of battery 108 is allowed to vary, the integral of the battery power $P_{bat}$ over the frequency response period can be expressed as $-\Delta SOC \cdot C_{des}$ as shown in the following equation:

$$\int_{period} P_{bat} \, dt = -\Delta SOC \cdot C_{des}$$

where $\Delta SOC$ is the change in the SOC of battery 108 over the frequency response period and $C_{des}$ is the design capacity of battery 108. The SOC of battery 108 may be a normalized variable (i.e., $0 \leq SOC \leq 1$) such that the term $SOC \cdot C_{des}$ represents the amount of energy stored in battery 108 for a given state-of-charge. The SOC is shown as a negative value because drawing energy from battery 108 (i.e., a positive $P_{bat}$) decreases the SOC of battery 108. The equation for midpoint b becomes:

$$b = \int_{period} P_{loss} \, dt + \int_{period} P_{campus} \, dt + \int_{period} P_{bat} \, dt - Reg_{award} \int_{period} Reg_{signal} \, dt$$

Variable SOC controller 408 is shown to include a battery power loss estimator 410 and a midpoint optimizer 412. Battery power loss estimator 410 may be the same or similar to battery power loss estimator 404. Midpoint optimizer 412 may be configured to establish a relationship between the midpoint b and the SOC of battery 108. For example, after substituting known and estimated values, the equation for midpoint b can be written as follows:

$$\frac{1}{4P_{max}} [E\{P_{campus}^2\} + Reg_{award}^2 +$$

$$E\{Reg_{signal}^2\} - 2Reg_{award} E\{Reg_{signal}\} E\{P_{campus}\}] \Delta t +$$

$$[Reg_{award} E\{Reg_{signal}\} + E\{P_{campus}\}] \Delta t + \Delta SOC \cdot C_{des} +$$

$$\frac{b}{2P_{max}} [Reg_{award} E\{Reg_{signal}\} - E\{P_{campus}\}] \Delta t + b\Delta t + \frac{b^2}{4P_{max}} \Delta t = 0$$

Advantageously, the previous equation defines a relationship between midpoint b and the change in SOC of battery 108. Midpoint optimizer 412 may use this equation to determine the impact that different values of midpoint b have on the SOC in order to determine optimal midpoints b. This equation can also be used by midpoint optimizer 412 during optimization to translate constraints on the SOC in terms of midpoint b. For example, the SOC of battery 108 may be constrained between zero and 1 (e.g., $0 \leq SOC \leq 1$) since battery 108 cannot be charged in excess of its maximum capacity or depleted below zero. Midpoint optimizer 412 may use the relationship between $\Delta SOC$ and midpoint b to constrain the optimization of midpoint b to midpoint values that satisfy the capacity constraint.

Midpoint optimizer 412 may perform an optimization to find optimal midpoints b for each frequency response period within the optimization window (e.g., each hour for the next day) given the electrical costs over the optimization window. Optimal midpoints b may be the midpoints that maximize an objective function that includes both frequency response revenue and costs of electricity and battery degradation. For example, an objective function J can be written as:

$$J = \sum_{k=1}^{h} Rev(Reg_{award,k}) + \sum_{k=1}^{h} c_k b_k + \min_{period} (P_{campus,k} + b_k) - \sum_{k=1}^{h} \lambda_{bat,k}$$

where $Rev(Reg_{award,k})$ is the frequency response revenue at time step k, $c_k b_k$ is the cost of electricity purchased at time step k, the min( ) term is the demand charge based on the maximum rate of electricity consumption during the applicable demand charge period, and $\lambda_{bat,k}$ is the monetized cost battery degradation at time step k. Midpoint optimizer 412 may use input from frequency response revenue estimator 416 (e.g., a revenue model) to determine a relationship between midpoint b and $\text{Rev}(\text{Reg}_{award,k})$. Similarly, midpoint optimizer 412 may use input from battery degradation estimator 418 and/or revenue loss estimator 420 to determine a relationship between midpoint b and the monetized cost of battery degradation $\lambda_{bat,k}$.

Still referring to FIG. 4, variable SOC controller 408 is shown to include an optimization constraints module 414. Optimization constraints module 414 may provide one or more constraints on the optimization performed by midpoint optimizer 412. The optimization constraints may be specified in terms of midpoint b or other variables that are related to midpoint b. For example, optimization constraints module 414 may implement an optimization constraint specifying that the expected SOC of battery 108 at the end of each frequency response period is between zero and one, as shown in the following equation:

$$0 \leq SOC_0 + \sum_{i=1}^{j} \Delta SOC_i \leq 1 \; \forall \; j = 1 \ldots h$$

where $SOC_0$ is the SOC of battery 108 at the beginning of the optimization window, $\Delta SOC_i$ is the change in SOC during frequency response period i, and h is the total number of frequency response periods within the optimization window.

In some embodiments, optimization constraints module 414 implements an optimization constraint on midpoint b so that the power at POI 110 does not exceed the power rating of power inverter 106. Such a constraint is shown in the following equation: limit b (P) m $$-P_{limit} \leq b_k + P_{campus,max}^{(p)} \leq P_{limit}$$

where $P_{limit}$ is the power rating of power inverter 106 and $P_{campus,max}^{(p)}$ is the maximum value of $P_{campus}$ at confidence level p. This constraint could also be implemented by identifying the probability that the sum of $b_k$ and $P_{campus,max}$ exceeds the power inverter power rating (e.g., using a probability density function for $P_{campus,max}$) and limiting that probability to less than or equal to 1−p.

In some embodiments, optimization constraints module 414 implements an optimization constraint to ensure (with a given probability) that the actual SOC of battery 108 remains between zero and one at each time step during the applicable frequency response period. This constraint is different from the first optimization constraint which placed bounds on the expected SOC of battery 108 at the end of each optimization period. The expected SOC of battery 108 can be determined deterministically, whereas the actual SOC of battery 108 is dependent on the campus power $P_{campus}$ and the actual value of the regulation signal $\text{Reg}_{signal}$ at each time step during the optimization period. In other words, for any value of $\text{Reg}_{award} > 0$, there is a chance that battery 108 becomes fully depleted or fully charged while maintaining the desired power $P^*_{POI}$ at POI 110.

Optimization constraints module 414 may implement the constraint on the actual SOC of battery 108 by approximating the battery power $P_{bat}$ (a random process) as a wide-sense stationary, correlated normally distributed process. Thus, the SOC of battery 108 can be considered as a random walk. Determining if the SOC would violate the constraint is an example of a gambler's ruin problem. For example, consider a random walk described by the following equation:

$$y_{k+1} = y_k + x_k, P(x_k = 1) = p, P(x_k = -1) = 1-p$$

The probability P that $y_k$ (starting at state z) will reach zero in less than n moves is given by the following equation:

$$P = 2a^{-1}(2p)^{\frac{n-z}{2}}[2(1-p)]^{\frac{n+z}{2}} \sum_{v=1}^{\frac{a}{2}} \cos^{n-1}\left(\frac{\pi v}{a}\right) \sin\left(\frac{\pi v}{a}\right) \sin\left(\frac{\pi z v}{a}\right)$$

In some embodiments, each frequency response period includes approximately n=1800 time steps (e.g., one time step every two seconds for an hour). Therefore, the central limit theorem applies and it is possible to convert the autocorrelated random process for $P_{bat}$ and the limits on the SOC of battery 108 into an uncorrelated random process of 1 or −1 with a limit of zero.

In some embodiments, optimization constraints module 414 converts the battery power $P_{bat}$ into an uncorrelated normal process driven by the regulation signal $\text{Reg}_{signal}$. For example, consider the original battery power described by the following equation:

$$x_{k+1} = \alpha x_k + e_k, x_k \sim N(\mu, \sigma), e_k \sim N(\mu_e, \sigma_e)$$

where the signal x represents the battery power $P_{bat}$, $\alpha$ is an autocorrelation parameter, and e is a driving signal. In some embodiments, e represents the regulation signal $\text{Reg}_{signal}$. If the power of the signal x is known, then the power of signal e is also known, as shown in the following equations:

$$\mu(1-\alpha) = \mu_e$$

$$E\{x_k^2\}(1-\alpha)^2 - 2\alpha\mu\mu_e = E\{e_k^2\}$$

$$E\{x_k^2\}(1-\alpha^2) - \lambda^2\alpha(1-\alpha) = E\{e_k^2\},$$

Additionally, the impulse response of the difference equation for $x_{k+1}$ is:

$$h_k = \alpha^k \; k \geq 0$$

Using convolution, $x_k$ can be expressed as follows:

$$x_k = \sum_{i=1}^{k} \alpha^{k-i} e_{i-1}$$

$$x_3 = \alpha^2 e_0 + \alpha^1 e_1 + e_2$$

$$x_q = \alpha^{q-1} e_0 + \alpha^{q-2} e_1 + \ldots + \alpha e_{q-2} + e_{q-1}$$

A random walk driven by signal $x_k$ can be defined as follows:

$$y_k = \sum_{j=1}^{k} x_j = \sum_{j=1}^{k} \sum_{i=1}^{j} \alpha^{j-1} e_{i-1}$$

which for large values of j can be approximated using the infinite sum of a geometric series in terms of the uncorrelated signal e rather than x:

$$y_k = \sum_{j=1}^{k} x_j \approx \sum_{j=1}^{k} \frac{1}{1-\alpha} e_j = \sum_{j=1}^{k} x'_j \; k \gg 1$$

Thus, the autocorrelated driving signal $x_k$ of the random walk can be converted into an uncorrelated driving signal $x'_k$ with mean and power given by:

$$E\{x'_k\} = \mu, \; E\{(x'_k - \mu)^2\} = \frac{1+\alpha}{1-\alpha}\sigma^2, \; E\{x'^2_k\} = \frac{1+\alpha}{1-\alpha}\sigma^2 + \mu^2,$$

$$\sigma^2_{x'} = \frac{1+\alpha}{1-\alpha}\sigma^2$$

where $x'_k$ represents the regulation signal $\text{Reg}_{signal}$. Advantageously, this allows optimization constraints module 414 to define the probability of ruin in terms of the regulation signal $\text{Reg}_{signal}$.

In some embodiments, optimization constraints module 414 determines a probability p that the random walk driven by the sequence of −1 and 1 will take the value of 1. In order to ensure that the random walk driven by the sequence of −1 and 1 will behave the same as the random walk driven by $x'_k$, optimization constraints module 414 may select p such that the ratio of the mean to the standard deviation is the same for both driving functions, as shown in the following equations:

$$\frac{\text{mean}}{\text{stdev}} = \frac{\mu}{\sqrt{\frac{1+\alpha}{1-\alpha}}\sigma} = \tilde{\mu} = \frac{2p-1}{\sqrt{4p(1-p)}}$$

$$p = \frac{1}{2} \pm \frac{1}{2}\sqrt{1 - \left(\frac{1}{\tilde{\mu}^2 + 1}\right)}$$

where $\tilde{\mu}$ is the ratio of the mean to the standard deviation of the driving signal (e.g., $\text{Reg}_{signal}$) and $\mu$ is the change in state-of-charge over the frequency response period divided by the number of time steps within the frequency response period $$\left(\text{i.e., } \mu = \frac{\Delta SOC}{n}\right).$$

For embodiments in which each frequency response period has a duration of one hour (i.e., 3600 seconds) and the interval between time steps is two seconds, the number of time steps per frequency response period is 1800 (i.e., n=1800). In the equation for p, the plus is used when $\tilde{\mu}$ is greater than zero, whereas the minus is used when $\tilde{\mu}$ is less than zero. Optimization constraints module 414 may also ensure that both driving functions have the same number of standard deviations away from zero (or ruin) to ensure that both random walks have the same behavior, as shown in the following equation:

$$z = \frac{SOC \cdot C_{des}\sqrt{4p(1-p)}}{\sqrt{\frac{1+\alpha}{1-\alpha}}\sigma}$$

Advantageously, the equations for p and z allow optimization constraints module 414 to define the probability of ruin P (i.e., the probability of battery 108 fully depleting or reaching a fully charged state) within N time steps (n=1 . . . N) as a function of variables that are known to high level controller 312 and/or manipulated by high level controller 312. For example, the equation for p defines p as a function of the mean and standard deviation of the regulation signal $\text{Reg}_{signal}$, which may be estimated by signal statistics predictor 318. The equation for z defines z as a function of the SOC of battery 108 and the parameters of the regulation signal $\text{Reg}_{signal}$.

Optimization constraints module 414 may use one or more of the previous equations to place constraints on $\Delta SOC \cdot C_{des}$ and $\text{Reg}_{award}$ given the current SOC of battery 108. For example, optimization constraints module 414 may use the mean and standard deviation of the regulation signal $\text{Reg}_{signal}$ to calculate p. Optimization constraints module 414 may then use p in combination with the SOC of battery 108 to calculate z. Optimization constraints module 414 may use p and z as inputs to the equation for the probability of ruin P. This allows optimization constraints module 414 to define the probability or ruin P as a function of the SOC of battery 108 and the estimated statistics of the regulation signal $\text{Reg}_{signal}$. Optimization constraints module 414 may impose constraints on the SOC of battery 108 to ensure that the probability of ruin P within N time steps does not exceed a threshold value. These constraints may be expressed as limitations on the variables $\Delta SOC \cdot C_{des}$ and/or $\text{Reg}_{award}$, which are related to midpoint b as previously described.

In some embodiments, optimization constraints module 414 uses the equation for the probability of ruin P to define boundaries on the combination of variables p and z. The boundaries represent thresholds when the probability of ruin P in less than N steps is greater than a critical value $P_{cr}$ (e.g., $P_{cr}$=0.001). For example, optimization constraints module 414 may generate boundaries that correspond to a threshold probability of battery 108 fully depleting or reaching a fully charged state during a frequency response period (e.g., in N=1800 steps).

In some embodiments, optimization constraints module 414 constrains the probability of ruin P to less than the threshold value, which imposes limits on potential combinations of the variables p and z. Since the variables p and z are related to the SOC of battery 108 and the statistics of the regulation signal, the constraints may impose limitations on $\Delta SOC \cdot C_{des}$ and $\text{Reg}_{award}$ given the current SOC of battery 108. These constraints may also impose limitations on midpoint b since the variables $\Delta SOC \cdot C_{des}$ and $\text{Reg}_{award}$ are related to midpoint b. For example, optimization constraints module 414 may set constraints on the maximum bid $\text{Reg}_{award}$ given a desired change in the SOC for battery 108. In other embodiments, optimization constraints module 414 penalizes the objective function J given the bid $\text{Reg}_{award}$ and the change in SOC.

Still referring to FIG. 4, variable SOC controller 408 is shown to include a frequency response (FR) revenue estimator 416. FR revenue estimator 416 may be configured to estimate the frequency response revenue that will result from a given midpoint b (e.g., a midpoint provided by midpoint optimizer 412). The estimated frequency response revenue may be used as the term $\text{Rev}(\text{Reg}_{award,k})$ in the objective function. Midpoint optimizer 412 may use the estimated frequency response revenue along with other terms in the objective function J to determine an optimal midpoint b.

In some embodiments, FR revenue estimator 416 uses a revenue model to predict frequency response revenue. An exemplary revenue model which may be used by FR revenue estimator 416 is shown in the following equation:

$$\text{Rev}(\text{Reg}_{award}) = \text{Reg}_{award}(CP_{cap} + MR \cdot CP_{perf})$$

where $CP_{cap}$, MR, and $CP_{perf}$ are the energy market statistics received from energy market predictor 316 and $Reg_{award}$ is a function of the midpoint b. For example, capability bid calculator 422 may calculate $Reg_{award}$ using the following equation:

$$Reg_{award} = P_{limit} - |b|$$

where $P_{limit}$ is the power rating of power inverter 106.

As shown above, the equation for frequency response revenue used by FR revenue estimator 416 does not include a performance score (or assumes a performance score of 1.0). This results in FR revenue estimator 416 estimating a maximum possible frequency response revenue that can be achieved for a given midpoint b (i.e., if the actual frequency response of controller 112 were to follow the regulation signal exactly). However, it is contemplated that the actual frequency response may be adjusted by low level controller 314 in order to preserve the life of battery 108. When the actual frequency response differs from the regulation signal, the equation for frequency response revenue can be adjusted to include a performance score. The resulting value function J may then be optimized by low level controller 314 to determine an optimal frequency response output which considers both frequency response revenue and the costs of battery degradation, as described with reference to FIG. 5.

Still referring to FIG. 4, variable SOC controller 408 is shown to include a battery degradation estimator 418. Battery degradation estimator 418 may estimate the cost of battery degradation that will result from a given midpoint b (e.g., a midpoint provided by midpoint optimizer 412). The estimated battery degradation may be used as the term $\lambda_{bat}$ in the objective function J. Midpoint optimizer 412 may use the estimated battery degradation along with other terms in the objective function J to determine an optimal midpoint b.

In some embodiments, battery degradation estimator 418 uses a battery life model to predict a loss in battery capacity that will result from a set of midpoints b, power outputs, and/or other variables that can be manipulated by controller 112. The battery life model may define the loss in battery capacity $C_{loss,add}$ as a sum of multiple piecewise linear functions, as shown in the following equation:

$$C_{loss,add} = f_1(T_{cell}) + f_2(SOC) + f_3(DOD) + f_4(PR) + f_5(ER) - C_{loss,nom}$$

where $T_{cell}$ is the cell temperature, SOC is the state-of-charge, DOD is the depth of discharge, PR is the average power ratio $$\left(\text{e.g., } PR = avg\left(\frac{P_{avg}}{P_{des}}\right)\right),$$

and ER is the average effort ratio $$\left(\text{e.g., } ER = avg\left(\frac{\Delta P_{bat}}{P_{des}}\right)\right)$$

of battery 108. $C_{loss,nom}$ is the nominal loss in battery capacity that is expected to occur over time. Therefore, $C_{loss,add}$ represents the additional loss in battery capacity degradation in excess of the nominal value $C_{loss,nom}$.

In some embodiments, the battery life model is generated by a battery life model generator 428. Battery life model generator 428 may define the terms in the battery life model as functions of one or more variables that have known values (e.g., estimated or measured values) and/or variables that can be manipulated by high level controller 312. For example, battery life model generator 428 may define the terms in the battery life model as functions of the regulation signal statistics (e.g., the mean and standard deviation of $Reg_{signal}$), the campus power signal statistics (e.g., the mean and standard deviation of $P_{campus}$), $Reg_{award}$, midpoint b, the SOC of battery 108, and/or other variables that have known or controlled values.

In some embodiments, battery life model generator 428 measures the cell temperature $T_{cell}$ using a temperature sensor configured to measure the temperature of battery 108. In other embodiments, battery life model generator 428 estimates or predicts the cell temperature $T_{cell}$ based on a history of measured temperature values. For example, battery life model generator 428 may use a predictive model to estimate the cell temperature $T_{cell}$ as a function of the battery power $P_{bat}$, the ambient temperature, and/or other variables that can be measured, estimated, or controlled by high level controller 312.

Battery life model generator 428 may define the variable SOC in the battery life model as the SOC of battery 108 at the end of the frequency response period. The SOC of battery 108 may be measured or estimated based on the control decisions made by controller 112. For example, battery life model generator 428 may use a predictive model to estimate or predict the SOC of battery 108 at the end of the frequency response period as a function of the battery power $P_{bat}$, the midpoint b, and/or other variables that can be measured, estimated, or controlled by high level controller 312.

Battery life model generator 428 may define the average power ratio PR as the ratio of the average power output of battery 108 (i.e., $P_{avg}$) to the design power $$P_{des}\left(\text{e.g., } PR = \frac{P_{avg}}{P_{des}}\right).$$

The average power output of battery 108 can be defined using the following equation:

$$P_{avg} = E\{|Reg_{award}Reg_{signal} + b - P_{loss} - P_{campus}|\}$$

where the expression ($Reg_{award}Reg_{signal} + b - P_{loss} - P_{campus}$) represents the battery power $P_{bat}$. The expected value of $P_{avg}$ is given by:

$$P_{avg} = \sigma_{bat}\sqrt{\frac{2}{\pi}}\exp\left(\frac{-\mu_{bat}^2}{2\sigma_{bat}^2}\right) + \text{erf}\left(\frac{-\mu_{bat}}{\sqrt{2\sigma_{bat}^2}}\right)$$

where $\mu_{bat}$ and $\sigma_{bat}^2$ are the mean and variance of the battery power $P_{bat}$. The variables $\mu_{bat}$ and $\pi_{bat}^2$ may be defined as follows:

$$\mu_{bat} = Reg_{award}E\{Reg_{signal}\} + b - E\{P_{loss}\} - E\{P_{campus}\}$$

$$\sigma_{bat}^2 = Reg_{award}^2\tau_{FR}^2 + \sigma_{campus}^2$$

where $\sigma_{FR}^2$ is the variance of $Reg_{signal}$ and the contribution of the battery power loss to the variance $\sigma_{bat}^2$ is neglected.

Battery life model generator 428 may define the average effort ratio ER as the ratio of the average change in battery power $\Delta P_{avg}$ to the design power $$P_{des} (\text{i.e., } ER = \frac{\Delta P_{bat}}{P_{des}}).$$

The average change in battery power can be defined using the following equation:

$$\Delta P_{avg} = E\{P_{bat,k} - P_{bat,k-1}\}$$

$$\Delta P_{avg} = E\{|Reg_{award}(Reg_{signal,k} - Reg_{signal,k-1}) - (P_{loss,k} - P_{loss,k-1}) - (P_{campus,k} - P_{campus,k-1})|\}$$

To make this calculation more tractable, the contribution due to the battery power loss can be neglected. Additionally, the campus power $P_{campus}$ and the regulation signal $Reg_{signal}$ can be assumed to be uncorrelated, but autocorrelated with first order autocorrelation parameters of $\alpha_{campus}$ and $\alpha$, respectively. The argument inside the absolute value in the equation for $\Delta P_{avg}$ has a mean of zero and a variance given by:

$$\sigma_{diff}^2 = E\{[Reg_{award}(Reg_{signal,k} - Reg_{signal,k-1}) - (P_{campus,k} - P_{campus,k-1})]^2\}$$

$$= E\{Reg_{award}^2(Reg_{signal,k} - Reg_{signal,k-1})^2 - (P_{campus,k} - P_{campus,k-1})^2\}$$

$$= 2Reg_{award}^2(1-\alpha)\sigma_{FR}^2 + 2(1-\alpha_{campus})\sigma_{campus}^2$$

Battery life model generator 428 may define the depth of discharge DOD as the maximum state-of-charge minus the minimum state-of-charge of battery 108 over the frequency response period, as shown in the following equation:

$$DOD = SOC_{max} - SOC_{min}$$

The SOC of battery 108 can be viewed as a constant slope with a zero mean random walk added to it, as previously described. An uncorrelated normal random walk with a driving signal that has zero mean has an expected range given by:

$$E\{max - min\} = 2\sigma\sqrt{\frac{2N}{\pi}}$$

where $E\{max-min\}$ represents the depth of discharge DOD and can be adjusted for the autocorrelation of the driving signal as follows:

$$E\{max - min\} = 2\sigma_{bat}\sqrt{\frac{1+\alpha_{bat}}{1-\alpha_{bat}}}\sqrt{\frac{2N}{\pi}}$$

$$\sigma_{bat}^2 = Reg_{award}^2\sigma_{FR}^2 + \sigma_{campus}^2$$

$$\alpha_{bat} = \frac{Reg_{award}^2\alpha\sigma_{FR}^2 + \alpha_{campus}\sigma_{campus}^2}{Reg_{award}^2\sigma_{FR}^2 + \sigma_{campus}^2}$$

If the SOC of battery 108 is expected to change (i.e., is not zero mean), the following equation may be used to define the depth of discharge DOD:

$$E\{max-min\} = \begin{cases} R_0 + c \cdot \Delta SOC \cdot \exp\left\{-\alpha\frac{R_0 - \Delta SOC}{\sigma_{bat}}\right\} & \Delta SOC < R_0 \\ \Delta SOC + c \cdot R_0 \cdot \exp\left\{-\alpha\frac{\Delta SOC - R_0}{\sigma_{bat}}\right\} & \Delta SOC > R_0 \end{cases}$$

where $R_0$ is the expected range with zero expected change in the state-of-charge.

Advantageously, battery life model generator 428 may use the previous equations to define each of the variables in the battery life model (e.g., $T_{cell}$, SOC, DOD, PR, and ER) as a function of variables that are known to controller 112 and/or variables that can be manipulated by controller 112 (e.g., battery power setpoint, frequency response control signals, ramp rate control signals, etc.).

In some embodiments, battery life model generator 428 defines the battery life model as a parametric function of the variables $T_{cell}$, SOC, DOD, PR, and ER. For example, battery life model generator 428 may formulate the battery life model as follows:

$$C_{loss,add} = \theta_1 T_{cell} + \theta_2 SOC + \theta_3 DOD + \theta_4 PR + \theta_5 ER - C_{loss,nom}$$

where $\theta_1$-$\theta_5$ are parameters of the battery life model (e.g., regression coefficients) and the variables $T_{cell}$, SOC, DOD, PR, and ER are the same as previously described.

Battery life model generator 428 may perform a series of experiments to determine values for the model parameters $\theta_1$-$\theta_5$. For example, battery life model life generator 428 may apply known battery power signals (e.g., frequency response signals, ramp rate control signals, etc.) to power inverter 106, causing power inverter 106 to charge or discharge battery 108 according to a known profile. Battery life model generator 428 may calculate values for the input variables to the battery life model (e.g., $T_{cell}$, SOC, DOD, PR, and ER) based on the known battery power signals. Battery life model generator 428 may then measure a decrease in battery capacity that results from the known battery power signals. From this experiment, battery life model generator 428 can obtain values for all of the input variables to the battery life model and the resulting output variable $C_{loss,add}$.

Battery life model generator 428 may perform this experiment multiple times to generate test data. The test data may include multiple different sets of values for the input variables $T_{cell}$, SOC, DOD, PR, and ER, along with the resultant value of the output variable $C_{loss,add}$ corresponding to each set of input variables. Battery life model generator 428 may then perform a curve fitting process (e.g., a regression process) to determine values for the model parameters $\theta_1$-$\theta_5$ that best fit the test data. Battery life model generator 428 may provide the battery life model with the values for the model parameters $\theta_1$-$\theta_5$ to battery degradation estimator 418. Battery degradation estimator 418 may use the battery life model to estimate a loss in battery capacity that will result from a new set of input variables based on an actual or potential set of control outputs (e.g., frequency response signals, ramp rate control signals, battery power control signals, etc.). A process for generating and using a battery life model is described in greater detail with reference to FIG. 9.

Still referring to FIG. 4, variable SOC controller 408 is shown to include a revenue loss estimator 420. Revenue loss estimator 420 may be configured to estimate an amount of potential revenue that will be lost as a result of the battery capacity loss $C_{loss,add}$. In some embodiments, revenue loss estimator 420 converts battery capacity loss $C_{loss,add}$ into lost revenue using the following equation:

$$R_{loss} = (CP_{cap} + MR \cdot CP_{perf})C_{loss,add}P_{des}$$

where $R_{loss}$ is the lost revenue over the duration of the frequency response period.

Revenue loss estimator 420 may determine a present value of the revenue loss $R_{loss}$ using the following equation:

$$\lambda_{bat} = \left[ \frac{1 - \left(1 + \frac{i}{n}\right)^{-n}}{\frac{i}{n}} \right] R_{loss}$$

where n is the total number of frequency response periods (e.g., hours) during which the revenue loss occurs and $\lambda_{bat}$ is the present value of the revenue loss during the ith frequency response period. In some embodiments, the revenue loss occurs over ten years (e.g., n=87,600 hours). Revenue loss estimator 420 may provide the present value of the revenue loss $\lambda_{bat}$ to midpoint optimizer 412 for use in the objective function J.

Midpoint optimizer 412 may use the inputs from optimization constraints module 414, FR revenue estimator 416, battery degradation estimator 418, and revenue loss estimator 420 to define the terms in objective function J. Midpoint optimizer 412 may determine values for midpoint b that optimize objective function J. In various embodiments, midpoint optimizer 412 may use sequential quadratic programming, dynamic programming, or any other optimization technique to optimize the objective function J.

Still referring to FIG. 4, high level controller 312 is shown to include a capability bid calculator 422. Capability bid calculator 422 may be configured to generate a capability bid $Reg_{award}$ based on the midpoint b generated by constant SOC controller 402 and/or variable SOC controller 408. In some embodiments, capability bid calculator 422 generates a capability bid that is as large as possible for a given midpoint, as shown in the following equation:

$$Reg_{award} = P_{limit} - |b|$$

where $P_{limit}$ is the power rating of power inverter 106. Capability bid calculator 422 may provide the capability bid to incentive provider 114 and to frequency response optimizer 424 for use in generating an optimal frequency response.

Filter Parameters Optimization

Still referring to FIG. 4, high level controller 312 is shown to include a frequency response optimizer 424 and a filter parameters optimizer 426. Filter parameters optimizer 426 may be configured to generate a set of filter parameters for low level controller 314. The filter parameters may be used by low level controller 314 as part of a low-pass filter that removes high frequency components from the regulation signal $Reg_{signal}$. In some embodiments, filter parameters optimizer 426 generates a set of filter parameters that transform the regulation signal $Reg_{signal}$ into an optimal frequency response signal $Res_{FR}$. Frequency response optimizer 424 may perform a second optimization process to determine the optimal frequency response $Res_{FR}$ based on the values for $Reg_{award}$ and midpoint b. In the second optimization, the values for $Reg_{award}$ and midpoint b may be fixed at the values previously determined during the first optimization.

In some embodiments, frequency response optimizer 424 determines the optimal frequency response $Res_{FR}$ by optimizing value function J shown in the following equation:

$$J = \sum_{k=1}^{h} Rev(Reg_{award,k}) + \sum_{k=1}^{h} c_k b_k + \min_{period}(P_{campus,k} + b_k) - \sum_{k=1}^{h} \lambda_{bat,k}$$

where the frequency response revenue $Rev(Reg_{award})$ is defined as follows:

$$Rev(Reg_{award}) = PS \cdot Reg_{award}(CP_{cap} + MR \cdot CP_{perf})$$

and the frequency response $Res_{FR}$ is substituted for the regulation signal $Reg_{signal}$ in the battery life model used to calculate $\lambda_{bat,k}$. The performance score PS may be based on several factors that indicate how well the optimal frequency response $Res_{FR}$ tracks the regulation signal $Reg_{signal}$.

The frequency response $Res_{FR}$ may affect both $Rev(Reg_{award})$ and the monetized cost of battery degradation $\lambda_{bat}$. Closely tracking the regulation signal may result in higher performance scores, thereby increasing the frequency response revenue. However, closely tracking the regulation signal may also increase the cost of battery degradation $\lambda_{bat}$. The optimized frequency response $Res_{FR}$ represents an optimal tradeoff between decreased frequency response revenue and increased battery life (i.e., the frequency response that maximizes value J).

In some embodiments, the performance score PS is a composite weighting of an accuracy score, a delay score, and a precision score. Frequency response optimizer 424 may calculate the performance score PS using the performance score model shown in the following equation:

$$PS = \tfrac{1}{3} PS_{acc} + \tfrac{1}{3} PS_{delay} + \tfrac{1}{3} PS_{prec}$$

where $PS_{acc}$ is the accuracy score, $PS_{delay}$ is the delay score, and $PS_{prec}$ is the precision score. In some embodiments, each term in the precision score is assigned an equal weighting (e.g., ⅓). In other embodiments, some terms may be weighted higher than others.

The accuracy score $PS_{acc}$ may be the maximum correlation between the regulation signal $Reg_{signal}$ and the optimal frequency response $Res_{FR}$. Frequency response optimizer 424 may calculate the accuracy score $PS_{acc}$ using the following equation:

$$PS_{acc} = \max_{\delta} r_{Reg, Res(\delta)}$$

where $\delta$ is a time delay between zero and $\delta_{max}$ (e.g., between zero and five minutes).

The delay score $PS_{delay}$ may be based on the time delay $\delta$ between the regulation signal $Reg_{signal}$ and the optimal frequency response $Res_{FR}$. Frequency response optimizer 424 may calculate the delay score $PS_{delay}$ using the following equation:

$$PS_{delay} = \left| \frac{\delta[s] - \delta_{max}}{\delta_{max}} \right|$$

where $\delta[s]$ is the time delay of the frequency response $Res_{FR}$ relative to the regulation signal $Reg_{signal}$ and $\delta_{max}$ is the maximum allowable delay (e.g., 5 minutes or 300 seconds).

The precision score $PS_{prec}$ may be based on a difference between the frequency response $Res_{FR}$ and the regulation signal $Reg_{signal}$. Frequency response optimizer 424 may calculate the precision score $PS_{prec}$ using the following equation:

$$PS_{prec} = 1 - \frac{\sum |Res_{FR} - Reg_{signal}|}{\sum |Reg_{signal}|}$$

Frequency response optimizer 424 may use the estimated performance score and the estimated battery degradation to define the terms in objective function J. Frequency response optimizer 424 may determine values for frequency response $Res_{FR}$ that optimize objective function J. In various embodiments, frequency response optimizer 424 may use sequential quadratic programming, dynamic programming, or any other optimization technique.

Filter parameters optimizer 426 may use the optimized frequency response $Res_{FR}$ to generate a set of filter parameters for low level controller 314. In some embodiments, the filter parameters are used by low level controller 314 to translate an incoming regulation signal into a frequency response signal. Low level controller 314 is described in greater detail with reference to FIG. 5.

Figure 14:
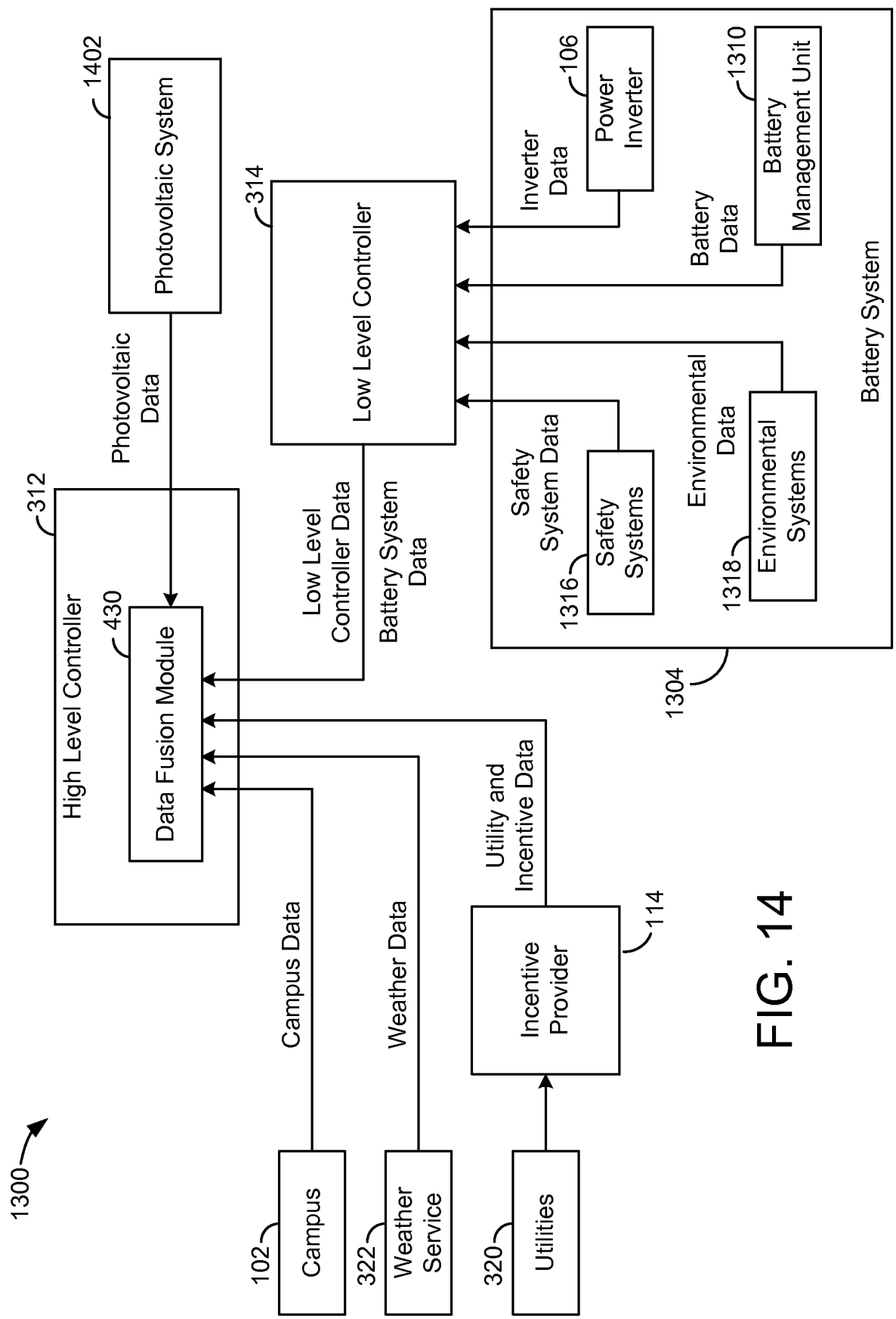
FIG. 14 is a block diagram illustrating data flow into a data fusion module of the frequency response control system of FIG. 13, according to an exemplary embodiment.

In some embodiments, high level controller 312 includes a data fusion module 430 (shown in FIG. 14). Data fusion module 430 is configured to aggregate data received from external systems and devices for processing by high level controller 312. For example, data fusion module 430 may store and aggregate external data such as the campus power signal, utility rates, incentive event history and/or weather forecasts as shown in FIG. 14. Further, data fusion module 430 may store and aggregate data from low level controller 314. For example, data fusion module 430 may receive data such as battery SOC, battery temperature, battery system temperature data, security device status data, battery voltage data, battery current data and/or any other data provided by battery system 1304. Data fusion module 430 is described in greater detail with reference to FIG. 14.

Low Level Controller

Figure 5:
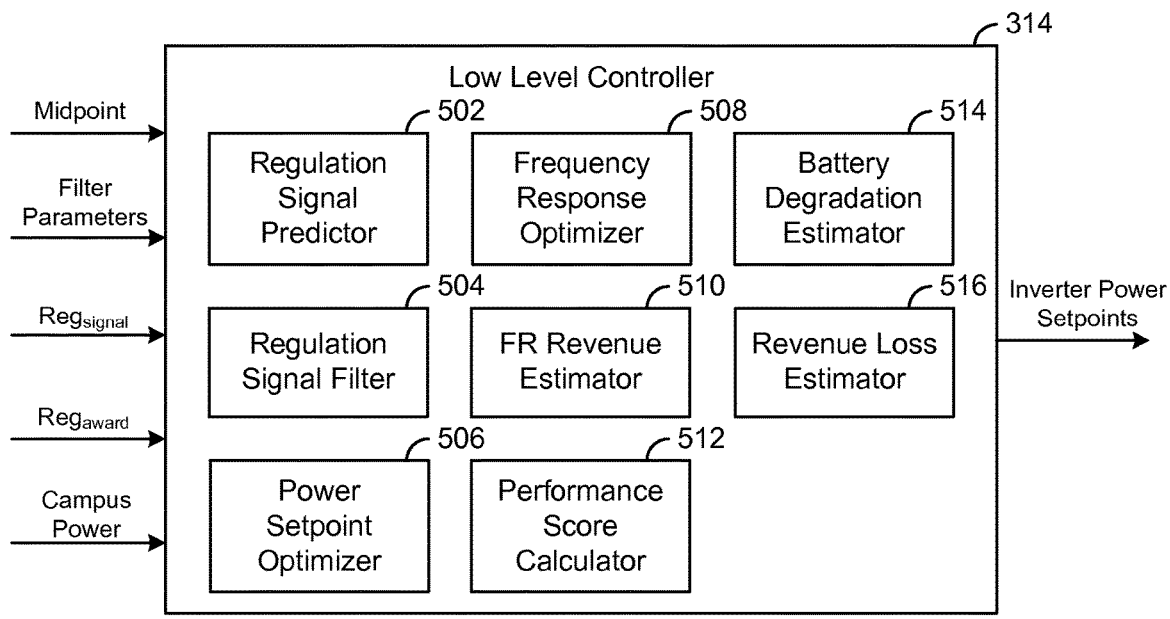
FIG. 5 is a block diagram illustrating the low level controller of FIG. 3 in greater detail, according to an exemplary embodiment.

Referring now to FIG. 5, a block diagram illustrating low level controller 314 in greater detail is shown, according to an exemplary embodiment. Low level controller 314 may receive the midpoints b and the filter parameters from high level controller 312. Low level controller 314 may also receive the campus power signal from campus 102 and the regulation signal $Reg_{signal}$ and the regulation award $Reg_{award}$ from incentive provider 114.

Predicting and Filtering the Regulation Signal

Low level controller 314 is shown to include a regulation signal predictor 502. Regulation signal predictor 502 may use a history of past and current values for the regulation signal $Reg_{signal}$ to predict future values of the regulation signal. In some embodiments, regulation signal predictor 502 uses a deterministic plus stochastic model trained from historical regulation signal data to predict future values of the regulation signal $Reg_{signal}$. For example, regulation signal predictor 502 may use linear regression to predict a deterministic portion of the regulation signal $Reg_{signal}$ and an AR model to predict a stochastic portion of the regulation signal $Reg_{signal}$. In some embodiments, regulation signal predictor 502 predicts the regulation signal $Reg_{signal}$ using the techniques described in U.S. patent application Ser. No. 14/717,593, titled "Building Management System for Forecasting Time Series Values of Building Variables" and filed May 20, 2015.

Low level controller 314 is shown to include a regulation signal filter 504. Regulation signal filter 504 may filter the incoming regulation signal $Reg_{signal}$ and/or the predicted regulation signal using the filter parameters provided by high level controller 312. In some embodiments, regulation signal filter 504 is a low pass filter configured to remove high frequency components from the regulation signal $Reg_{signal}$. Regulation signal filter 504 may provide the filtered regulation signal to power setpoint optimizer 506.

Determining Optimal Power Setpoints

Power setpoint optimizer 506 may be configured to determine optimal power setpoints for power inverter 106 based on the filtered regulation signal. In some embodiments, power setpoint optimizer 506 uses the filtered regulation signal as the optimal frequency response. For example, low level controller 314 may use the filtered regulation signal to calculate the desired interconnection power $P^*_{POI}$ using the following equation:

$$P^*_{POI} = Reg_{award} \cdot Reg_{filter} + b$$

where $Reg_{filter}$ is the filtered regulation signal. Power setpoint optimizer 506 may subtract the campus power $P_{campus}$ from the desired interconnection power $P^*_{POI}$ to calculate the optimal power setpoints $P_{SP}$ for power inverter 106, as shown in the following equation:

$$P_{SP} = P^*_{POI} - P_{campus}$$

In other embodiments, low level controller 314 performs an optimization to determine how closely to track $P^*_{POI}$. For example, low level controller 314 is shown to include a frequency response optimizer 508. Frequency response optimizer 508 may determine an optimal frequency response $Res_{FR}$ by optimizing value function J shown in the following equation:

$$J = \sum_{k=1}^{h} Rev(Reg_{award,k}) + \sum_{k=1}^{h} c_k b_k + \min_{period}(P_{campus,k} + b_k) - \sum_{k=1}^{h} \lambda_{bat,k}$$

where the frequency response $Res_{FR}$ affects both $Rev(Reg_{award})$ and the monetized cost of battery degradation $\lambda_{bat}$. The frequency response $Res_{FR}$ may affect both $Rev(Reg_{award})$ and the monetized cost of battery degradation $\lambda_{bat}$. The optimized frequency response $Res_{FR}$ represents an optimal tradeoff between decreased frequency response revenue and increased battery life (i.e., the frequency response that maximizes value J). The values of $Rev(Reg_{award})$ and $\lambda_{bat,k}$ may be calculated by FR revenue estimator 510, performance score calculator 512, battery degradation estimator 514, and revenue loss estimator 516.

Estimating Frequency Response Revenue

Still referring to FIG. 5, low level controller 314 is shown to include a FR revenue estimator 510. FR revenue estimator 510 may estimate a frequency response revenue that will result from the frequency response $Res_{FR}$. In some embodiments, FR revenue estimator 510 estimates the frequency response revenue using the following equation:

$$Rev(Reg_{award}) = PS \cdot Reg_{award}(CP_{cap} + MR \cdot CP_{perf})$$

where $Reg_{award}$, $CP_{cap}$, MR, and $CP_{perf}$ are provided as known inputs and PS is the performance score.

Low level controller 314 is shown to include a performance score calculator 512. Performance score calculator 512 may calculate the performance score PS used in the revenue function. The performance score PS may be based on several factors that indicate how well the optimal frequency response $Res_{FR}$ tracks the regulation signal $Reg_{signal}$. In some embodiments, the performance score PS is a composite weighting of an accuracy score, a delay score, and a precision score. Performance score calculator 512 may calculate the performance score PS using the performance score model shown in the following equation:

$$PS = \tfrac{1}{3} PS_{acc} + \tfrac{1}{3} PS_{delay} + \tfrac{1}{3} PS_{prec}$$

where $PS_{acc}$ is the accuracy score, $PS_{delay}$ is the delay score, and $PS_{prec}$ is the precision score. In some embodiments, each term in the precision score is assigned an equal weighting (e.g., ⅓). In other embodiments, some terms may be weighted higher than others. Each of the terms in the performance score model may be calculated as previously described with reference to FIG. 4.

Estimating Battery Degradation

Still referring to FIG. 5, low level controller 314 is shown to include a battery degradation estimator 514. Battery degradation estimator 514 may be the same or similar to battery degradation estimator 418, with the exception that battery degradation estimator 514 predicts the battery degradation that will result from the frequency response $Res_{FR}$ rather than the original regulation signal $Reg_{signal}$. The estimated battery degradation may be used as the term $\lambda_{batt}$ in the objective function J. Frequency response optimizer 508 may use the estimated battery degradation along with other terms in the objective function J to determine an optimal frequency response $Res_{FR}$.

In some embodiments, battery degradation estimator 514 uses a battery life model to predict a loss in battery capacity that will result from the frequency response $Res_{FR}$. The battery life model may define the loss in battery capacity $C_{loss,add}$ as a sum of multiple piecewise linear functions, as shown in the following equation:

$$C_{loss,add} = f_1(T_{cell}) + f_2(SOC) + f_3(DOD) + f_4(PR) + f_5(ER) - C_{loss,nom}$$

where $T_{cell}$ is the cell temperature, SOC is the state-of-charge, DOD is the depth of discharge, PR is the average power ratio $$(\text{e.g.}, PR = avg(\frac{P_{avg}}{P_{des}})),$$

and ER is the average effort ratio $$(\text{e.g.}, ER = avg(\frac{\Delta P_{bat}}{P_{des}}))$$

of battery 108. $C_{loss,nom}$ is the nominal loss in battery capacity that is expected to occur over time. Therefore, $C_{loss,add}$ represents the additional loss in battery capacity degradation in excess of the nominal value $C_{loss,nom}$. The terms in the battery life model may be calculated as described with reference to FIG. 4, with the exception that the frequency response $Res_{FR}$ is used in place of the regulation signal $Reg_{signal}$. In some embodiments, battery degradation estimator 514 uses the battery life model generated by battery life model generator 428 to estimate the loss in battery capacity.

Still referring to FIG. 5, low level controller 314 is shown to include a revenue loss estimator 516. Revenue loss estimator 516 may be the same or similar to revenue loss estimator 420, as described with reference to FIG. 4. For example, revenue loss estimator 516 may be configured to estimate an amount of potential revenue that will be lost as a result of the battery capacity loss $C_{loss,add}$. In some embodiments, revenue loss estimator 516 converts battery capacity loss $C_{loss,add}$ into lost revenue using the following equation:

$$R_{loss} = (CP_{cap} + MR \cdot CP_{perf}) C_{loss,add} P_{des}$$

where $R_{loss}$ is the lost revenue over the duration of the frequency response period.

Revenue loss estimator 420 may determine a present value of the revenue loss $R_{loss}$ using the following equation:

$$\lambda_{bat} = \left[ \frac{1 - (1 + \frac{i}{n})^{-n}}{\frac{i}{n}} \right] R_{loss}$$

where n is the total number of frequency response periods (e.g., hours) during which the revenue loss occurs and $\Delta_{bat}$ is the present value of the revenue loss during the ith frequency response period. In some embodiments, the revenue loss occurs over ten years (e.g., n=87,600 hours). Revenue loss estimator 420 may provide the present value of the revenue loss $\lambda_{bat}$ to frequency response optimizer 508 for use in the objective function J.

Frequency response optimizer 508 may use the estimated performance score and the estimated battery degradation to define the terms in objective function J. Frequency response optimizer 508 may determine values for frequency response $Res_{FR}$ that optimize objective function J. In various embodiments, frequency response optimizer 508 may use sequential quadratic programming, dynamic programming, or any other optimization technique.

Frequency Response Optimization Processes

Referring now to FIG. 6, a flowchart of a process 600 for determining optimal battery power setpoints in a frequency response optimization system is shown, according to an exemplary embodiment. Process 600 may be performed by one or more components of frequency response optimization system 100, as described with reference to FIGS. 1-5.

Process 600 is shown to include predicting regulation signal statistics, campus power use, and energy market statistics for one or more frequency response periods (step 602). The regulation signal statistics may include a mean and a standard deviation of the regulation signal $Reg_{signal}$. Predicting the campus power use may include predicting the electric power consumption of the campus (e.g., $P_{campus}$) over the duration of the frequency response periods. In some embodiments, predicting campus power use includes predicting statistics of the campus power use (e.g., mean, standard deviation, etc.). Predicting energy market statistics may include predicting energy prices such as electricity rates and demand charges. Predicting energy market statistics may also include predicting frequency response statistics such as clearing capability price $CP_{cap}$, clearing performance price $CP_{perf}$, and mileage ratio MR.

Process 600 is shown to include determining frequency response midpoints that maintain a battery at the same state-of-charge at the beginning and end of each frequency response period (step 604). Step 604 may be performed by constant state-of-charge controller 402. In some embodiments, step 604 includes determining expected values for the regulation signal $Reg_{signal}$, campus power use $P_{campus}$, regulation award $Reg_{award}$, battery power loss $P_{loss}$, and maximum battery power $P_{max}$. The expected value of the regulation award $Reg_{award}$ may be assumed to be the difference between the midpoint b and the power inverter power limit $P_{limit}$ (e.g., $Reg_{award} = P_{limit} - |b|$). The midpoint b which maintains the battery at the same state-of-charge at the beginning and end of each frequency response period can be determined by solving the following equation:

$$\frac{1}{4P_{max}}[E\{P_{campus}^2\} + Reg_{award}^2 E\{Reg_{signal}^2\} -$$

$$2Reg_{award}E\{Reg_{signal}\}E\{P_{campus}\}]\Delta t +$$

$$[Reg_{award}E\{Reg_{signal}\} - E\{P_{campus}\}]\Delta t +$$

$$\frac{b}{2P_{max}}[Reg_{award}E\{Reg_{signal}\} - E\{P_{campus}\}]\Delta t + b\Delta t + \frac{b^2}{4P_{max}}\Delta t = 0$$

which can be solved for midpoint b.

Process 600 is shown to include generating an objective function that estimates value as a function of frequency response revenue, energy costs, and monetized costs of losses in battery capacity (step 606). An exemplary value function which may be generated in step 606 is shown in the following equation:

$$J = \sum_{k=1}^{h} Rev(Reg_{award,k}) + \sum_{k=1}^{h} c_k b_k + \min_{period}(P_{campus,k} + b_k) - \sum_{k=1}^{h} \lambda_{bat,k}$$

where $Rev(Reg_{award,k})$ is the frequency response revenue, $c_k b_k$ is the cost per unit of electricity, the min( ) term is the demand charge, and $\lambda_{bat,k}$ is the monetized cost of battery degradation.

The frequency response revenue may be determined using the following equation:

$$Rev(Reg_{award}) = PS \cdot Reg_{award}(CP_{cap} + MR \cdot CP_{perf})$$

where $Reg_{award}$, $CP_{cap}$, MR, and $CP_{perf}$ are provided as known inputs and PS is the performance score. In some embodiments, the performance score PS is a composite weighting of an accuracy score, a delay score, and a precision score. The performance score PS may be calculated using the performance score model shown in the following equation:

$$PS = \tfrac{1}{3}PS_{acc} + \tfrac{1}{3}PS_{delay} + \tfrac{1}{3}PS_{prec}$$

where $PS_{acc}$ is the accuracy score, $PS_{delay}$ is the delay score, and $PS_{prec}$ is the precision score. In some embodiments, each term in the precision score is assigned an equal weighting (e.g., ⅓). In other embodiments, some terms may be weighted higher than others. Each of the terms in the performance score model may be calculated as previously described with reference to FIG. 4.

The cost of battery degradation may be determined using a battery life model. An exemplary battery life model which may be used to determine battery degradation is shown in the following equation:

$$C_{loss,add} = f_1(T_{cell}) + f_2(SOC) + f_3(DOD) + f_4(PR) + f_5(ER) - C_{loss,nom}$$

where $T_{cell}$ is the cell temperature, SOC is the state-of-charge, DOD is the depth of discharge, PR is the average power ratio $$(\text{e.g., } PR = avg(\frac{P_{avg}}{P_{des}})),$$

and ER is the average effort ratio $$(\text{e.g., } ER = avg(\frac{\Delta P_{bat}}{P_{des}}))$$

of battery 108. The terms in the battery life model may be calculated as described with reference to FIGS. 4-5, using the frequency response $Res_{FR}$ as the optimization variable.

The battery capacity loss $C_{loss,add}$ can be converted into lost revenue using the following equation:

$$R_{loss} = (CP_{cap} + MR \cdot CP_{perf})C_{loss,add}P_{des}$$

where $R_{loss}$ is the lost revenue over the duration of the frequency response period. The present value of the revenue loss $R_{loss}$ can be calculated as follows:

$$\lambda_{bat} = \left[\frac{1 - \left(1 + \frac{i}{n}\right)^{-n}}{\frac{i}{n}}\right]R_{loss}$$

where n is the total number of frequency response periods (e.g., hours) during which the revenue loss occurs and $\lambda_{bat}$ is the present value of the revenue loss during the ith frequency response period. In some embodiments, the revenue loss occurs over ten years (e.g., n=87,600 hours).

Still referring to FIG. 6, process 600 is shown to include performing an optimization to determine battery power setpoints that optimize the objective function based on the midpoints (step 608). Step 608 may be performed by low level controller 314, as described with reference to FIG. 5. Step 608 may include using the objective function to determine the optimal frequency response $Res_{FR}$. The optimal frequency response may be the frequency response which maximizes J. The optimal frequency response $Res_{FR}$ can be used to calculate the desired interconnection power $P^*_{POI}$ using the following equation:

$$P^*_{POI} = Reg_{award} \cdot Res_{FR} + b$$

Step 608 may include subtracting the campus power $P_{campus}$ from the desired interconnection power $P^*_{POI}$ to calculate the optimal battery power setpoints $P_{SP}$, as shown in the following equation:

$$P_{SP} = P^*_{POI} - P_{campus}$$

Process 600 is shown to include using the battery power setpoints to control an amount of power charged or discharged from the battery (step 610). Step 610 may include providing the battery power setpoints to a battery power inverter (e.g., power inverter 106). The power inverter may use the battery power setpoints to an amount of power drawn from the battery or stored in the battery during each of a plurality of time steps. Power drawn from the battery may be used to power the campus or provided to an energy grid.

Referring now to FIG. 7, a flowchart of a process 700 for determining optimal battery power setpoints in a frequency response optimization system is shown, according to an exemplary embodiment. Process 700 may be performed by one or more components of frequency response optimization system 100, as described with reference to FIGS. 1-5.

Process 700 is shown to include predicting regulation signal statistics, campus power use, and energy market statistics for one or more frequency response periods (step 702). The regulation signal statistics may include a mean and a standard deviation of the regulation signal $Reg_{signal}$. Predicting the campus power use may include predicting the electric power consumption of the campus (e.g., $P_{campus}$) over the duration of the frequency response periods. In some embodiments, predicting campus power use includes predicting statistics of the campus power use (e.g., mean, standard deviation, etc.). Predicting energy market statistics may include predicting energy prices such as electricity rates and demand charges. Predicting energy market statistics may also include predicting frequency response statistics such as clearing capability price $CP_{cap}$, clearing performance price $CP_{perf}$, and mileage ratio MR.

Process 700 is shown to include generating an objective function that estimates value as a function of frequency response revenue, energy costs, and monetized costs of losses in battery capacity (step 704). An exemplary value function which may be generated in step 704 is shown in the following equation:

$$J = \sum_{k=1}^{h} Rev(Reg_{award,k}) + \sum_{k=1}^{h} c_k b_k + \min_{period} (P_{campus,k} + b_k) - \sum_{k=1}^{h} \lambda_{bat,k}$$

where $Rev(Reg_{award,k})$ is the frequency response revenue, $c_k b_k$ is the cost per unit of electricity, the min( ) term is the demand charge, and $\lambda_{bat,k}$ is the monetized cost of battery degradation.

The frequency response revenue may be determined using the following equation:

$$Rev(Reg_{award}) = Reg_{award}(CP_{cap} + MR \cdot CP_{perf})$$

where $Reg_{award}$, $CP_{cap}$, MR, and $CP_{perf}$ are provided as known inputs and PS is the performance score.

The cost of battery degradation may be determined using a battery life model. An exemplary battery life model which may be used to determine battery degradation is shown in the following equation:

$$C_{loss,add} = f_1(T_{cell}) + f_2(SOC) + f_3(DOD) + f_4(PR) + f_5(ER) - C_{loss,nom}$$

where $T_{cell}$ is the cell temperature, SOC is the state-of-charge, DOD is the depth of discharge, PR is the average power ratio (e.g., $PR = avg(\frac{P_{avg}}{P_{des}})$), and ER is the average effort ratio (e.g., $ER = avg(\frac{\Delta P_{bat}}{P_{des}})$)

of battery 108. The terms in the battery life model may be calculated as described with reference to FIGS. 4-5, using the midpoint b as the optimization variable.

The battery capacity loss $C_{loss,add}$ can be converted into lost revenue using the following equation:

$$R_{loss} = (CP_{cap} + MR \cdot CP_{perf}) C_{loss,add} P_{des}$$

where $R_{loss}$ is the lost revenue over the duration of the frequency response period. The present value of the revenue loss $R_{loss}$ can be calculated as follows:

$$\lambda_{bat} = \left[ \frac{1 - \left(1 + \frac{i}{n}\right)^{-n}}{\frac{i}{n}} \right] R_{loss}$$

where n is the total number of frequency response periods (e.g., hours) during which the revenue loss occurs and $\lambda_{bat}$ is the present value of the revenue loss during the ith frequency response period. In some embodiments, the revenue loss occurs over ten years (e.g., n=87,600 hours).

Process 700 is shown to include performing a high level optimization to determine frequency response midpoints that optimize the objective function based on the predicted regulation signal statistics (step 706). Step 706 may be performed by variable state-of-charge controller 408. Step 706 may include determining a set of midpoints b that maximize the objective function J. The optimization may be subject to optimization constraints. For example, step 706 may include implementing optimization constraints that keep the state-of-charge of the battery between threshold values (e.g., between 0 and 1) and/or constraints that prevent sum of the midpoint b and the campus power $P_{campus}$ from exceeding the power inverter rating $P_{limit}$, as described with respect to optimization constraints module 414.

In some embodiments, step 706 includes determining expected values for the regulation signal $Reg_{signal}$, campus power use $P_{campus}$, regulation award $Reg_{award}$, battery power loss $P_{loss}$, and maximum battery power $P_{max}$. The expected value of the regulation award $Reg_{award}$ may be assumed to be the difference between the midpoint b and the power inverter power limit $P_{limit}$ (e.g., $Reg_{award} = P_{limit} - |b|$). The midpoint b can be expressed in terms of the change in the state-of-charge of the battery by solving the following equation:

$$\frac{1}{4P_{max}} [E\{P_{campus}^2\} + Reg_{award}^2 +$$
$$E\{Reg_{signal}^2\} - 2Reg_{award} E\{Reg_{signal}\} E\{P_{campus}\}] \Delta t +$$
$$[Reg_{award} E\{Reg_{signal}\} + E\{P_{campus}\}] \Delta t + \Delta SOC \cdot C_{des} +$$
$$\frac{b}{2P_{max}} [Reg_{award} E\{Reg_{signal}\} - E\{P_{campus}\}] \Delta t + b \Delta t + \frac{b^2}{4P_{max}} \Delta t = 0$$

This relationship between midpoint b and the change in the SOC may be used to translate constraints on the SOC of the battery into constraints on midpoint b. The optimization problem can then be solved to determine optimal values for midpoint b.

Still referring to FIG. 7, process 700 is shown to include performing a low level optimization to determine battery power setpoints that optimize the objective function based on the midpoints (step 708). Step 708 may be performed by low level controller 314, as described with reference to FIG. 5. Step 708 may include using the objective function to determine the optimal frequency response $Res_{FR}$. The optimal frequency response may be the frequency response which maximizes J. The optimal frequency response $Res_{FR}$ can be used to calculate the desired interconnection power $P^*_{POI}$ using the following equation:

$$P^*_{POI} = Reg_{award} \cdot Res_{FR} + b$$

Step 708 may include subtracting the campus power $P_{campus}$ from the desired interconnection power $P^*_{POI}$ to calculate the optimal battery power setpoints $P_{SP}$, as shown in the following equation:

$$P_{SP} = P^*_{POI} - P_{campus}$$

Process 700 is shown to include using the battery power setpoints to control an amount of power charged or discharged from the battery (step 710). Step 710 may include providing the battery power setpoints to a battery power inverter (e.g., power inverter 106). The power inverter may use the battery power setpoints to an amount of power drawn from the battery or stored in the battery during each of a plurality of time steps. Power drawn from the battery may be used to power the campus or provided to an energy grid.

Photovoltaic Energy System with Frequency Regulation and Ramp Rate Control

Figure 8A:
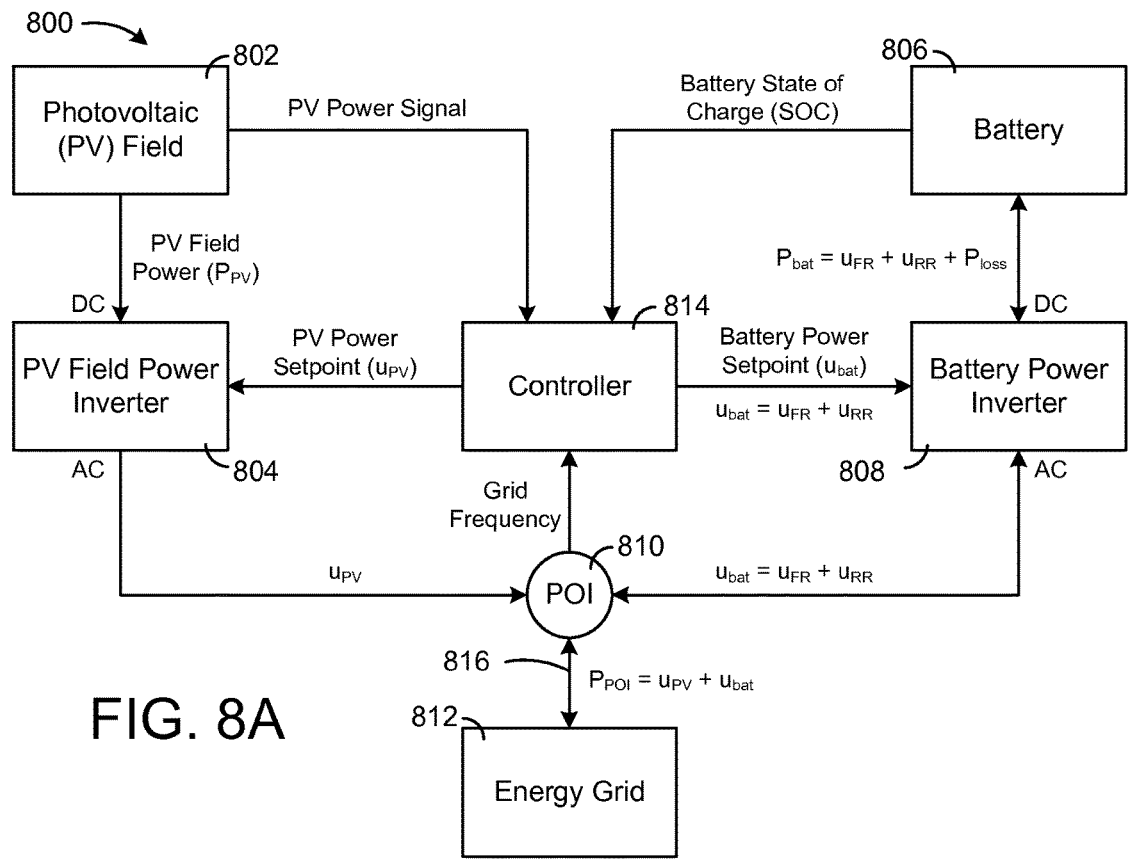
FIG. 8A is a block diagram of an electrical energy storage system configured to simultaneously perform both ramp rate control and frequency regulation while maintaining the state-of-charge of the battery within a desired range, according to an exemplary embodiment.
Figure 8B:
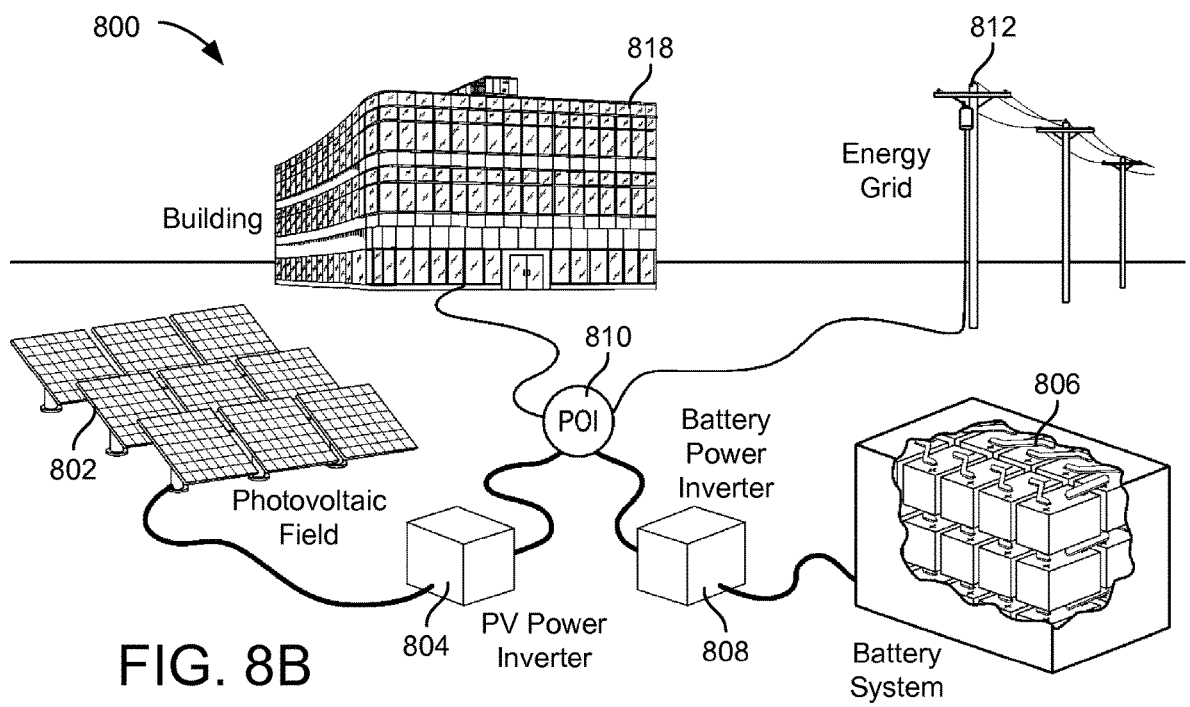
FIG. 8B is a drawing of the electrical energy storage system of FIG. 8A, according to an exemplary embodiment.

Referring now to FIGS. 8A-8B, a photovoltaic energy system 800 that uses battery storage to simultaneously perform both ramp rate control and frequency regulation is shown, according to an exemplary embodiment. As previously described, frequency regulation is the process of maintaining the stability of the grid frequency (e.g., 60 Hz in the United States). The grid frequency may remain balanced at 60 Hz as long as there is a balance between the demand from the energy grid and the supply to the energy grid. An increase in demand yields a decrease in grid frequency, whereas an increase in supply yields an increase in grid frequency. During a fluctuation of the grid frequency, system 800 may offset the fluctuation by either drawing more energy from the energy grid (e.g., if the grid frequency is too high) or by providing energy to the energy grid (e.g., if the grid frequency is too low).

Ramp rate control is the process of offsetting PV ramp rates (i.e., increases or decreases in PV power output) that fall outside of compliance limits determined by the electric power authority overseeing the energy grid. Ramp rate control typically requires the use of an energy source that allows for offsetting ramp rates by either supplying additional power to the grid or consuming more power from the grid. Advantageously, system 800 may use battery storage in combination with photovoltaic power to perform frequency regulation while simultaneously complying with ramp rate requirements and maintaining the state-of-charge of the battery storage within a predetermined desirable range. System 800 may use the battery life model described with reference to FIGS. 1-7 to make decisions regarding battery usage.

System 800 is shown to include a photovoltaic (PV) field 802, a PV field power inverter 804, a battery 806, a battery power inverter 808, a point of interconnection (POI) 810, and an energy grid 812. In some embodiments, system 800 also includes a controller 814 (shown in FIG. 8A) and/or a building 818 (shown in FIG. 8B). In brief overview, PV field 802 may convert solar energy into a DC power output $P_{PV}$ and provide the DC power output $P_{PV}$ to PV field power inverter 804. PV field power inverter 804 may convert the DC power output $P_{PV}$ into an AC power output $u_{PV}$ and provide the AC power output $u_{PV}$ to POI 810. PV field power inverter 804 can be operated by controller 814 to control the power output of PV field 802. Similarly, battery power inverter 808 can be operated by controller 814 to control the power input and/or power output of battery 806. The power outputs of PV field power inverter 804 and battery power inverter 808 combine at POI 810 to form the power provided to energy grid 812. In some embodiments, building 818 is also connected to POI 810. Building 818 can consume a portion of the combined power at POI 810 to satisfy the energy requirements of building 818.

PV field power inverter 804 can include any of a variety of circuit components (e.g., resistors, capacitors, indictors, transformers, transistors, switches, diodes, etc.) configured to perform the functions described herein. In some embodiments DC power from PV field 802 is connected to a transformer of PV field power inverter 804 through a center tap of a primary winding. A switch can be rapidly switched back and forth to allow current to flow back to PV field 802 following two alternate paths through one end of the primary winding and then the other. The alternation of the direction of current in the primary winding of the transformer can produce alternating current (AC) in a secondary circuit.

In some embodiments, PV field power inverter 804 uses an electromechanical switching device to convert DC power from PV field 802 into AC power. The electromechanical switching device can include two stationary contacts and a spring supported moving contact. The spring can hold the movable contact against one of the stationary contacts, whereas an electromagnet can pull the movable contact to the opposite stationary contact. Electric current in the electromagnet can be interrupted by the action of the switch so that the switch continually switches rapidly back and forth. In some embodiments, PV field power inverter 804 uses transistors, thyristors (SCRs), and/or various other types of semiconductor switches to convert DC power from PV field 802 into AC power. SCRs provide large power handling capability in a semiconductor device and can readily be controlled over a variable firing range.

In some embodiments, PV field power inverter 804 produces a square voltage waveform (e.g., when not coupled to an output transformer). In other embodiments, PV field power inverter 804 produces a sinusoidal waveform that matches the sinusoidal frequency and voltage of energy grid 812. For example, PV field power inverter 804 can use Fourier analysis to produce periodic waveforms as the sum of an infinite series of sine waves. The sine wave that has the same frequency as the original waveform is called the fundamental component. The other sine waves, called harmonics, that are included in the series have frequencies that are integral multiples of the fundamental frequency.

In some embodiments, PV field power inverter 804 uses inductors and/or capacitors to filter the output voltage waveform. If PV field power inverter 804 includes a transformer, filtering can be applied to the primary or the secondary side of the transformer or to both sides. Low-pass filters can be applied to allow the fundamental component of the waveform to pass to the output while limiting the passage of the harmonic components. If PV field power inverter 804 is designed to provide power at a fixed frequency, a resonant filter can be used. If PV field power inverter 804 is an adjustable frequency inverter, the filter can be tuned to a frequency that is above the maximum fundamental frequency. In some embodiments, PV field power inverter 804 includes feedback rectifiers or antiparallel diodes connected across semiconductor switches to provide a path for a peak inductive load current when the switch is turned off. The antiparallel diodes can be similar to freewheeling diodes commonly used in AC/DC converter circuits.

Battery power inverter 808 may be configured to draw a DC power $P_{bat}$ from battery 806, convert the DC power $P_{bat}$ into an AC power $u_{bat}$, and provide the AC power $u_{bat}$ to POI 810. Battery power inverter 808 may also be configured to draw the AC power $u_{bat}$ from POI 810, convert the AC power $u_{bat}$ into a DC battery power $P_{bat}$, and store the DC battery power $P_{bat}$ in battery 806. As such, battery power inverter 808 can function as both a power inverter and a rectifier to convert between DC and AC in either direction. The DC battery power $P_{bat}$ may be positive if battery 806 is providing power to battery power inverter 808 (i.e., if battery 806 is discharging) or negative if battery 806 is receiving power from battery power inverter 808 (i.e., if battery 806 is charging). Similarly, the AC battery power $u_{bat}$ may be positive if battery power inverter 808 is providing power to POI 810 or negative if battery power inverter 808 is receiving power from POI 810.

Like PV field power inverter 804, battery power inverter 808 can include any of a variety of circuit components (e.g., resistors, capacitors, indictors, transformers, transistors, switches, diodes, etc.) configured to perform the functions described herein. Battery power inverter 808 can include many of the same components as PV field power inverter 804 and can operate using similar principles. For example, battery power inverter 808 can use electromechanical switching devices, transistors, thyristors (SCRs), and/or various other types of semiconductor switches to convert between AC and DC power. Battery power inverter 808 can operate the circuit components to adjust the amount of power stored in battery 806 and/or discharged from battery 806 (i.e., power throughput) based on a power control signal or power setpoint from controller 814.

The AC battery power $u_{bat}$ is shown to include an amount of power used for frequency regulation (i.e., $u_{FR}$) and an amount of power used for ramp rate control (i.e., $u_{RR}$) which together form the AC battery power (i.e., $u_{bat}=u_{FR}+u_{RR}$). The DC battery power $P_{bat}$ is shown to include both $u_{FR}$ and $u_{RR}$ as well as an additional term $P_{loss}$ representing power losses in battery 806 and/or battery power inverter 808 (i.e., $P_{bat}=u_{FR}+u_{RR}+P_{loss}$). The PV field power $u_{PV}$ and the battery power $u_{bat}$ combine at POI 810 to form $P_{POI}$ (i.e., $P_{POI}=u_{PV}+u_{bat}$), which represents the amount of power provided to energy grid 812. $P_{POI}$, may be positive if POI 810 is providing power to energy grid 812 or negative if POI 810 is receiving power from energy grid 812.

Still referring to FIGS. 8A-8B, system 800 is shown to include a controller 814. Controller 814 may be configured to generate a PV power setpoint $u_{PV}$ for PV field power inverter 804 and a battery power setpoint $u_{bat}$ for battery power inverter 808. Throughout this disclosure, the variable $u_{PV}$ is used to refer to both the PV power setpoint generated by controller 814 and the AC power output of PV field power inverter 804 since both quantities have the same value. Similarly, the variable $u_{bat}$ is used to refer to both the battery power setpoint generated by controller 814 and the AC power output/input of battery power inverter 808 since both quantities have the same value.

PV field power inverter 804 uses the PV power setpoint $u_{PV}$ to control an amount of the PV field power $P_{PV}$ to provide to POI 810. The magnitude of $u_{PV}$ may be the same as the magnitude of $P_{pV}$ or less than the magnitude of $P_{PV}$. For example, $u_{PV}$ may be the same as $P_{PV}$ if controller 814 determines that PV field power inverter 804 is to provide all of the photovoltaic power $P_{PV}$ to POI 810. However, $u_{PV}$ may be less than $P_{PV}$ if controller 814 determines that PV field power inverter 804 is to provide less than all of the photovoltaic power $P_{PV}$ to POI 810. For example, controller 814 may determine that it is desirable for PV field power inverter 804 to provide less than all of the photovoltaic power $P_{PV}$ to POI 810 to prevent the ramp rate from being exceeded and/or to prevent the power at POI 810 from exceeding a power limit.

Battery power inverter 808 uses the battery power setpoint $u_{bat}$ to control an amount of power charged or discharged by battery 806. The battery power setpoint $u_{bat}$ may be positive if controller 814 determines that battery power inverter 808 is to draw power from battery 806 or negative if controller 814 determines that battery power inverter 808 is to store power in battery 806. The magnitude of $u_{bat}$ controls the rate at which energy is charged or discharged by battery 806.

Controller 814 may generate $u_{PV}$ and $u_{bat}$ based on a variety of different variables including, for example, a power signal from PV field 802 (e.g., current and previous values for $P_{PV}$), the current state-of-charge (SOC) of battery 806, a maximum battery power limit, a maximum power limit at POI 810, the ramp rate limit, the grid frequency of energy grid 812, and/or other variables that can be used by controller 814 to perform ramp rate control and/or frequency regulation. Advantageously, controller 814 generates values for $u_{PV}$ and $u_{bat}$ that maintain the ramp rate of the PV power within the ramp rate compliance limit while participating in the regulation of grid frequency and maintaining the SOC of battery 806 within a predetermined desirable range.

In some embodiments, controller 814 uses a battery life model to determine optimal battery power setpoints $u_{bat}$. For example, controller 814 may include a battery degradation estimator (e.g., battery degradation estimator 418 or 514) configured to estimate an amount of battery degradation that will result from the battery power setpoints $u_{bat}$. Controller 814 may use the battery life model produced by battery life model generator 428 to estimate a decrease in battery capacity that will result from a planned or actual set of control outputs (e.g., a frequency regulation control signal, a ramp rate control signal, a battery power signal, etc.). Controller 814 may include a revenue loss estimator (e.g., revenue loss estimator 420 or 516) configured to estimate an amount of potential revenue that will be lost as a result of the battery degradation. Controller 814 may adjust the frequency regulation setpoints $u_{FR}$, the ramp rate control setpoints $u_{RR}$, and/or the battery power setpoints $u_{bat}$ in order to optimize an objective function that considers frequency response revenue, ramp rate compliance penalties, and the monetized cost of battery degradation, as described with reference to FIGS. 4-5.

Reactive Ramp Rate Control

Controller 814 may be configured to control a ramp rate of the power output 816 provided to energy grid 812. Ramp rate may be defined as the time rate of change of power output 816. Power output 816 may vary depending on the magnitude of the DC output provided by PV field 802. For example, if a cloud passes over PV field 802, power output 816 may rapidly and temporarily drop while PV field 802 is within the cloud's shadow. Controller 814 may be configured to calculate the ramp rate by sampling power output 816 and determining a change in power output 816 over time. For example, controller 814 may calculate the ramp rate as the derivative or slope of power output 816 as a function of time, as shown in the following equations:

$$\text{Ramp Rate} = \frac{dP}{dt} \text{ or Ramp Rate} = \frac{\Delta P}{\Delta t}$$

where P represents power output 816 and t represents time.

In some embodiments, controller 814 controls the ramp rate to comply with regulatory requirements or contractual requirements imposed by energy grid 812. For example, system 800 may be required to maintain the ramp rate within a predetermined range in order to deliver power to energy grid 812. In some embodiments, system 800 is required to maintain the absolute value of the ramp rate at less than a threshold value (e.g., less than 10% of the rated power capacity per minute). In other words, system 800 may be required to prevent power output 816 from increasing or decreasing too rapidly. If this requirement is not met, system 800 may be deemed to be in non-compliance and its capacity may be de-rated, which directly impacts the revenue generation potential of system 800.

Controller 814 may use battery 806 to perform ramp rate control. For example, controller 814 may use energy from battery 806 to smooth a sudden drop in power output 816 so that the absolute value of the ramp rate is less than a threshold value. As previously mentioned, a sudden drop in power output 816 may occur when a solar intensity disturbance occurs, such as a passing cloud blocking the sunlight to PV field 802. Controller 814 may use the energy from battery 806 to make up the difference between the power provided by PV field 802 (which has suddenly dropped) and the minimum required power output 816 to maintain the required ramp rate. The energy from battery 806 allows controller 814 to gradually decrease power output 816 so that the absolute value of the ramp rate does not exceed the threshold value.

Once the cloud has passed, the power output from PV field 802 may suddenly increase as the solar intensity returns to its previous value. Controller 814 may perform ramp rate control by gradually ramping up power output 816. Ramping up power output 816 may not require energy from battery 806. For example, power inverter 804 may use only a portion of the energy generated by PV field 802 (which has suddenly increased) to generate power output 816 (i.e., limiting the power output) so that the ramp rate of power output 816 does not exceed the threshold value. The remainder of the energy generated by PV field 802 (i.e., the excess energy) may be stored in battery 806 and/or dissipated. Limiting the energy generated by PV field 802 may include diverting or dissipating a portion of the energy generated by PV field 802 (e.g., using variable resistors or other circuit elements) so that only a portion of the energy generated by PV field 802 is provided to energy grid 812. This allows power inverter 804 to ramp up power output 816 gradually without exceeding the ramp rate. The excess energy may be stored in battery 806, used to power other components of system 800, or dissipated.

Figure 10:
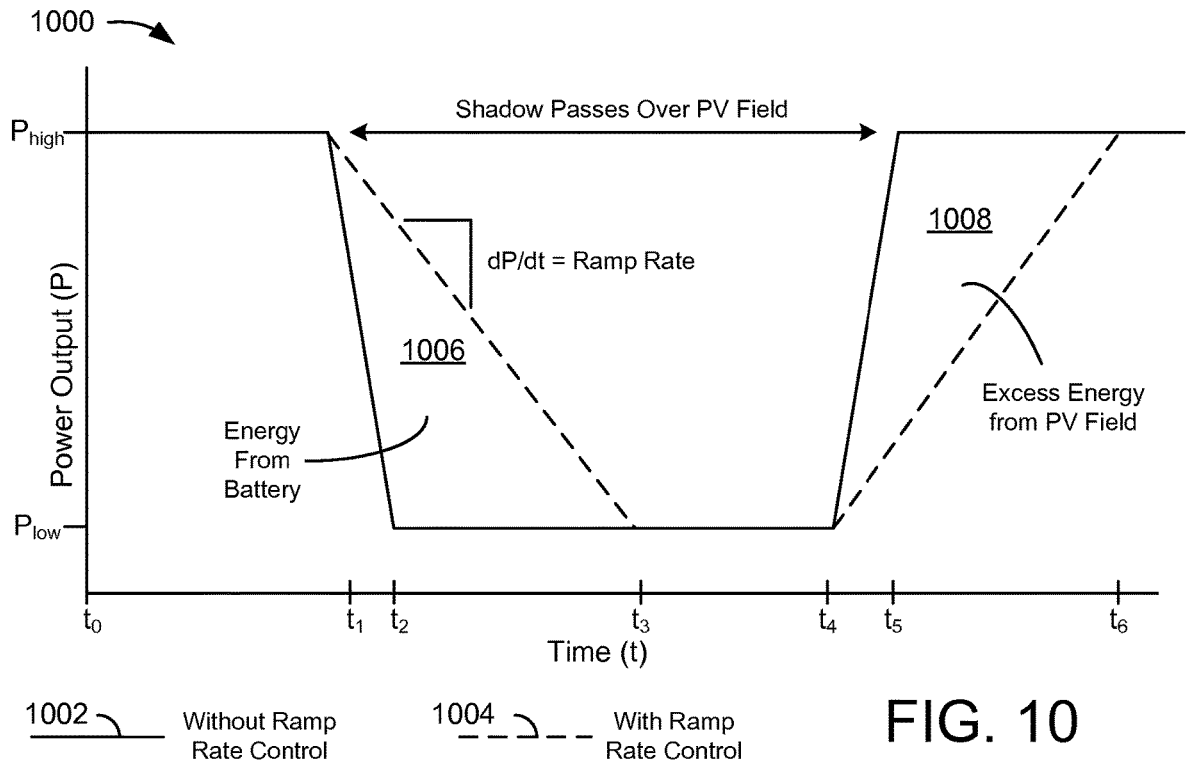
FIG. 10 is a graph illustrating a reactive ramp rate control technique which can be used by the electrical energy storage system of FIGS. 8A-8B, according to an exemplary embodiment.

Referring now to FIG. 10, a graph 1000 illustrating a reactive ramp rate control technique which can be used by system 800 is shown, according to an exemplary embodiment. Graph 1000 plots the power output P provided to energy grid 812 as a function of time t. The solid line 1002 illustrates power output P without any ramp rate control, whereas the broken line 1004 illustrates power output P with ramp rate control.

Between times $t_0$ and $t_1$, power output P is at a high value $P_{high}$. At time $t_1$, a cloud begins to cast its shadow on PV field 802, causing the power output of PV field 802 to suddenly decrease, until PV field 802 is completely in shadow at time $t_2$. Without any ramp rate control, the sudden drop in power output from PV field 802 causes the power output P to rapidly drop to a low value $P_{low}$ at time $t_2$. However, with ramp rate control, system 800 uses energy from battery 806 to gradually decrease power output P to $P_{low}$ at time $t_3$. Triangular region 1006 represents the energy from battery 806 used to gradually decrease power output P.

Between times $t_2$ and $t_4$, PV field 802 is completely in shadow. At time $t_4$, the shadow cast by the cloud begins to move off PV field 802, causing the power output of PV field 802 to suddenly increase, until PV field 802 is entirely in sunlight at time $t_5$. Without any ramp rate control, the sudden increase in power output from PV field 802 causes the power output P to rapidly increase to the high value $P_{high}$ at time $t_5$. However, with ramp rate control, power inverter 804 limits the energy from PV field 802 to gradually increase power output P to $P_{high}$ at time $t_6$. Triangular region 1008 represents the energy generated by PV field 802 in excess of the ramp rate limit. The excess energy may be stored in battery 806 and/or dissipated in order to gradually increase power output P at a rate no greater than the maximum allowable ramp rate.

Notably, both triangular regions 1006 and 1008 begin after a change in the power output of PV field 802 occurs. As such, both the decreasing ramp rate control and the increasing ramp rate control provided by system 800 are reactionary processes triggered by a detected change in the power output. In some embodiments, a feedback control technique is used to perform ramp rate control in system 800. For example, controller 814 may monitor power output 816 and determine the absolute value of the time rate of change of power output 816 (e.g., dP/dt or ΔP/Δt). Controller 814 may initiate ramp rate control when the absolute value of the time rate of change of power output 816 exceeds a threshold value.

Preemptive Ramp Rate Control

In some embodiments, controller 814 is configured to predict when solar intensity disturbances will occur and may cause power inverter 804 to ramp down the power output 816 provided to energy grid 812 preemptively. Instead of reacting to solar intensity disturbances after they occur, controller 814 can actively predict solar intensity disturbances and preemptively ramp down power output 816 before the disturbances affect PV field 802. Advantageously, this allows system controller 814 to perform both ramp down control and ramp up control by using only a portion of the energy provided by PV field 802 to generate power output 816 while the power output of PV field 802 is still high, rather than relying on energy from a battery. The remainder of the energy generated by PV field 802 (i.e., the excess energy) may be stored in battery 806 and/or dissipated.

In some embodiments, controller 814 predicts solar intensity disturbances using input from one or more cloud detectors. The cloud detectors may include an array of solar intensity sensors. The solar intensity sensors may be positioned outside PV field 802 or within PV field 802. Each solar intensity sensor may have a known location. In some embodiments, the locations of the solar intensity sensors are based on the geometry and orientation of PV field 802. For example, if PV field 802 is rectangular, more sensors may be placed along its long side than along its short side. A cloud formation moving perpendicular to the long side may cover more area of PV field 802 per unit time than a cloud formation moving perpendicular to the short side. Therefore, it may be desirable to include more sensors along the long side to more precisely detect cloud movement perpendicular to the long side. As another example, more sensors may be placed along the west side of PV field 802 than along the east side of PV field 802 since cloud movement from west to east is more common than cloud movement from east to west. The placement of sensors may be selected to detect approaching cloud formations without requiring unnecessary or redundant sensors.

The solar intensity sensors may be configured to measure solar intensity at various locations outside PV field 802. When the solar intensity measured by a particular solar intensity sensor drops below a threshold value, controller 814 may determine that a cloud is currently casting a shadow on the solar intensity sensor. Controller 814 may use input from multiple solar intensity sensors to determine various attributes of clouds approaching PV field 802 and/or the shadows produced by such clouds. For example, if a shadow is cast upon two or more of the solar intensity sensors sequentially, controller 814 may use the known positions of the solar intensity sensors and the time interval between each solar intensity sensor detecting the shadow to determine how fast the cloud/shadow is moving. If two or more of the solar intensity sensors are within the shadow simultaneously, controller 814 may use the known positions of the solar intensity sensors to determine a position, size, and/or shape of the cloud/shadow.

Although the cloud detectors are described primarily as solar intensity sensors, it is contemplated that the cloud detectors may include any type of device configured to detect the presence of clouds or shadows cast by clouds. For example, the cloud detectors may include one or more cameras that capture visual images of cloud movement. The cameras may be upward-oriented cameras located below the clouds (e.g., attached to a structure on the Earth) or downward-oriented cameras located above the clouds (e.g., satellite cameras). Images from the cameras may be used to determine cloud size, position, velocity, and/or other cloud attributes. In some embodiments, the cloud detectors include radar or other meteorological devices configured to detect the presence of clouds, cloud density, cloud velocity, and/or other cloud attributes. In some embodiments, controller 814 receives data from a weather service that indicates various cloud attributes.

Advantageously, controller 814 may use the attributes of the clouds/shadows to determine when a solar intensity disturbance (e.g., a shadow) is approaching PV field 802. For example, controller 814 may use the attributes of the clouds/shadows to determine whether any of the clouds are expected to cast a shadow upon PV field 802. If a cloud is expected to cast a shadow upon PV field 802, controller 814 may use the size, position, and/or velocity of the cloud/shadow to determine a portion of PV field 802 that will be affected. The affected portion of PV field 802 may include some or all of PV field 802. Controller 814 may use the attributes of the clouds/shadows to quantify a magnitude of the expected solar intensity disturbance (e.g., an expected decrease in power output from PV field 802) and to determine a time at which the disturbance is expected to occur (e.g., a start time, an end time, a duration, etc.).

In some embodiments, controller 814 predicts a magnitude of the disturbance for each of a plurality of time steps. Controller 814 may use the predicted magnitudes of the disturbance at each of the time steps to generate a predicted disturbance profile. The predicted disturbance profile may indicate how fast power output 816 is expected to change as a result of the disturbance. Controller 814 may compare the expected rate of change to a ramp rate threshold to determine whether ramp rate control is required. For example, if power output 816 is predicted to decrease at a rate in excess of the maximum compliant ramp rate, controller 814 may preemptively implement ramp rate control to gradually decrease power output 816.

In some embodiments, controller 814 identifies the minimum expected value of power output 816 and determines when the predicted power output is expected to reach the minimum value. Controller 814 may subtract the minimum expected power output 816 from the current power output 816 to determine an amount by which power output 816 is expected to decrease.

Controller 814 may apply the maximum allowable ramp rate to the amount by which power output 816 is expected to decrease to determine a minimum time required to ramp down power output 816 in order to comply with the maximum allowable ramp rate. For example, controller 814 may divide the amount by which power output 816 is expected to decrease (e.g., measured in units of power) by the maximum allowable ramp rate (e.g., measured in units of power per unit time) to identify the minimum time required to ramp down power output 816. Controller 814 may subtract the minimum required time from the time at which the predicted power output is expected to reach the minimum value to determine when to start preemptively ramping down power output 816.

Advantageously, controller 814 may preemptively act upon predicted disturbances by causing power inverter 804 to ramp down power output 816 before the disturbances affect PV field 802. This allows power inverter 804 to ramp down power output 816 by using only a portion of the energy generated by PV field 802 to generate power output 816 (i.e., performing the ramp down while the power output is still high), rather than requiring additional energy from a battery (i.e., performing the ramp down after the power output has decreased). The remainder of the energy generated by PV field 802 (i.e., the excess energy) may be stored in battery 806 and/or dissipated.

Figure 11:
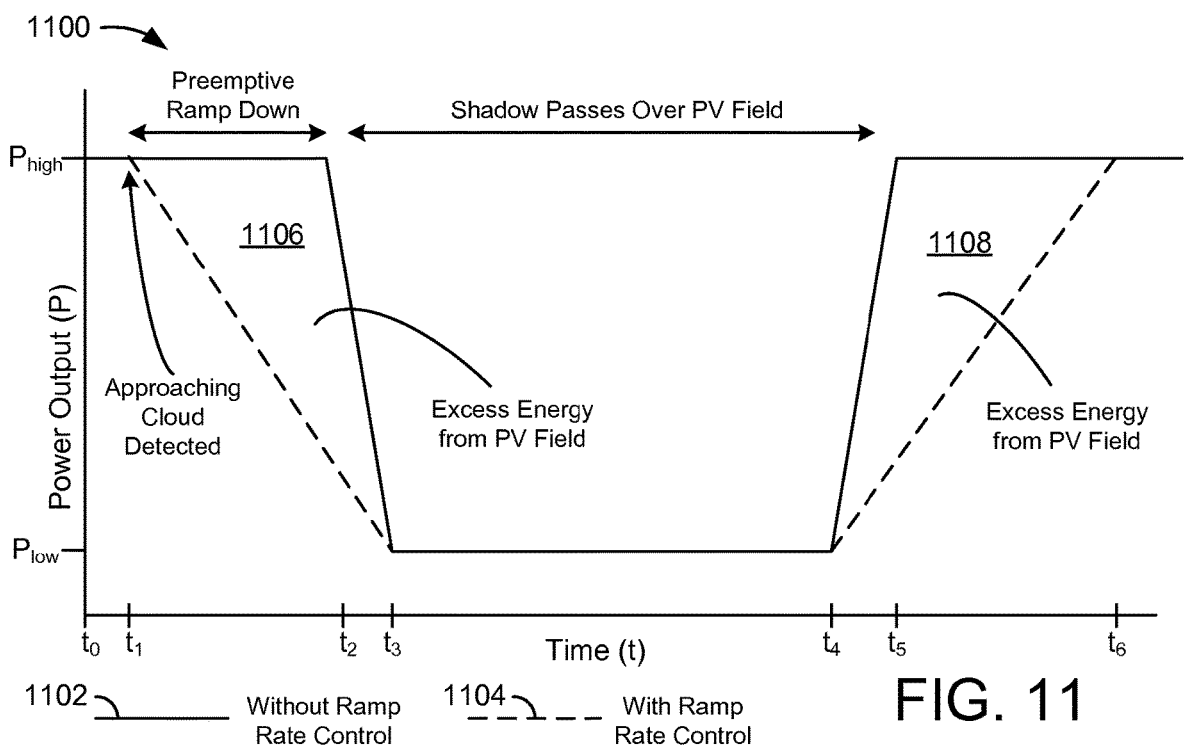
FIG. 11 is a graph illustrating a preemptive ramp rate control technique which can be used by the electrical energy storage system of FIGS. 8A-8B, according to an exemplary embodiment.

Referring now to FIG. 11, a graph 1100 illustrating a preemptive ramp rate control technique which can be used by controller 814 is shown, according to an exemplary embodiment. Graph 1100 plots the power output P provided to energy grid 812 as a function of time t. The solid line 1102 illustrates power output P without any ramp rate control, whereas the broken line 1104 illustrates power output P with preemptive ramp rate control.

Between times $t_0$ and $t_2$, power output P is at a high value $P_{high}$. At time $t_2$, a cloud begins to cast its shadow on PV field 802, causing the power output of PV field 802 to suddenly decrease, until PV field 802 is completely in shadow at time $t_3$. Without any ramp rate control, the sudden drop in power output from PV field 802 causes the power output P to rapidly drop from $P_{high}$ to a low value $P_{low}$ between times $t_2$ and $t_3$. However, with preemptive ramp rate control, controller 814 preemptively causes power inverter 804 to begin ramping down power output P at time $t_1$, prior to the cloud casting a shadow on PV field 802. The preemptive ramp down occurs between times $t_1$ and $t_3$, resulting in a ramp rate that is relatively more gradual. Triangular region 1106 represents the energy generated by PV field 802 in excess of the ramp rate limit. The excess energy may be limited by power inverter 804 and/or stored in battery 806 to gradually decrease power output P at a rate no greater than the ramp rate limit.

Between times $t_3$ and $t_4$, PV field 802 is completely in shadow. At time $t_4$, the shadow cast by the cloud begins to move off PV field 802, causing the power output of PV field 802 to suddenly increase, until PV field 802 is entirely in sunlight at time $t_5$. Without any ramp rate control, the sudden increase in power output from PV field 802 causes the power output P to rapidly increase to the high value $P_{high}$ at time $t_5$. However, with ramp rate control, power inverter 804 uses only a portion of the energy from PV field 802 to gradually increase power output P to $P_{high}$ at time t6. Triangular region 1108 represents the energy generated by PV field 802 in excess of the ramp rate limit. The excess energy may be limited by power inverter 804 and/or stored in battery 806 to gradually increase power output P at a rate no greater than the ramp rate limit.

Notably, a significant portion of triangular region 1106 occurs between times $t_1$ and $t_2$, before the disturbance affects PV field 802. As such, the decreasing ramp rate control provided by system 800 is a preemptive process triggered by detecting an approaching cloud, prior to the cloud casting a shadow upon PV field 802. In some embodiments, controller 814 uses a predictive control technique (e.g., feedforward control, model predictive control, etc.) to perform ramp down control in system 800. For example, controller 814 may actively monitor the positions, sizes, velocities, and/or other attributes of clouds/shadows that could potentially cause a solar intensity disturbance affecting PV field 802. When an approaching cloud is detected at time $t_1$, controller 814 may preemptively cause power inverter 804 to begin ramping down power output 816. This allows power inverter 804 to ramp down power output 816 by limiting the energy generated by PV field 802 while the power output is still high, rather than requiring additional energy from a battery to perform the ramp down once the power output has dropped.

Process for Generating and Using a Battery Life Model

Figure 9:
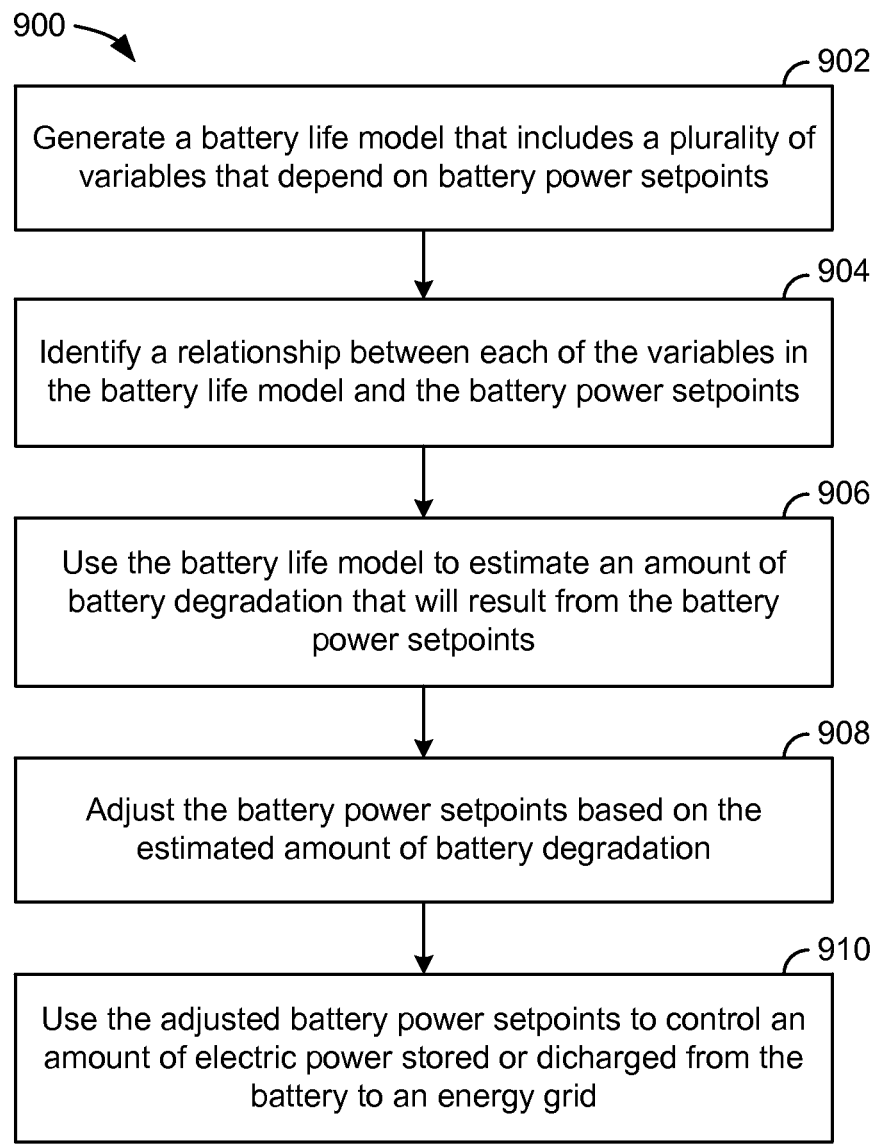
FIG. 9 is a flowchart of a process for generating and using a battery life model to control battery power setpoints, according to an exemplary embodiment.

Referring now to FIG. 9, a flowchart of a process 900 for generating and using a battery life model is shown, according to an exemplary embodiment. Process 900 may be performed by one or more components of frequency response optimization system 100 (e.g., controller 112) and/or photovoltaic energy system 800 (e.g., controller 814), as described with reference to FIGS. 1-8B.

Process 900 is shown to include generating a battery life model that includes a plurality of variables that depend on battery power setpoints (step 902). The battery life model may define a loss in battery capacity $C_{loss,add}$ as a sum of multiple piecewise linear functions, as shown in the following equation:

$$C_{loss,add} = f_1(T_{cell}) + f_2(SOC) + f_3(DOD) + f_4(PR) + f_5(ER) - C_{loss,nom}$$

where $T_{cell}$ is the cell temperature, SOC is the state-of-charge, DOD is the depth of discharge, PR is the average power ratio $$(\text{e.g., } PR = avg(\frac{P_{avg}}{P_{des}})),$$

and ER is the average effort ratio $$(\text{e.g., } ER = avg(\frac{\Delta P_{bat}}{P_{des}}))$$

of the battery.

Process 900 is shown to include identifying a relationship between each of the variables in the battery life model and the battery power setpoints (step 904). One or more of the variables in the battery life model (e.g., $T_{cell}$, SOC, DOD, PR, and ER) may a function of variables that are known and/or manipulated by a controller responsible for generating the battery power setpoints. Advantageously, this allows the controller to calculate values for each of the variables in the battery life model based on known or controlled values. For example, the cell temperature $T_{cell}$ may be measured using a temperature sensor. The battery state-of-charge SOC may represent the state-of-charge of the battery at the end of the frequency response period and can be measured or estimated based on the control decisions (e.g., charge rates, discharge rates, etc.) made by the controller.

The average power ratio PR may be defined as the ratio of the average power output of the battery (i.e., $P_{avg}$) to the design power $$P_{des}(\text{e.g., } PR = \frac{P_{avg}}{P_{des}}).$$

The average power output of the battery can be defined using the following equation:

$$P_{avg} = E\{|Reg_{award}Reg_{signal} + b - P_{loss} - P_{campus}|\}$$

where the expression $(Reg_{award}Reg_{signal} + b - P_{loss} - P_{campus})$ represents the battery power $P_{bat}$. The expected value of $P_{avg}$ is given by:

$$P_{avg} = \sigma_{bat}\sqrt{\frac{2}{\pi}} \exp\left(\frac{-\mu_{bat}^2}{2\sigma_{bat}^2}\right) + \text{erf}\left(\frac{-\mu_{bat}}{\sqrt{2\sigma_{bat}^2}}\right)$$

where $\mu_{bat}$ and $\sigma_{bat}^2$ are the mean and variance of the battery power $P_{bat}$. The variables $\mu_{bat}$ and $\sigma_{bat}^2$ may be defined as follows:

$$\mu_{bat} = Reg_{award}E\{Reg_{signal}\} + b - E\{P_{loss}\} - E\{P_{campus}\}$$

$$\sigma_{bat}^2 = Reg_{award}^2\sigma_{FR}^2 + \sigma_{campus}^2$$

where $\sigma_{FR}^2$ is the variance of $Reg_{signal}$ and the contribution of the battery power loss to the variance $\sigma_{bat}^2$ is neglected.

The average effort ratio ER may be defined as the ratio of the average change in battery power $\Delta P_{avg}$ to the design power $$P_{des}(\text{i.e., } ER = \frac{\Delta P_{avg}}{P_{des}}).$$

The average change in battery power can be defined using the following equation:

$$\Delta P_{avg} = E\{P_{bat,k} - P_{bat,k-1}\}$$

$$\Delta P_{avg} = E\{|Reg_{award}(Reg_{signal,k} - Reg_{signal,k-1}) - (P_{loss,k} - P_{loss,k-1}) - (P_{campus,k} - P_{campus,k-1})|\}$$

To make this calculation more tractable, the contribution due to the battery power loss can be neglected. Additionally, the campus power $P_{campus}$ and the regulation signal $Reg_{signal}$ can be assumed to be uncorrelated, but autocorrelated with first order autocorrelation parameters of $\alpha_{campus}$ and $\alpha$, respectively. The argument inside the absolute value in the equation for $\Delta P_{avg}$ has a mean of zero and a variance given by:

$$\sigma_{diff}^2 = E\{[Reg_{award}(Reg_{signal,k} - Reg_{signal,k-1}) - (P_{campus,k} - P_{campus,k-1})]^2\}$$

$$= E\{Reg_{award}^2(Reg_{signal,k} - Reg_{signal,k-1})^2 - (P_{campus,k} - P_{campus,k-1})^2\}$$

$$= 2Reg_{award}^2(1-\alpha)\sigma_{FR}^2 + 2(1-\alpha_{campus})\sigma_{campus}^2$$

The depth of discharge DOD may be defined as the maximum state-of-charge minus the minimum state-of-charge of the battery over the frequency response period, as shown in the following equation:

$$DOD = SOC_{max} - SOC_{min}$$

The SOC of the battery can be viewed as a constant slope with a zero mean random walk added to it, as previously described. An uncorrelated normal random walk with a driving signal that has zero mean has an expected range given by:

$$E\{\max - \min\} = 2\sigma \sqrt{\frac{2N}{\pi}}$$

where $E\{\max-\min\}$ represents the depth of discharge DOD and can be adjusted for the autocorrelation of the driving signal as follows:

$$E\{\max - \min\} = 2\sigma_{bat}\sqrt{\frac{1+\alpha_{bat}}{1-\alpha_{bat}}}\sqrt{\frac{2N}{\pi}}$$

$$\sigma_{bat}^2 = Reg_{award}^2 \sigma_{FR}^2 + \sigma_{campus}^2$$

$$\alpha_{bat} = \frac{Reg_{award}^2 \alpha \sigma_{FR}^2 + \alpha_{campus}\sigma_{campus}^2}{Reg_{award}^2 \sigma_{FR}^2 + \sigma_{campus}^2}$$

If the SOC of the battery is expected to change (i.e., is not zero mean), the following equation may be used to define the depth of discharge DOD:

$$E\{\max - \min\} = \begin{cases} R_0 + c \cdot \Delta SOC \cdot \exp\left\{-\alpha \frac{R_0 - \Delta SOC}{\sigma_{bat}}\right\} & \Delta SOC < R_0 \\ \Delta SOC + c \cdot R_0 \cdot \exp\left\{-\alpha \frac{\Delta SOC - R_0}{\sigma_{bat}}\right\} & \Delta SOC > R_0 \end{cases}$$

where $R_0$ is the expected range with zero expected change in the state-of-charge. Advantageously, the previous equations can be used to define each of the variables in the battery life model (e.g., $T_{cell}$, SOC, DOD, PR, and ER) as a function of variables that are known to the controller and/or variables that can be manipulated by the controller (e.g., battery power setpoint, frequency response control signals, ramp rate control signals, etc.).

In some embodiments, step 904 includes defining the battery life model as a parametric function of the variables $T_{cell}$, SOC, DOD, PR, and ER. For example, the battery life model may be formulated as follows:

$$C_{loss,add} = \theta_1 T_{cell} + \theta_2 SOC + \theta_3 DOD + \theta_4 PR + \theta_5 ER - C_{loss,nom}$$

where $\theta_1 - \theta_6$ are parameters of the battery life model (e.g., regression coefficients) and the variables $T_{cell}$, SOC, DOD, PR, and ER are the same as previously described.

Step 904 may include performing a series of experiments to determine values for the model parameters $\theta_1 - \theta_5$. For example, step 904 may include applying known battery power signals (e.g., frequency response signals, ramp rate control signals, etc.) to the battery power inverter, causing the power inverter to charge or discharge the battery according to a known profile. Step 904 may include calculating values for the input variables to the battery life model (e.g., $T_{cell}$, SOC, DOD, PR, and ER) based on the known battery power signals and measuring a decrease in battery capacity that results from the known battery power signals. From this experiment, values can be obtained for all of the input variables to the battery life model and the resulting output variable $C_{loss,add}$. This experiment can be performed multiple times to generate test data. The test data may include multiple different sets of values for the input variables $T_{cell}$, SOC, DOD, PR, and ER, along with the resultant value of the output variable $C_{loss,add}$ corresponding to each set of input variables. Step 904 may include performing curve fitting process (e.g., a regression process) to determine values for the model parameters $\theta_1 - \theta_5$ that best fit the test data.

Still referring to FIG. 9, process 900 is shown to include using the battery life model to estimate an amount of battery degradation that will result from the battery power setpoints (step 906). Step 906 may include calculating values for each of the variables in the battery life model based on the battery power setpoints and using the calculated variables as inputs to the battery life model. The battery life model may provide the estimated amount of battery degradation $C_{loss,add}$ as a function of the input variables.

In some embodiments, step 906 includes estimating an amount of potential revenue that will be lost as a result of the battery capacity loss $C_{loss,add}$. In some embodiments, the battery capacity loss $C_{loss,add}$ can be converted into lost revenue using the following equation:

$$R_{loss} = (CP_{cap} + MR \cdot CP_{perf})C_{loss,add}P_{des}$$

where $R_{loss}$ is the lost revenue over the duration of the frequency response period. A present value of the revenue loss $R_{loss}$ can be calculated using the following equation:

$$\lambda_{bat} = \left[\frac{1-\left(1+\frac{i}{n}\right)^{-n}}{\frac{i}{n}}\right]R_{loss}$$

where n is the total number of frequency response periods (e.g., hours) during which the revenue loss occurs and $\lambda_{bat}$ is the present value of the revenue loss during the ith frequency response period. In some embodiments, the revenue loss occurs over ten years (e.g., n=87,600 hours).

Process 900 is shown to include adjusting the battery power setpoints based on the estimated amount of battery degradation (step 908). Step 908 may include selecting battery power setpoints that result in an optimal tradeoff between frequency response revenue and battery degradation. In some embodiments, the optimal battery power setpoints maximize an objective function that includes frequency response revenue, costs of electricity, and costs of battery degradation. For example, an objective function J can be written as:

$$J = \sum_{k=1}^{h} Rev(Reg_{award,k}) + \sum_{k=1}^{h} c_k b_k + \min_{period}(P_{campus,k} + b_k) - \sum_{k=1}^{h} \lambda_{batt,k}$$

where $Rev(Reg_{award,k})$ is the frequency response revenue at time step k, $c_k b_k$ is the cost of electricity purchased at time step k, $$\min_{period}(P_{campus,k} + b_k)$$

is the demand charge based on the maximum rate of electricity consumption during the applicable demand charge period, and $\lambda_{batt,k}$ is the monetized cost battery degradation at time step k. Step 908 may include performing an optimization process to determine the battery power setpoints that optimize objective function J.

Process 900 is shown to include using the adjusted battery power setpoints to control an amount of electric power stored or discharged from the battery to an energy grid (step 910). Step 910 may include providing the battery power setpoints to a battery power inverter. The power inverter may use the battery power setpoints to control an amount of power stored in the battery or discharged from the battery. Power stored in the battery may be removed from the energy grid for purposes of ramp rate control and/or frequency regulation. Similarly, power discharged from the battery may be provided to the energy grid for purposes of ramp rate control and/or frequency regulation.

Frequency Regulation and Ramp Rate Controller

Figure 12:
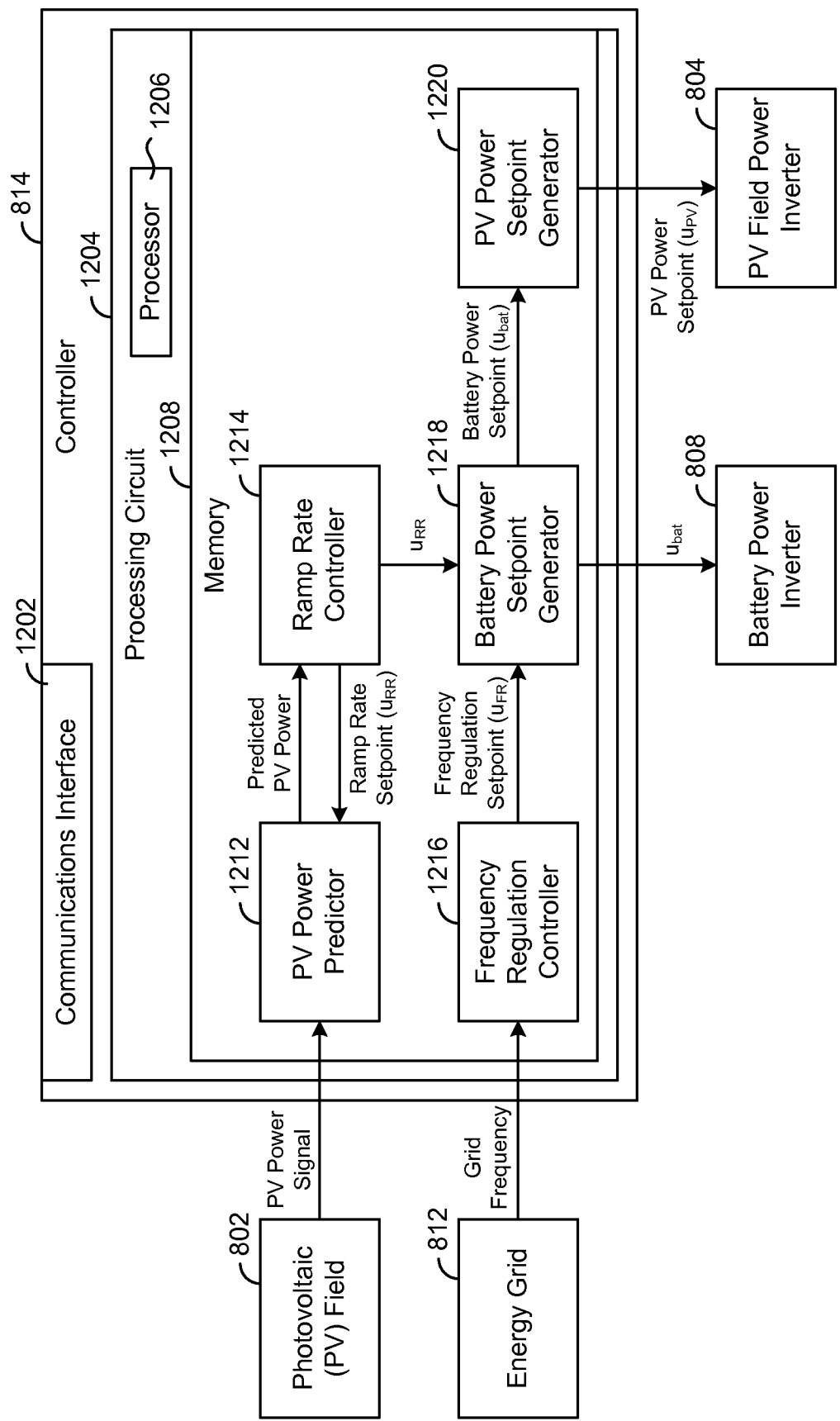
FIG. 12 is a block diagram of a frequency regulation and ramp rate controller which can be used to monitor and control the electrical energy storage system of FIGS. 8A-8B, according to an exemplary embodiment.

Referring now to FIG. 12, a block diagram illustrating controller 814 in greater detail is shown, according to an exemplary embodiment. Controller 814 is shown to include a communications interface 1202 and a processing circuit 1204. Communications interface 1202 may include wired or wireless interfaces (e.g., jacks, antennas, transmitters, receivers, transceivers, wire terminals, etc.) for conducting data communications with various systems, devices, or networks. For example, communications interface 802 may include an Ethernet card and port for sending and receiving data via an Ethernet-based communications network and/or a WiFi transceiver for communicating via a wireless communications network. Communications interface 1202 may be configured to communicate via local area networks or wide area networks (e.g., the Internet, a building WAN, etc.) and may use a variety of communications protocols (e.g., BACnet, IP, LON, etc.).

Communications interface 1202 may be a network interface configured to facilitate electronic data communications between controller 814 and various external systems or devices (e.g., PV field 802, energy grid 812, PV field power inverter 804, battery power inverter 808, etc.). For example, controller 814 may receive a PV power signal from PV field 802 indicating the current value of the PV power $P_{PV}$ generated by PV field 802. Controller 814 may use the PV power signal to predict one or more future values for the PV power $P_{PV}$ and generate a ramp rate setpoint $u_{RR}$. Controller 814 may receive a grid frequency signal from energy grid 812 indicating the current value of the grid frequency. Controller 814 may use the grid frequency to generate a frequency regulation setpoint $u_{FR}$. Controller 814 may use the ramp rate setpoint $u_{RR}$ and the frequency regulation setpoint $u_{FR}$ to generate a battery power setpoint $u_{bat}$ and may provide the battery power setpoint $u_{bat}$ to battery power inverter 808. Controller 814 may use the battery power setpoint $u_{bat}$ to generate a PV power setpoint $u_{PV}$ and may provide the PV power setpoint $u_{PV}$ to PV field power inverter 804.

Still referring to FIG. 12, processing circuit 1204 is shown to include a processor 1206 and memory 1208. Processor 1206 may be a general purpose or specific purpose processor, an application specific integrated circuit (ASIC), one or more field programmable gate arrays (FPGAs), a group of processing components, or other suitable processing components.

Processor 1206 may be configured to execute computer code or instructions stored in memory 1208 or received from other computer readable media (e.g., CDROM, network storage, a remote server, etc.).

Memory 1208 may include one or more devices (e.g., memory units, memory devices, storage devices, etc.) for storing data and/or computer code for completing and/or facilitating the various processes described in the present disclosure. Memory 1208 may include random access memory (RAM), read-only memory (ROM), hard drive storage, temporary storage, non-volatile memory, flash memory, optical memory, or any other suitable memory for storing software objects and/or computer instructions. Memory 1208 may include database components, object code components, script components, or any other type of information structure for supporting the various activities and information structures described in the present disclosure. Memory 1208 may be communicably connected to processor 1206 via processing circuit 1204 and may include computer code for executing (e.g., by processor 1206) one or more processes described herein.

Predicting PV Power Output

Still referring to FIG. 12, controller 814 is shown to include a PV power predictor 1212. PV power predictor 1212 may receive the PV power signal from PV field 802 and use the PV power signal to make a short term prediction of the photovoltaic power output $P_{PV}$. In some embodiments, PV power predictor 1212 predicts the value of $P_{PV}$ for the next time step (i.e., a one step ahead prediction). For example, at each time step k, PV power predictor 1212 may predict the value of the PV power output $P_{PV}$ for the next time step k+1 (i.e., $\hat{P}_{PV}(k+1)$). Advantageously, predicting the next value for the PV power output $P_{PV}$ allows controller 814 to predict the ramp rate and perform an appropriate control action to prevent the ramp rate from exceeding the ramp rate compliance limit.

In some embodiments, PV power predictor 1212 performs a time series analysis to predict $\hat{P}_{PV}(k+1)$. A time series may be defined by an ordered sequence of values of a variable at equally spaced intervals. PV power predictor 1212 may model changes between values of $P_{PV}$ over time using an autoregressive moving average (ARMA) model or an autoregressive integrated moving average (ARIMA) model. PV power predictor 1212 may use the model to predict the next value of the PV power output $P_{PV}$ and correct the prediction using a Kalman filter each time a new measurement is acquired. The time series analysis technique is described in greater detail in the following paragraphs.

In some embodiments, PV power predictor 1212 uses a technique in the Box-Jenkins family of techniques to perform the time series analysis. These techniques are statistical tools that use past data (e.g., lags) to predict or correct new data, and other techniques to find the parameters or coefficients of the time series. A general representation of a time series from the Box-Jenkins approach is:

$$X_k - \sum_{r=1}^{p} \varphi_r X_{k-r} = \sum_{s=0}^{q} \theta_s \epsilon_{k-s}$$

which is known as an ARMA process. In this representation, the parameters p and q define the order and number of lags of the time series, φ is an autoregressive parameter, and θ is a moving average parameter. This representation is desirable for a stationary process which has a mean, variance, and autocorrelation structure that does not change over time. However, if the original process $\{Y_k\}$ representing the time series values of $P_{PV}$ is not stationary, $X_k$ can represent the first difference (or higher order difference) of the process $\{Y_k - Y_{k-1}\}$. If the difference is stationary, PV power predictor 1212 may model the process as an ARIMA process.

PV power predictor 1212 may be configured to determine whether to use an ARMA model or an ARIMA model to model the time series of the PV power output $P_{PV}$. Determining whether to use an ARMA model or an ARIMA model may include identifying whether the process is stationary. In some embodiments, the power output $P_{PV}$ is not stationary.

However, the first difference $Y_k - Y_{k1}$ may be stationary. Accordingly, PV power predictor 1212 may select an ARIMA model to represent the time series of $P_{PV}$.

PV power predictor 1212 may find values for the parameters p and q that define the order and the number of lags of the time series. In some embodiments, PV power predictor 1212 finds values for p and q by checking the partial autocorrelation function (PACF) and selecting a number where the PACF approaches zero (e.g., p=q). For some time series data, PV power predictor 1212 may determine that a $4^{th}$ or $5^{th}$ order model is appropriate. However, it is contemplated that PV power predictor 1212 may select a different model order to represent different time series processes.

PV power predictor 1212 may find values for the autoregressive parameter $\varphi_{1 \ldots p}$ and the moving average parameter $\theta_{1 \ldots q}$. In some embodiments, PV power predictor 1212 uses an optimization algorithm to find values for $\varphi_{1 \ldots p}$ and $\theta_{1 \ldots p}$ given the time series data $\{Y_k\}$. For example, PV power predictor 1212 may generate a discrete-time ARIMA model of the form:

$$A(z)y(k) = \left[\frac{C(z)}{1-z^{-1}}\right]e(t)$$

where $A(z)$ and $C(z)$ are defined as follows:

$$A(z)=1+\varphi_1 z^{-1}+\varphi_2 z^{-2}+\varphi_3 z^{-3}+\varphi_4 z^{-4}$$

$$C(z)=1+\theta_1 z^{-1}+\theta_2 z^{-2}+\theta_3 z^{-3}+\theta_4 z^{-4}$$

where the values for $\varphi_{1 \ldots p}$ and $\theta_{1 \ldots p}$ are determined by fitting the model to the time series values of $P_{PV}$.

In some embodiments, PV power predictor 1212 uses the ARIMA model as an element of a Kalman filter. The Kalman filter may be used by PV power predictor 1212 to correct the estimated state and provide tighter predictions based on actual values of the PV power output $P_{PV}$. In order to use the ARIMA model with the Kalman filter, PV power predictor 1212 may generate a discrete-time state-space representation of the ARIMA model of the form:

$$x(k+1)=Ax(k)+Ke(k)$$

$$y(k)=Cx(k)+e(k)$$

where $y(k)$ represents the values of the PV power output $P_{PV}$ and $e(k)$ is a disturbance considered to be normal with zero mean and a variance derived from the fitted model. It is contemplated that the state-space model can be represented in a variety of different forms. For example, the ARIMA model can be rewritten as a difference equation and used to generate a different state-space model using state-space modeling techniques. In various embodiments, PV power predictor 1212 may use any of a variety of different forms of the state-space model.

The discrete Kalman filter consists of an iterative process that takes a state-space model and forwards it in time until there are available data to correct the predicted state and obtain a better estimate. The correction may be based on the evolution of the mean and covariance of an assumed white noise system. For example, PV power predictor 1212 may use a state-space model of the following form:

$$x(k+1)=Ax(k)+Bu(k)+w(k) \quad w(k) \sim N(0,Q)$$

$$y(k)=Cx(k)+Du(k)+v(k) \quad v(k) \sim N(0,R)$$

where $N(\ )$ represents a normal distribution, $v(k)$ is the measurement error having zero mean and variance R, and $w(k)$ is the process error having zero mean and variance Q. The values of R and Q are design choices. The variable $x(k)$ is a state of the process and the variable $y(k)$ represents the PV power output $P_{PV}(k)$. This representation is referred to as a stochastic state-space representation.

PV power predictor 1212 may use the Kalman filter to perform an iterative process to predict $\hat{P}_{PV}(k+1)$ based on the current and previous values of $P_{PV}$ (e.g., $P_{PV}(k)$, $P_{PV}(k-1)$, etc.). The iterative process may include a prediction step and an update step. The prediction step moves the state estimate forward in time using the following equations:

$$\hat{x}^-(k+1)=A*\hat{x}(k)$$

$$P^-(k+1)=A*P(k)*A^T+Q$$

where $\hat{x}(k)$ is the mean of the process or estimated state at time step k and $P(k)$ is the covariance of the process at time step k. The super index "−" indicates that the estimated state $\hat{x}^-(k+1)$ is based on the information known prior to time step k+1 (i.e., information up to time step k). In other words, the measurements at time step k+1 have not yet been incorporated to generate the state estimate $\hat{x}^-(k+1)$. This is known as an a priori state estimate.

PV power predictor 1212 may predict the PV power output $\hat{P}_{PV}(k+1)$ by determining the value of the predicted measurement $\hat{y}^-(k+1)$. As previously described, the measurement $y(k)$ and the state $x(k)$ are related by the following equation:

$$y(k)=Cx(k)+e(k)$$

which allows PV power predictor 1212 to predict the measurement $\hat{y}^-(k+1)$ as a function of the predicted state $\hat{x}^-(k+1)$. PV power predictor 1212 may use the measurement estimate $\hat{y}^-(k+1)$ as the value for the predicted PV power output $\hat{P}_{PV}(k+1)$ (i.e., $\hat{P}_{PV}(k+1)=\hat{y}^-(k+1)$).

The update step uses the following equations to correct the a priori state estimate $\hat{x}^-(k+1)$ based on the actual (measured) value of $y(k+1)$:

$$K=P^-(k+1)*C^T*[R+C*P^-(k+1)*C^T]^{-1}$$

$$\hat{x}(k+1)=\hat{x}^-(k+1)+K[y(k+1)-C*\hat{x}^-(k+1)]$$

$$P(k+1)=P^-(k+1)-K*[R+C*P^-(k+1)*C^T]*K^T$$

where $y(k+1)$ corresponds to the actual measured value of $P_{PV}(k+1)$. The variable $\hat{x}(k+1)$ represents the a posteriori estimate of the state x at time k+1 given the information known up to time step k+1. The update step allows PV power predictor 1212 to prepare the Kalman filter for the next iteration of the prediction step.

Although PV power predictor 1212 is primarily described as using a time series analysis to predict $\hat{P}_{PV}(k+1)$, it is contemplated that PV power predictor 1212 may use any of a variety of techniques to predict the next value of the PV power output $P_{PV}$. For example, PV power predictor 1212 may use a deterministic plus stochastic model trained from historical PV power output values (e.g., linear regression for the deterministic portion and an AR model for the stochastic portion). This technique is described in greater detail in U.S. patent application Ser. No. 14/717,593, titled "Building Management System for Forecasting Time Series Values of Building Variables" and filed May 20, 2015, the entirety of which is incorporated by reference herein.

In other embodiments, PV power predictor 1212 uses input from cloud detectors (e.g., cameras, light intensity sensors, radar, etc.) to predict when an approaching cloud will cast a shadow upon PV field 802. When an approaching cloud is detected, PV power predictor 1212 may estimate an amount by which the solar intensity will decrease as a result of the shadow and/or increase once the shadow has passed PV field 802. PV power predictor 1212 may use the predicted change in solar intensity to predict a corresponding change in the PV power output $P_{PV}$. This technique is described in greater detail in U.S. Provisional Patent Application No. 62/239,131 titled "Systems and Methods for Controlling Ramp Rate in a Photovoltaic Energy System" and filed Oct. 8, 2015, the entirety of which is incorporated by reference herein. PV power predictor 1212 may provide the predicted PV power output $\hat{P}_{PV}(k+1)$ to ramp rate controller 1214.

Controlling Ramp Rate

Still referring to FIG. 12, controller 814 is shown to include a ramp rate controller 1214. Ramp rate controller 1214 may be configured to determine an amount of power to charge or discharge from battery 806 for ramp rate control (i.e., $u_{RR}$). Advantageously, ramp rate controller 1214 may determine a value for the ramp rate power $u_{RR}$ that simultaneously maintains the ramp rate of the PV power (i.e., $u_{RR}+P_{PV}$) within compliance limits while allowing controller 814 to regulate the frequency of energy grid 812 and while maintaining the state-of-charge of battery 806 within a predetermined desirable range.

In some embodiments, the ramp rate of the PV power is within compliance limits as long as the actual ramp rate evaluated over a one minute interval does not exceed ten percent of the rated capacity of PV field 802. The actual ramp rate may be evaluated over shorter intervals (e.g., two seconds) and scaled up to a one minute interval. Therefore, a ramp rate may be within compliance limits if the ramp rate satisfies one or more of the following inequalities:

$$|rr| < \frac{0.1 P_{cap}}{30}(1 + \text{tolerance})$$

$$|RR| < 0.1 P_{cap}(1 + \text{tolerance})$$

where rr is the ramp rate calculated over a two second interval, RR is the ramp rate calculated over a one minute interval, $P_{cap}$ is the rated capacity of PV field 802, and tolerance is an amount by which the actual ramp rate can exceed the compliance limit without resulting in a non-compliance violation (e.g., tolerance=10%). In this formulation, the ramp rates rr and RR represent a difference in the PV power (e.g., measured in kW) at the beginning and end of the ramp rate evaluation interval.

Simultaneous implementation of ramp rate control and frequency regulation can be challenging (e.g., can result in non-compliance), especially if the ramp rate is calculated as the difference in the power $P_{POI}$ at POI 810. In some embodiments, the ramp rate over a two second interval is defined as follows:

$$rr=[P_{POI}(k)-P_{POI}(k-1)]-[u_{FR}(k)-u_{FR}(k-1)]$$

where $P_{POI}(k-1)$ and $P_{POI}(k)$ are the total powers at POI 810 measured at the beginning and end, respectively, of a two second interval, and $u_{FR}(k-1)$ and $u_{FR}(k)$ are the powers used for frequency regulation measured at the beginning and end, respectively, of the two second interval.

The total power at POI 810 (i.e., $P_{POI}$) is the sum of the power output of PV field power inverter 804 (i.e., $u_{PV}$) and the power output of battery power inverter 808 (i.e., $u_{bat}=u_{FR}+u_{RR}$). Assuming that PV field power inverter 804 is not limiting the power $P_{PV}$ generated by PV field 802, the output of PV field power inverter 804 $u_{PV}$ may be equal to the PV power output $P_{PV}$ (i.e., $P_{PV}=u_{PV}$) and the total power $P_{POI}$ at POI 810 can be calculated using the following equation:

$$P_{POI}=P_{PV}+u_{FR}+u_{RR}$$

Therefore, the ramp rate rr can be rewritten as:

$$rr=P_{PV}(k)-P_{PV}(k-1)+u_{RR}(k)-u_{RR}(k-1)$$

and the inequality which must be satisfied to comply with the ramp rate limit can be rewritten as:

$$|P_{PV}(k) - P_{PV}(k-1) + u_{RR}(k) - u_{RR}(k-1)| < \frac{0.1 P_{cap}}{30}(1 + \text{tolerance})$$

where $P_{PV}(k-1)$ and $P_{PV}(k)$ are the power outputs of PV field 802 measured at the beginning and end, respectively, of the two second interval, and $u_{RR}(k-1)$ and $u_{RR}(k)$ are the powers used for ramp rate control measured at the beginning and end, respectively, of the two second interval.

In some embodiments, ramp rate controller 1214 determines the ramp rate compliance of a facility based on the number of scans (i.e., monitored intervals) in violation that occur within a predetermined time period (e.g., one week) and the total number of scans that occur during the predetermined time period. For example, the ramp rate compliance RRC may be defined as a percentage and calculated as follows:

$$RRC = 100\left(1 - \frac{n_{vscan}}{n_{tscan}}\right)$$

where $n_{vscan}$ is the number of scans over the predetermined time period where rr is in violation and $n_{tscan}$ is the total number of scans during which the facility is performing ramp rate control during the predetermined time period.

In some embodiments, the intervals that are monitored or scanned to determine ramp rate compliance are selected arbitrarily or randomly (e.g., by a power utility). Therefore, it may be impossible to predict which intervals will be monitored. Additionally, the start times and end times of the intervals may be unknown. In order to guarantee ramp rate compliance and minimize the number of scans where the ramp rate is in violation, ramp rate controller 1214 may determine the amount of power $u_{RR}$ used for ramp rate control ahead of time. In other words, ramp rate controller 1214 may determine, at each instant, the amount of power $u_{RR}$ to be used for ramp rate control at the next instant. Since the start and end times of the intervals may be unknown, ramp rate controller 1214 may perform ramp rate control at smaller time intervals (e.g., on the order of milliseconds).

Ramp rate controller 1214 may use the predicted PV power $\hat{P}_{PV}(k+1)$ at instant k+1 and the current PV power $P_{PV}(k)$ at instant k to determine the ramp rate control power $\hat{u}_{RR_T}(k)$ at instant k. Advantageously, this allows ramp rate controller 1214 to determine whether the PV power $P_{PV}$ is in an up-ramp, a down-ramp, or no-ramp at instant k. Assuming a T seconds time resolution, ramp rate controller 1214 may determine the value of the power for ramp rate control $\hat{u}_{RR_T}(k)$ at instant k based on the predicted value of the PV power $\hat{P}_{PV}(k+1)$, the current value of the PV power $P_{PV}(k)$, and the previous power used for ramp rate control $\hat{u}_{RR_T}(k-1)$. Scaling to T seconds and assuming a tolerance of zero, ramp rate compliance is guaranteed if $\hat{u}_{RR_T}(k)$ satisfies the following inequality:

$$lb_{RR_T} \leq \hat{u}_{RR_T} \leq ub_{RR_T}$$

where T is the sampling time in seconds, $lb_{RR_T}$ is the lower bound on $\hat{u}_{RR_T}(k)$, and $ub_{RR_T}$ is the upper bound on $\hat{u}_{RR_T}(k)$.

In some embodiments, the lower bound $lb_{RR_T}$ and the upper bound $ub_{RR_T}$ are defined as follows:

$$lb_{RR_T} = -(\hat{P}_{PV}(k+1) - P_{PV}(k)) + \hat{u}_{RR_T}(k-1) - \frac{0.1 P_{cap}}{60/T} + \lambda\sigma$$

$$ub_{RR_T} = -(\hat{P}_{PV}(k+1) - P_{PV}(k)) + \hat{u}_{RR_T}(k-1) + \frac{0.1 P_{cap}}{60/T} - \lambda\sigma$$

where $\sigma$ is the uncertainty on the PV power prediction and $\lambda$ is a scaling factor of the uncertainty in the PV power prediction. Advantageously, the lower bound $lb_{RR_T}$ and the upper bound $ub_{RR_T}$ provide a range of ramp rate power $\hat{u}_{RR_T}(k)$ that guarantees compliance of the rate of change in the PV power.

In some embodiments, ramp rate controller 1214 determines the ramp rate power $\hat{u}_{RR_T}(k)$ based on whether the PV power $P_{PV}$ is in an up-ramp, a down-ramp, or no-ramp (e.g., the PV power is not changing or changing at a compliant rate) at instant k. Ramp rate controller 1214 may also consider the state-of-charge (SOC) of battery 806 when determining $\hat{u}_{RR_T}(k)$. Exemplary processes which may be performed by ramp rate controller 1214 to generate values for the ramp rate power $\hat{u}_{RR_T}(k)$ are described in detail in U.S. Patent Application No. 62/239,245. Ramp rate controller 1214 may provide the ramp rate power setpoint $\hat{u}_{RR_T}(k)$ to battery power setpoint generator 1218 for use in determining the battery power setpoint $u_{bat}$.

Controlling Frequency Regulation

Referring again to FIG. 12, controller 814 is shown to include a frequency regulation controller 1216. Frequency regulation controller 1216 may be configured to determine an amount of power to charge or discharge from battery 806 for frequency regulation (i.e., $u_{FR}$). Frequency regulation controller 1216 is shown receiving a grid frequency signal from energy grid 812. The grid frequency signal may specify the current grid frequency $f_{grid}$ of energy grid 812. In some embodiments, the grid frequency signal also includes a scheduled or desired grid frequency $f_s$ to be achieved by performing frequency regulation. Frequency regulation controller 1216 may determine the frequency regulation setpoint $u_{FR}$ based on the difference between the current grid frequency $f_{grid}$ and the scheduled frequency $f_s$.

In some embodiments, the range within which the grid frequency $f_{grid}$ is allowed to fluctuate is determined by an electric utility. Any frequencies falling outside the permissible range may be corrected by performing frequency regulation. Facilities participating in frequency regulation may be required to supply or consume a contracted power for purposes of regulating grid frequency $f_{grid}$ (e.g., up to 10% of the rated capacity of PV field 802 per frequency regulation event).

In some embodiments, frequency regulation controller 1216 performs frequency regulation using a dead-band control technique with a gain that is dependent upon the difference $f_e$ between the scheduled grid frequency $f_s$ and the actual grid frequency $f_{grid}$ (i.e., $f_e = f_s - f_{grid}$) and an amount of power required for regulating a given deviation amount of frequency error $f_e$. Such a control technique is expressed mathematically by the following equation:

$$u_{FR}(k) = \min(\max(lb_{FR}, \alpha), ub_{FR})$$

where $lb_{FR}$ and $ub_{FR}$ are the contracted amounts of power up to which power is to be consumed or supplied by a facility. $lb_{FR}$ and $ub_{FR}$ may be based on the rated capacity $P_{cap}$ of PV field 802 as shown in the following equations:

$$lb_{FR} = -0.1 \times P_{cap}$$

$$ub_{FR} = 0.1 \times P_{cap}$$

The variable $\alpha$ represents the required amount of power to be supplied or consumed from energy grid 812 to offset the frequency error $f_e$. In some embodiments, frequency regulation controller 1216 calculates $\alpha$ using the following equation:

$$\alpha = K_{FR} \times \text{sign}(f_e) \times \max(|f_e| - d_{band}, 0)$$

where $d_{band}$ is the threshold beyond which a deviation in grid frequency must be regulated and $K_{FR}$ is the control gain. In some embodiments, frequency regulation controller 1216 calculates the control gain $K_{FR}$ as follows:

$$K_{FR} = \frac{P_{cap}}{0.01 \times \text{droop} \times f_s}$$

where droop is a parameter specifying a percentage that defines how much power must be supplied or consumed to offset a 1 Hz deviation in the grid frequency. Frequency regulation controller 1216 may calculate the frequency regulation setpoint $u_{FR}$ using these equations and may provide the frequency regulation setpoint to battery power setpoint generator 1218.

Generating Battery Power Setpoints

Still referring to FIG. 12, controller 814 is shown to include a battery power setpoint generator 1218. Battery power setpoint generator 1218 may be configured to generate the battery power setpoint $u_{bat}$ for battery power inverter 808. The battery power setpoint $u_{bat}$ is used by battery power inverter 808 to control an amount of power drawn from battery 806 or stored in battery 806. For example, battery power inverter 808 may draw power from battery 806 in response to receiving a positive battery power setpoint $u_{bat}$ from battery power setpoint generator 1218 and may store power in battery 806 in response to receiving a negative battery power setpoint $u_{bat}$ from battery power setpoint generator 1218.

Battery power setpoint generator 1218 is shown receiving the ramp rate power setpoint $u_{RR}$ from ramp rate controller 1214 and the frequency regulation power setpoint $u_{FR}$ from frequency regulation controller 1216. In some embodiments, battery power setpoint generator 1218 calculates a value for the battery power setpoint $u_{bat}$ by adding the ramp rate power setpoint $u_{RR}$ and the frequency response power setpoint $u_{FR}$. For example, battery power setpoint generator 1218 may calculate the battery power setpoint $u_{bat}$ using the following equation:

$$u_{bat} = u_{RR} + u_{FR}$$

In some embodiments, battery power setpoint generator 1218 adjusts the battery power setpoint $u_{bat}$ based on a battery power limit for battery 806. For example, battery power setpoint generator 1218 may compare the battery power setpoint $u_{bat}$ with the battery power limit battPowerLimit. If the battery power setpoint is greater than the battery power limit (i.e., $u_{bat} >$ battPowerLimit), battery power setpoint generator 1218 may replace the battery power setpoint $u_{bat}$ with the battery power limit. Similarly, if the battery power setpoint is less than the negative of the battery power limit (i.e., $u_{bat} < -$battPowerLimit), battery power setpoint generator 1218 may replace the battery power setpoint $u_{bat}$ with the negative of the battery power limit.

In some embodiments, battery power setpoint generator 1218 causes frequency regulation controller 1216 to update the frequency regulation setpoint $u_{FR}$ in response to replacing the battery power setpoint $u_{bat}$ with the battery power limit battPowerLimit or the negative of the battery power limit −battPowerLimit. For example, if the battery power setpoint $u_{bat}$ is replaced with the positive battery power limit battPowerLimit, frequency regulation controller 1216 may update the frequency regulation setpoint $u_{FR}$ using the following equation:

$$u_{FR}(k) = \text{battPowerLimit} - \hat{u}_{RR_T}(k)$$

Similarly, if the battery power setpoint $u_{bat}$ is replaced with the negative battery power limit −battPowerLimit, frequency regulation controller 1216 may update the frequency regulation setpoint $u_{FR}$ using the following equation:

$$u_{FR}(k) = -\text{battPowerLimit} - \hat{u}_{RR_T}(k)$$

These updates ensure that the amount of power used for ramp rate control $\hat{u}_{RR_T}(k)$ and the amount of power used for frequency regulation $u_{FR}(k)$ can be added together to calculate the battery power setpoint $u_{bat}$. Battery power setpoint generator 1218 may provide the battery power setpoint $u_{bat}$ to battery power inverter 808 and to PV power setpoint generator 1220.

Generating PV Power Setpoints

Still referring to FIG. 12, controller 814 is shown to include a PV power setpoint generator 1220. PV power setpoint generator 1220 may be configured to generate the PV power setpoint $u_{PV}$ for PV field power inverter 804. The PV power setpoint $u_{PV}$ is used by PV field power inverter 804 to control an amount of power from PV field 802 to provide to POI 810.

In some embodiments, PV power setpoint generator 1220 sets a default PV power setpoint $u_{PV}(k)$ for instant k based on the previous value of the PV power $P_{PV}(k-1)$ at instant k−1. For example, PV power setpoint generator 1220 may increment the previous PV power $P_{PV}(k-1)$ with the compliance limit as shown in the following equation:

$$u_{PV}(k) = P_{PV}(k-1) + \frac{0.1 P_{cap}}{60/T} - \lambda \sigma$$

This guarantees compliance with the ramp rate compliance limit and gradual ramping of the PV power output to energy grid 812. The default PV power setpoint may be useful to guarantee ramp rate compliance when the system is turned on, for example, in the middle of a sunny day or when an up-ramp in the PV power output $P_{PV}$ is to be handled by limiting the PV power at PV power inverter 804 instead of charging battery 806.

In some embodiments, PV power setpoint generator 1220 updates the PV power setpoint $u_{PV}(k)$ based on the value of the battery power setpoint $u_{bat}(k)$ so that the total power provided to POI 810 does not exceed a POI power limit. For example, PV power setpoint generator 1220 may use the PV power setpoint $u_{PV}(k)$ and the battery power setpoint $u_{bat}(k)$ to calculate the total power $P_{POI}(k)$ at point of intersection 810 using the following equation:

$$P_{POI}(k) = u_{bat}(k) + u_{PV}(k)$$

PV power setpoint generator 1220 may compare the calculated power $P_{POI}(k)$ with a power limit for POI 810 (i.e., POIPowerLimit). If the calculated power $P_{POI}(k)$ exceeds the POI power limit (i.e., $P_{POI}(k)$>POIPowerLimit), PV power setpoint generator 1220 may replace the calculated power $P_{POI}(k)$ with the POI power limit. PV power setpoint generator 1220 may update the PV power setpoint $u_{PV}(k)$ using the following equation:

$$u_{PV}(k) = \text{POIPowerLimit} - u_{bat}(k)$$

This ensures that the total power provided to POI 810 does not exceed the POI power limit by causing PV field power inverter 804 to limit the PV power. PV power setpoint generator 1220 may provide the PV power setpoint $u_{PV}$ to PV field power inverter 804.

Frequency Response Control System

Figure 13:
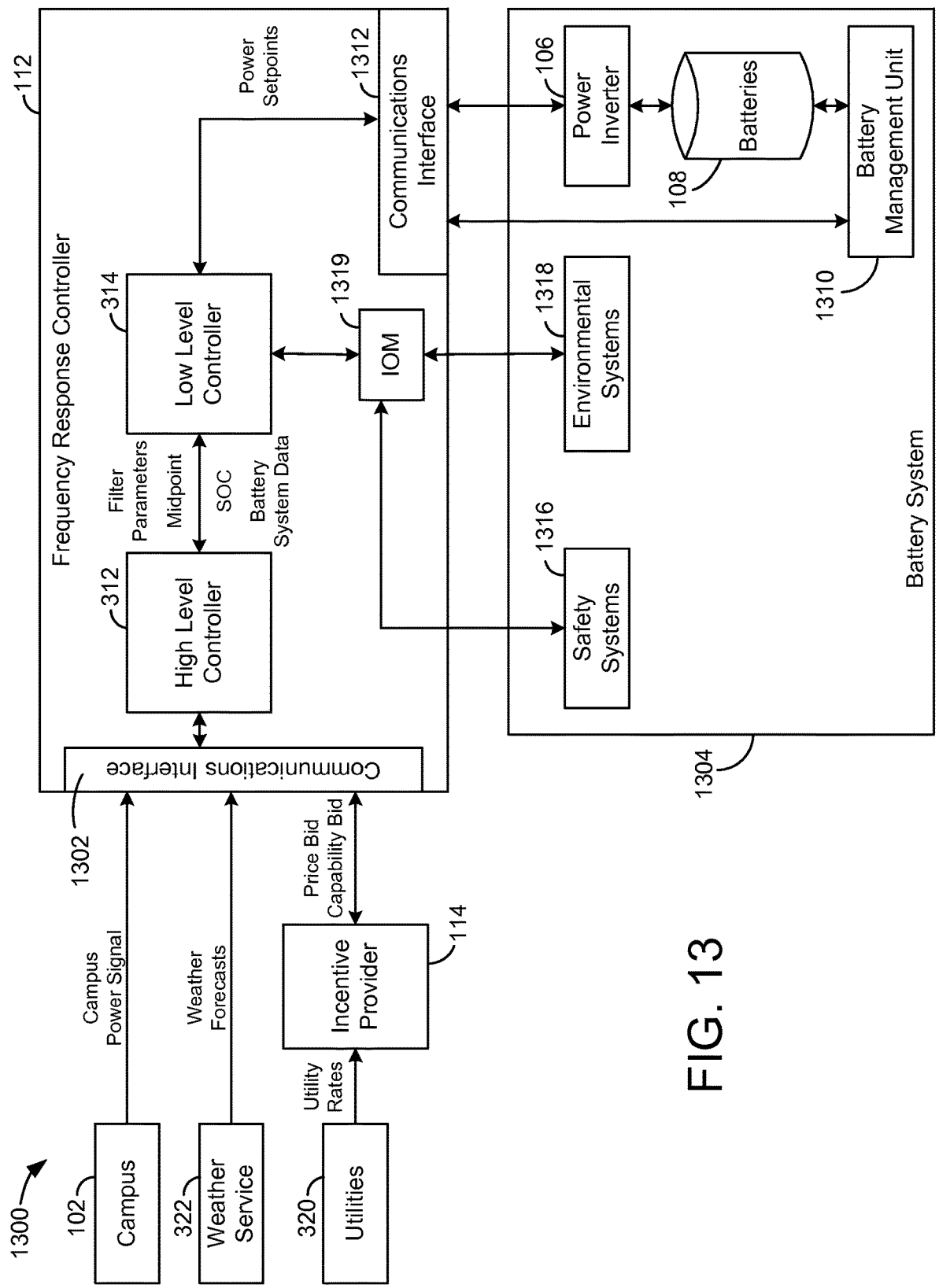
FIG. 13 is a block diagram of a frequency response control system, according to an exemplary embodiment.

Referring now to FIG. 13, a block diagram of a frequency response control system 1300 is shown, according to exemplary embodiment. Control system 1300 is shown to include frequency response controller 112, which may be the same or similar as previously described. For example, frequency response controller 112 may be configured to perform an optimization process to generate values for the bid price, the capability bid, and the midpoint b. In some embodiments, frequency response controller 112 generates values for the bids and the midpoint b periodically using a predictive optimization scheme (e.g., once every half hour, once per frequency response period, etc.). Frequency response controller 112 may also calculate and update power setpoints for power inverter 106 periodically during each frequency response period (e.g., once every two seconds). As shown in FIG. 13, frequency response controller 112 is in communication with one or more external systems via communication interface 1302. Additionally, frequency response controller 112 is also shown as being in communication with a battery system 1304.

In some embodiments, the interval at which frequency response controller 112 generates power setpoints for power inverter 106 is significantly shorter than the interval at which frequency response controller 112 generates the bids and the midpoint b. For example, frequency response controller 112 may generate values for the bids and the midpoint b every half hour, whereas frequency response controller 112 may generate a power setpoint for power inverter 106 every two seconds. The difference in these time scales allows frequency response controller 112 to use a cascaded optimization process to generate optimal bids, midpoints b, and power setpoints.

In the cascaded optimization process, high level controller 312 determines optimal values for the bid price, the capability bid, and the midpoint b by performing a high level optimization. The high level controller 312 may be a centralized server within the frequency response controller 112. The high level controller 312 may be configured to execute optimization control algorithms, such as those described herein. In one embodiment, the high level controller 312 may be configured to run an optimization engine, such as a MATLAB optimization engine.

Further, the cascaded optimization process allows for multiple controllers to process different portions of the optimization process. As will be described below, the high level controller 312 may be used to perform optimization functions based on received data, while a low level controller 314 may receive optimization data from the high level controller 312 and control the battery system 1304 accordingly. By allowing independent platforms to perform separation portions of the optimization, the individual platforms may be scaled and tuned independently. For example, the controller 112 may be able to be scaled up to accommodate a larger battery system 1304 by adding additional low level controllers to control the battery system 1304. Further, the high level controller 312 may be modified to provide additional computing power for optimizing battery system 1304 in more complex systems. Further, modifications to either the high level controller 312 or the low level controller 314 will not affect the other, thereby increasing overall system stability and availability.

In system 1300, high level controller 312 may be configured to perform some or all of the functions previously described with reference to FIGS. 3-4. For example, high level controller 312 may select midpoint b to maintain a constant state-of-charge in battery 108 (i.e., the same state-of-charge at the beginning and end of each frequency response period) or to vary the state-of-charge in order to optimize the overall value of operating system 1300 (e.g., frequency response revenue minus energy costs and battery degradation costs), as described below. High level controller 312 may also determine filter parameters for a signal filter (e.g., a low pass filter) used by a low level controller 314.

The low level controller 314 may be a standalone controller. In one embodiment, the low level controller 314 is a Network Automation Engine (NAE) controller from Johnson Controls. However, other controllers having the required capabilities are also contemplated. The required capabilities for the low level controller 314 may include having sufficient memory and computing power to run the applications, described below, at the required frequencies. For example, certain optimization control loops (described below) may require control loops running at 200 ms intervals. However, intervals of more than 200 ms and less than 200 ms may also be required. These control loops may require reading and writing data to and from the battery inverter. The low level controller 314 may also be required to support Ethernet connectivity (or other network connectivity) to connect to a network for receiving both operational data, as well as configuration data. The low level controller 314 may be configured to perform some or all of the functions previously described with reference to FIGS. 3-5.

The low level controller 314 may be capable of quickly controlling one or more devices around one or more setpoints. For example, low level controller 314 uses the midpoint b and the filter parameters from high level controller 312 to perform a low level optimization in order to generate the power setpoints for power inverter 106. Advantageously, low level controller 314 may determine how closely to track the desired power $P^*_{POI}$ at the point of interconnection 110. For example, the low level optimization performed by low level controller 314 may consider not only frequency response revenue but also the costs of the power setpoints in terms of energy costs and battery degradation. In some instances, low level controller 314 may determine that it is deleterious to battery 108 to follow the regulation exactly and may sacrifice a portion of the frequency response revenue in order to preserve the life of battery 108.

Low level controller 314 may also be configured to interface with one or more other devises or systems. For example, the low level controller 314 may communicate with the power inverter 106 and/or the battery management unit 1310 via a low level controller communication interface 1312. Communications interface 1312 may include wired or wireless interfaces (e.g., jacks, antennas, transmitters, receivers, transceivers, wire terminals, etc.) for conducting data communications with various systems, devices, or networks. For example, communications interface 1312 may include an Ethernet card and port for sending and receiving data via an Ethernet-based communications network and/or a WiFi transceiver for communicating via a wireless communications network. Communications interface 1312 may be configured to communicate via local area networks or wide area networks (e.g., the Internet, a building WAN, etc.) and may use a variety of communications protocols (e.g., BACnet, MODBUS, CAN, IP, LON, etc.).

As described above, the low level controller 314 may communicate setpoints to the power inverter 106. Furthermore, the low level controller 314 may receive data from the battery management unit 1310 via the communication interface 1312. The battery management unit 1310 may provide data relating to a state of charge (SOC) of the batteries 108. The battery management unit 1310 may further provide data relating to other parameters of the batteries 108, such as temperature, real time or historical voltage level values, real time or historical current values, etc. The low level controller 314 may be configured to perform time critical functions of the frequency response controller 112. For example, the low level controller 314 may be able to perform fast loop (PID, PD, PI, etc.) controls in real time.

The low level controller 314 may further control a number of other systems or devices associated with the battery system 1304. For example, the low level controller may control safety systems 1316 and/or environmental systems 1318. In one embodiment, the low level controller 314 may communicate with and control the safety systems 1316 and/or the environmental systems 1318 through an input/output module (IOM) 1319. In one example, the IOM may be an IOM controller from Johnson Controls. The IOM may be configured to receive data from the low level controller and then output discrete control signals to the safety systems 1316 and/or environmental systems 1318. Further, the IOM 1319 may receive discrete outputs from the safety systems 1316 and/or environmental systems 320, and report those values to the low level controller 314. For example, the IOM 1319 may provide binary outputs to the environmental system 1318, such as a temperature setpoint; and in return may receive one or more analog inputs corresponding to temperatures or other parameters associated with the environmental systems 1318. Similarly, the safety systems 1316 may provide binary inputs to the IOM 1319 indicating the status of one or more safety systems or devices within the battery system 1304. The IOM 1319 may be able to process multiple data points from devices within the battery system 1304. Further, the IOM may be configured to receive and output a variety of analog signals (4-20 mA, 0-5V, etc.) as well as binary signals.

The environmental systems 1318 may include HVAC devices such as roof-top units (RTUs), air handling units (AHUs), etc. The environmental systems 1318 may be coupled to the battery system 1304 to provide environmental regulation of the battery system 1304. For example, the environmental systems 1318 may provide cooling for the battery system 1304. In one example, the battery system 1304 may be contained within an environmentally sealed container. The environmental systems 1318 may then be used to not only provide airflow through the battery system 1304, but also to condition the air to provide additional cooling to the batteries 108 and/or the power inverter 106. The environmental systems 1318 may also provide environmental services such as air filtration, liquid cooling, heating, etc. The safety systems 1316 may provide various safety controls and interlocks associated with the battery system 1304. For example, the safety systems 1316 may monitor one or more contacts associated with access points on the battery system. Where a contact indicates that an access point is being accessed, the safety systems 1316 may communicate the associated data to the low level controller 314 via the IOM 1319. The low level controller may then generate and alarm and/or shut down the battery system 1304 to prevent any injury to a person accessing the battery system 1304 during operation. Further examples of safety systems can include air quality monitors, smoke detectors, fire suppression systems, etc.

Still referring to FIG. 13, the frequency response controller 112 is shown to include the high level controller communications interface 1302. Communications interface 1302 may include wired or wireless interfaces (e.g., jacks, antennas, transmitters, receivers, transceivers, wire terminals, etc.) for conducting data communications with various systems, devices, or networks. For example, communications interface 1302 may include an Ethernet card and port for sending and receiving data via an Ethernet-based communications network and/or a WiFi transceiver for communicating via a wireless communications network. Communications interface 1302 may be configured to communicate via local area networks or wide area networks (e.g., the Internet, a building WAN, etc.) and may use a variety of communications protocols (e.g., BACnet, IP, LON, etc.).

Communications interface 1302 may be a network interface configured to facilitate electronic data communications between frequency response controller 112 and various external systems or devices (e.g., campus 102, energy grid 104, incentive provider 114, utilities 320, weather service 322, etc.). For example, frequency response controller 112 may receive inputs from incentive provider 114 indicating an incentive event history (e.g., past clearing prices, mileage ratios, participation requirements, etc.) and a regulation signal. Further, the incentive provider 114 may communicate utility rates provided by utilities 320. Frequency response controller 112 may receive a campus power signal from campus 102, and weather forecasts from weather service 322 via communications interface 1302. Frequency response controller 112 may provide a price bid and a capability bid to incentive provider 114 and may provide power setpoints to power inverter 106 via communications interface 1302.

Data Fusion

Turning now to FIG. 14, a block diagram illustrating data flow into the data fusion module 428 is shown, according to some embodiments. As shown in FIG. 14, the data fusion module 428 may receive data from multiple devices and/or systems. In one embodiment, the data fusion module 428 may receive all data received by the high level controller 312. For example, the data fusion module 428 may receive campus data from the campus 102. Campus data may include campus power requirements, campus power requests, occupancy planning, historical use data, lighting schedules, HVAC schedules, etc. In a further embodiment, the data fusion module 428 may receive weather data from the weather service 322. The weather service 322 may include current weather data (temperature, humidity, barometric pressure, etc.), weather forecasts, historical weather data, etc. In a still further embodiment, the data fusion module 428 may receive utility data from the utilities 320. In some examples, the data fusion module 428 may receive some or all of the utility data via the incentive provider 114. Examples of utility data may include utility rates, future pricing schedules, anticipated loading, historical data, etc. Further, the incentive provider 114 may further add data such as capability bid requests, price bid requests, incentive data, etc.

The data fusion module 428 may further receive data from the low level controller 314. In some embodiments, the low level controller may receive data from multiple sources, which may be referred to collectively as battery system data. For example, the low level controller 314 may receive inverter data from power inverter 106. Example inverter data may include inverter status, feedback points, inverter voltage and current, power consumption, etc. The low level controller 314 may further receive battery data from the battery management unit 1310. Example battery data may include battery SOC, depth of discharge data, battery temperature, battery cell temperatures, battery voltage, historical battery use data, battery health data, etc. In other embodiment, the low level controller 314 may receive environmental data from the environmental systems 1318. Examples of environmental data may include battery system temperature, battery system humidity, current HVAC settings, setpoint temperatures, historical HVAC data, etc. Further, the low level controller 314 may receive safety system data from the safety systems 1316. Safety system data may include access contact information (e.g. open or closed indications), access data (e.g. who has accessed the battery system 1304 over time), alarm data, etc. In some embodiments, some or all of the data provided to the low level controller 314 is via an input/output module, such as IOM 1319. For example, the safety system data and the environmental system data may be provided to the low level controller 314 via an input/output module, as described in detail in regards to FIG. 13.

The low level controller 314 may then communicate the battery system data to the data fusion module 428 within the high level controller 312. Additionally, the low level controller 314 may provide additional data to the data fusion module 428, such as setpoint data, control parameters, etc.

The data fusion module 428 may further receive data from other stationary power systems, such as a photovoltaic system 1402. For example, the photovoltaic system 1402 may include one or more photovoltaic arrays and one or more photovoltaic array power inverters. The photovoltaic system 1402 may provide data to the data fusion module 428 such as photovoltaic array efficiency, photovoltaic array voltage, photovoltaic array inverter output voltage, photovoltaic array inverter output current, photovoltaic array inverter temperature, etc. In some embodiments, the photovoltaic system 1402 may provide data directly to the data fusion module 428 within the high level controller 312. In other embodiments, the photovoltaic system 1402 may transmit the data to the low level controller 314, which may then provide the data to the data fusion module 428 within the high level controller 312.

The data fusion module 428 may receive some or all of the data described above, and aggregate the data for use by the high level controller 312. In one embodiment, the data fusion module 428 is configured to receive and aggregate all data received by the high level controller 312, and to subsequently parse and distribute the data to one or more modules of the high level controller 312, as described above. Further, the data fusion module 428 may be configured to combine disparate heterogeneous data from the multiple sources described above, into a homogeneous data collection for use by the high level controller 312. As described above, data from multiple inputs is required to optimize the battery system 1304, and the data fusion module 428 can gather and process the data such that it can be provided to the modules of the high level controller 312 efficiently and accurately. For example, extending battery lifespan is critical for ensuring proper utilization of the battery system 1304. By combining battery data such as temperature and voltage, along with external data such as weather forecasts, remaining battery life may be more accurately determined by the battery degradation estimator 418, described above. Similarly, multiple data points from both external sources and the battery system 1304 may allow for more accurate midpoint estimations, revenue loss estimations, battery power loss estimation, or other optimization determination, as described above.

Figure 15:
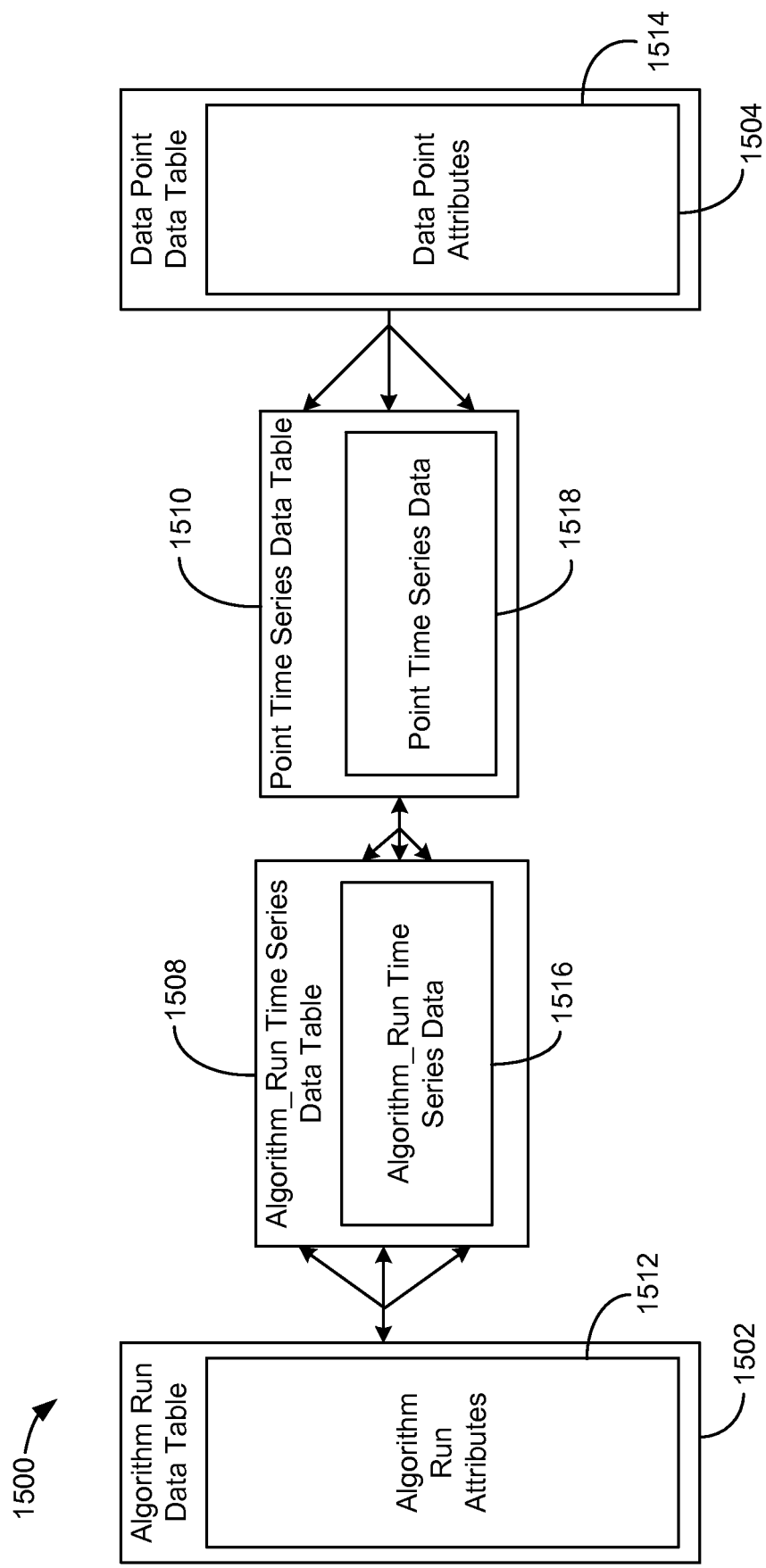
FIG. 15 is a block diagram illustrating a database schema which can be used in the frequency response control system of FIG. 13, according to an exemplary embodiment.

Turning now to FIG. 15, a block diagram showing a database schema 1500 of the system 1300 is shown, according to some embodiments. The schema 1500 is shown to include an algorithm run data table 1502, a data point data table 1504, an algorithm_run time series data table 1508 and a point time series data table 1510. The data tables 1502, 1504, 1508, 1510 may be stored on the memory of the high level controller 312. In other embodiments, the data tables 1502, 1504, 1508, 1510 may be stored on an external storage device and accessed by the high level controller as required.

As described above, the high level controller performs calculation to generate optimization data for the battery optimization system 1300. These calculation operations (e.g. executed algorithms) may be referred to as "runs." As described above, one such run is the generation of a midpoint b which can subsequently be provided to the low level controller 314 to control the battery system 1304. However, other types of runs are contemplated. Thus, for the above described run, the midpoint b is the output of the run. The detailed operation of a run, and specifically a run to generate midpoint b is described in detail above.

The algorithm run data table 1502 may include a number of algorithm run attributes 1512. Algorithm run attributes 1512 are those attributes associated with the high level controller 312 executing an algorithm, or "run", to produce an output. The runs can be performed at selected intervals of time. For example, the run may be performed once every hour. However, in other examples, the run may be performed more than once every hour, or less than once every hour. The run is then performed and by the high level controller 312 and a data point is output, for example a midpoint b, as described above. The midpoint b may be provided to the low level controller 314 to control the battery system 1304, described above in the description of the high level controller 1304 calculating the midpoint b.

In one embodiment, the algorithm run attributes contain all the information necessary to perform the algorithm or run. In a further embodiment, the algorithm run attributes 1512 are associated with the high level controller executing an algorithm to generate a midpoint, such as midpoint b described in detail above. Example algorithm run attributes may include an algorithm run key, an algorithm run ID (e.g. "midpoint," "endpoint," "temperature_setpoint," etc.), Associated Run ID (e.g. name of the run), run start time, run stop time, target run time (e.g. when is the next run desired to start), run status, run reason, fail reason, plant object ID (e.g. name of system), customer ID, run creator ID, run creation date, run update ID, and run update date. However, this list is for example only, as it is contemplated that the algorithm run attributes may contain multiple other attributes associated with a given run.

As stated above, the algorithm run data table 1502 contains attributes associated with a run to be performed by the high level controller 312. In some embodiments, the output of a run, is one or more "points," such as a midpoint. The data point data table 1504 contains data point attributes 1514 associated with various points that may be generated by a run. These data point attributes 1514 are used to describe the characteristics of the data points. For example, the data point attributes may contain information associated with a midpoint data point. However, other data point types are contemplated. Example attributes may include point name, default precision (e.g. number of significant digits), default unit (e.g. cm, degrees Celsius, voltage, etc.), unit type, category, fully qualified reference (yes or no), attribute reference ID, etc. However, other attributes are further considered.

The algorithm_run time series data table 1508 may contain time series data 1516 associated with a run. In one embodiment, the algorithm_run time series data 1516 includes time series data associated with a particular algorithm run ID. For example, a run associated with determining the midpoint b described above, may have an algorithm run ID of Midpoint_Run. The algorithm_run time series data table 1508 may therefore include algorithm_run time series data 1516 for all runs performed under the algorithm ID Midpoint_Run. Additionally, the algorithm_run time series data table 1508 may also contain run time series data associated with other algorithm IDs as well. The run time series data 1516 may include past data associated with a run, as well as expected future information. Example run time series data 1516 may include final values of previous runs, the unit of measure in the previous runs, previous final value reliability values, etc. As an example, a "midpoint" run may be run every hour, as described above. The algorithm_run time series data 1516 may include data related to the previously performed runs, such as energy prices over time, system data, etc. Additionally, the algorithm_run time series data 1516 may include point time series data associated with a given point, as described below.

The point time series data table 1510 may include the point time series data 1518. The point time series data 1518 may include time series data associated with a given data "point." For example, the above described midpoint b may have a point ID of "Midpoint." The point time series data table 1510 may contain point time series data 1518 associated with the "midpoint" ID, generated over time. For example, previous midpoint values may be stored in the point time series data table 1518 for each performed run. The point time series data table 1510 may identify the previous midpoint values by time (e.g. when the midpoint was used by the low level controller 314), and may include information such as the midpoint value, reliability information associated with the midpoint, etc. In one embodiment, the point time series data table 1518 may be updated with new values each time a new "midpoint" is generated via a run. Further, the point time series data 1516 for a given point may include information independent of a given run. For example, the high level controller 312 may monitor other data associated with the midpoint, such as regulation information from the low level controller, optimization data, etc., which may further be stored in the point time series data table 1510 as point time series data 1518.

The above described data tables may be configured to have an association or relational connection between them. For example, as shown in FIG. 15, the algorithm_run data table 1502 may have a one-to-many association or relational relationship with the algorithm_run time series association table 1508, as there may be many algorithm_run time series data points 1516 for each individual algorithm run ID. Further, the data point data table 1504 may have a one-to many relationship with the point time series data table 1510, as there may be many point time series data points 1518 associated with an individual point. Further, the point time series data table 1510 may have a one to many relationship with the algorithm_run time series data table 1508, as there may be multiple different point time series data 1518 associated with a run. Accordingly, the algorithm_run data table 1502 has a many-to-many relationship with the data point data table 1504, as there may be many points, and/or point time series data 1518, associated with may run types; and, there may be multiple run types associated with many points By using the above mentioned association data tables 1502, 1504, 1508, 1510, optimization of storage space required for storing time series data may be achieved. With the addition of additional data used in a battery optimization system, such as battery optimization system 1300 described above, vast amounts of time series data related to data provided by external sources (weather data, utility data, campus data, building automation systems (BAS) or building management systems (BMS)), and internal sources (battery systems, photovoltaic systems, etc.) is generated. By utilizing association data tables, such as those described above, the data may be optimally stored and accessed.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. The order or sequence of any process or method steps can be varied or re-sequenced according to alternative embodiments. Other substitutions, modifications, changes, and omissions can be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure can be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. An electrical energy storage system comprising:
   a battery configured to store electric power and discharge electric power to an energy grid;
   a power inverter configured to control an amount of the electric power stored to or discharged from the battery; and
   a controller configured to
      determine battery power setpoints for the power inverter based on a battery life model, the battery life model including at least one variable that depends on the battery power setpoints,
      determine an amount of battery degradation for the battery based on the at least one variable,
      estimate an amount of frequency response revenue to be lost due to the amount of battery degradation for the battery, and
      modify the battery power setpoints based on the estimated amount of frequency response revenue to be lost due to the amount of battery degradation for the battery.

2. The system of claim 1, wherein the amount of battery degradation includes an amount of battery capacity loss.

3. The system of claim 1, wherein the battery power setpoints include frequency regulation power setpoints and ramp rate control power setpoints.

4. The system of claim 3, wherein the frequency regulation power setpoints are based on a frequency of the energy grid; and
   wherein the ramp rate control power setpoints are based on a power output of a photovoltaic field.

5. The system of claim 1, wherein the at least one variable is selected from the group consisting of a temperature of the battery, a state-of-charge of the battery, a depth of discharge of the battery, a power ratio of the battery, and an effort ratio of the battery.

6. The system of claim 1, wherein the controller is further configured to estimate an amount of frequency response revenue to be gained based on the battery power setpoints.

7. The system of claim 6, wherein the controller is further configured to modify the battery power setpoints as a function of the amount of frequency response revenue to be gained based on the battery power setpoints.

8. The system of claim 1, wherein the battery life model is a parametric model including a regression coefficient for the at least one variable of the battery life model.

9. The system of claim 8, wherein the controller is further configured to perform a curve fitting process to determine a value for the regression coefficient.

10. A method of operating an electrical energy storage system, the method comprising:
    determining battery power setpoints for a power inverter based on a battery life model, the battery life model including at least one variable that depends on the battery power setpoints;
    determining an amount of battery degradation for the battery based on the at least one variable;

estimating an amount of frequency response revenue to be lost due to the amount of battery degradation for the battery; and modifying the battery power setpoints based on the estimated amount of frequency response revenue to be lost due to the amount of battery degradation for the battery.

11. The method of claim 10, wherein the amount of battery degradation includes an amount of battery capacity loss.

12. The method of claim 10, wherein the battery power setpoints include frequency regulation power setpoints and ramp rate control power setpoints.

13. The method of claim 12, wherein the frequency regulation power setpoints are based on a frequency of an energy grid; and wherein the ramp rate control power setpoints are based on a power output of a photovoltaic field.

14. The method of claim 10, wherein the at least one variable is selected from the group consisting of a temperature of the battery, a state-of-charge of the battery, a depth of discharge of the battery, a power ratio of the battery, and an effort ratio of the battery.

15. The method of claim 10, further comprising estimating an amount of frequency response revenue to be gained based on the battery power setpoints.

16. The method of claim 15, further comprising modifying the battery power setpoints as a function of the amount of frequency response revenue to be gained based on the battery power setpoints.

17. A controller for an electrical energy storage system, the controller including a computer readable medium and a processor, the controller comprising computer executable instructions stored in the computer readable medium for controlling the electrical energy storage system to:

determine battery power setpoints for the power inverter based on a battery life model, the battery life model including at least one variable that depends on the battery power setpoints;

determine an amount of battery degradation for the battery based on the at least one variable;

estimate an amount of frequency response revenue to be lost due to the amount of battery degradation for the battery; and modify the battery power setpoints based on the estimated amount of frequency response revenue to be lost due to the amount of battery degradation for the battery.

18. The controller of claim 17, the controller further comprising computer executable instructions stored in the computer readable medium for controlling the electrical energy storage system to:

estimate an amount of frequency response revenue to be gained based on the battery power setpoints.

19. The controller of claim 18, the controller further comprising computer executable instructions stored in the computer readable medium for controlling the electrical energy storage system to:

modify the battery power setpoints as a function of the amount of frequency response revenue to be gained based on the battery power setpoints.

20. The controller of claim 17, wherein the amount of battery degradation includes an amount of battery capacity loss.

* * * * *